United States Patent
Ooishi

(10) Patent No.: US 6,434,075 B2
(45) Date of Patent: Aug. 13, 2002

(54) SEMICONDUCTOR CIRCUIT DEVICE WITH REDUCED POWER CONSUMPTION IN SLOW OPERATION MODE

(75) Inventor: Tsukasa Ooishi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/525,749

(22) Filed: Mar. 14, 2000

Related U.S. Application Data

(62) Division of application No. 09/110,689, filed on Jul. 7, 1998, now Pat. No. 6,058,061, which is a continuation of application No. 08/879,300, filed on Jun. 19, 1997, now abandoned, which is a continuation of application No. 08/628,199, filed on Apr. 5, 1996, now abandoned.

(30) Foreign Application Priority Data

Aug. 18, 1995 (JP) ............................................. 7-210643

(51) Int. Cl.$^7$ ................................................. G11C 7/00
(52) U.S. Cl. ................................... 365/222; 365/230.06
(58) Field of Search ............................. 365/222, 230.06

(56) References Cited

U.S. PATENT DOCUMENTS

| | | | |
|---|---|---|---|
| 4,739,500 A | 4/1988 | Miyamoto et al. | 365/207 |
| 4,837,460 A | 6/1989 | Uchida | 307/296.8 |
| 4,933,907 A | 6/1990 | Kumanoya et al. | 365/222 |
| 5,189,316 A | 2/1993 | Murakami et al. | 307/296.1 |
| 5,329,490 A | 7/1994 | Murotani | 365/222 |
| 5,337,282 A | 8/1994 | Koike | 365/222 |
| 5,355,348 A | * 10/1994 | Ooishi | 365/230.06 |
| 5,404,335 A | 4/1995 | Tobita | 365/222 |
| 5,495,453 A | 2/1996 | Wociechowski et al. | 365/226 |
| 5,568,440 A | 10/1996 | Tsukude et al. | 365/222 |
| 5,594,699 A | 1/1997 | Nomura et al. | 365/226 |

FOREIGN PATENT DOCUMENTS

JP 63-146293 6/1988

OTHER PUBLICATIONS

"Automatic Voltage–Swing Reduction (AVR) Scheme for Ultra Low Power DRAMS", by Tsukude et al., Symposium on VLSI Circuits Digest of Technical Papers, 1994, pp. 87–88.

"A 256M DRAM with Simplified Register Control for Low Power Self Refresh and Rapid Burn–In", by Yoo et al., 1994 Symposium on VLSI Circuits Digest of Technical Papers, pp. 85–86.

"Battery Operated 16M DRAM with Post Package Programmable and Variable Self Refresh", by Choi et al., Symposium on VLSI Circuits Digest of Technical Papers, 1994, pp. 83–83.

* cited by examiner

Primary Examiner—David Nelms
Assistant Examiner—M. Tran
(74) Attorney, Agent, or Firm—McDermott, Will & Emery

(57) ABSTRACT

In a DRAM employing a shared sense amplifier method, a bit line select signal falls to the level of ground potential after a potential difference is generated between a pair of bit lines and sense nodes in response to activation of a word line in a self refresh mode for disconnecting the bit line pair in a memory block including the activated word line from a sense amplifier. When the potentials of the sense nodes are amplified by the sense amplifier, the disconnected bit line pair is connected again to the sense amplifier.

6 Claims, 38 Drawing Sheets

SEMICONDUCTOR CIRCUIT DEVICE WITH REDUCED POWER CONSUMPTION IN SLOW OPERATION MODE

This application is a Divisional of application Ser. No. 09/110,689 filed Jul. 7, 1998, now U.S. Pat. No. 6,058,061, which is a Continuation of application Ser. No. 08/879,300 filed Jun. 19, 1997, now abandoned, which is a Continuation of application Ser. No. 08/628,199 filed Apr. 5, 1996, now abandoned.

BACKGROUND OF THE INVENTION

1. Field of the Invention

The present invention relates to semiconductor circuit devices, and more particularly, to a semiconductor memory device having a normal operation mode and a self refresh mode.

2. Description of the Background Art

FIG. 39 is a circuit diagram showing a partial structure of a conventional dynamic random access memory (referred to as DRAM hereinafter). Referring to FIG. 39, this DRAM includes a sense amplifier of a P channel sense amplifier 36 and an N channel sense amplifier 44, a pair of bit lines BL and /BL arranged at one side of the sense amplifier, another pair of bit lines BL and /BL arranged at the other side of the sense amplifier, a switch circuit 56 responsive to a bit line select signal BLI1 for connecting one of the pairs of bit lines BL and /BL to the sense amplifier, and a switch circuit 62 responsive to a bit line select signal BLI2 for connecting the other pair of bit lines BL and /BL to the sense amplifier.

More specifically, this DRAM employs a shared sense amplifier method. This sense amplifier selects one of the two pairs of bit lines BL and /BL disposed at either side to amplify the potential difference generated between the selected pair of bit lines BL and /BL.

FIG. 40 is a timing chart indicating an operation of the shared sense amplifier of FIG. 39. The potential is plotted along the ordinate, and time is plotted along the abscissa. As shown in FIG. 40, bit line pair BL and /BL is initially precharged to a level of an intermediate potential of (½) Vcc by a bit line equalize/precharge circuit 68, and a boosted power supply potential Vpp higher than a power supply potential Vcc is supplied to switch circuits 56 and 62 as bit line select signals BLI1 and BLI2, respectively. Accordingly, the pairs of bit lines BL and /BL at opposite sides are connected to the sense amplifier.

When a memory block B1, for example, is selected, only the potential of bit line select signal BLI2 falls from the level of boosted potential Vpp to ground potential GND. As a result, bit line pair BL, /BL in memory block B2 is disconnected from the sense amplifier, and only bit line pair BL and /BL in memory block B1 is connected to the sense amplifier.

When the potential of a word line WL rises from the level of ground potential GND to boosted power supply potential Vpp, charge flows from a memory cell 30 connected to that word line WL towards bit line BL, whereby difference in potential occurs between one bit line BL and the other bit line /BL. Here, the potential of bit line BL is pulled up to the level of power supply potential Vcc by P channel sense amplifier 36, and the potential of bit line /BL is pulled down to the level of ground potential GND by N channel sense amplifier 44.

In a normal operation mode of a DRAM, bit line select signal BL1 is maintained at the level of boosted power supply potential Vpp until the potentials of bit lines BL and /BL reach the level of power supply potential Vcc and ground potential GND, respectively. Therefore, bit line pair BL and /BL is continuously connected to the sense amplifier until amplification of that bit line pair is completed. This operation of a shared sense amplifier is carried out, not only in a normal operation mode, but also in a self refresh mode.

FIG. 41 is a circuit diagram showing a structure of a conventional internal voltage-down circuit used in a DRAM. Referring to FIG. 41, the internal voltage-down circuit includes a reference potential generation circuit 182 for generating a constant reference potential Vref1, a voltage-down converter 164 that is always activated, and a voltage-down converter 190 that is selectively activated. In a standby mode, only voltage-down converter 164 of a low current supply capability operates. In an active mode, voltage-down converter 190 of a great current supply capability operates in addition to voltage-down converter 164. More specifically, when internal circuit 180 is activated in response to an internal row address strobe signal RASI, a comparator circuit 192 is also activated in response to internal row address strobe signal RASI. Therefore, the internal voltage-down circuit can supply a current of an amount greater than that of a standby state to internal circuit 180.

In a conventional internal voltage-down circuit, voltage-down converter 190 of a great current supply capability is activated in response to internal row address strobe signal RASI even in a self refresh mode as in a normal operation mode.

Although high speed of a level identical to that of a normal operation mode is not required in a self refresh mode, the operation of the shared sense amplifier in a self refresh mode is identical to that of a normal operation mode as shown in FIGS. 39 and 40. This means that a great amount of through current is conducted in the sense amplifier during an amplify operation of a bit line pair that is as much as in a normal operation mode even in a self refresh mode. Therefore, there is a problem that a great amount of power is consumed in a self refresh mode.

Furthermore, in a self refresh mode, the conventional internal voltage-down circuit of FIG. 41 has the voltage-down converter of a great current supply capability activated in response to internal row address strobe signal RASI as in a normal operation mode. Therefore, similar to a normal operation mode, a great amount of current is consumed even in a self refresh mode.

SUMMARY OF THE INVENTION

An object of the present invention is to provide a semiconductor memory device that can have power consumption reduced in a special operation mode in which the operation rate is lower than that of a normal operation mode.

Another object of the present invention is to provide a semiconductor circuit device that can have power consumption reduced in a special operation mode in which the operating rate is lower than that of a normal operation mode.

According to an aspect of the present invention, a semiconductor memory device with a normal operation mode and a special operation mode in which the operation rate is lower than that of the normal operation mode includes first and second sense nodes, a sense amplifier, first and second bit line pairs, a plurality of word lines, a row decoder, first and second switch elements, and a control circuit. The sense amplifier is connected to the first and second sense nodes, and amplifies the potential difference generated between the first and second sense nodes. The first bit line pair is arranged at one side of the sense amplifier. The second bit line pair is arranged at the other side of the sense amplifier. The plurality of word lines cross the first and second bit line pairs. The row decoder responds to a row address signal to selectively activate a word line. The first switch element is connected between the first and second sense nodes and the first bit line pair. The second switch element is connected between the first and second sense nodes and the second bit line pair. The control circuit controls the first and second switch elements so as to connect one of the first and second bit line pairs to the sense amplifier in a normal operation mode. In a special operation mode, the control circuit controls the first and second switch elements so that one of the first and second bit line pairs is connected to the sense amplifier, the connected bit line pair is disconnected from the sense amplifier after data is read out therefrom, and the disconnected bit line pair is connected to the sense amplifier again after the sense amplifier is activated.

In a special operation mode, preferably in a self refresh mode, a bit line pair is disconnected from the sense amplifier after data is read out thereto, followed by activation of the sense amplifier. Therefore, the potential difference between the first and second sense nodes is amplified speedily. The through current flowing across the sense amplifier in a special operation mode is smaller than that of a normal operation mode. As a result, power consumption in a special operation mode, preferably a self refresh mode, is reduced.

According to another aspect of the present invention, a semiconductor memory device with a normal operation mode and a special operation having an operation rate lower than that of a normal operation mode includes a bit line pair, a sense amplifier, and a first sense amplifier drive circuit. The sense amplifier includes a first common source node, a first N channel transistor, a second N channel transistor, a second common source node, a first P channel transistor, and a second P channel transistor. The first N channel transistor includes a source connected to the first common source node, a drain connected to one bit line of the bit line pair, and a gate connected to the other bit line of the bit line pair. The second N channel transistor includes a source connected to the first common source node, a drain connected to the other bit line of the bit line pair, and a gate connected to the one bit line of the bit line pair. The first P channel transistors includes a source connected to the second common source node, a drain connected to the one bit line of the bit line pair, and a gate connected to the other bit line of the bit line pair. The first P channel transistor includes a source connected to the second common source node, a drain connected to the other bit line of the bit line pair, and a gate connected to the one bit line of the bit line pair. The first sense amplifier drive circuit responds to a first sense amplifier drive signal for driving the sense amplifier by pulling down the potential of the first common source node to the level of ground potential at a first rate in a normal operation mode. In a special operation mode, the first sense amplifier drive circuit responds to a first sense amplifier drive signal for driving the sense amplifier by pulling down the potential of the first common source node towards the level of ground potential at a second rate higher than the first rate.

Preferably, the above semiconductor memory device further includes a second sense amplifier-drive circuit. The sense amplifier drive circuit responds to a second sense amplifier drive signal for driving the sense amplifier by pulling up the potential of the second common source node towards the power supply potential at a third rate in a normal operation mode. In a special operation mode, the second sense amplifier drive circuit responds to the second sense amplifier drive signal for driving the sense amplifier by pulling up the potential of the second common source node towards the power supply potential at a fourth rate higher than the third rate.

Since the potential of the first common source node is pulled down to the level of the ground potential at a rate slower than in the normal operation mode in a special operation mode, the through current flowing through the sense amplifier is smaller than that in a normal operation mode. In addition, the potential of the second common source node is pulled up towards the level of the power supply potential at a rate slower than in a normal operation in the special operation mode, so that the through current flowing through the sense amplifier is further reduced than in a normal operation mode. As a result, power consumption in a special operation mode is smaller than that in a normal operation mode.

According to a further aspect of the present invention, a semiconductor circuit device with a normal operation mode and a special operation mode having an operation rate slower than that of the normal operation mode includes an internal power supply line, an internal circuit, an internal power supply potential supply circuit, and an activation circuit. The internal circuit is connected to the internal power supply line, and is activated in response to a predetermined activation signal. The internal power supply potential supply circuit has a first supply capability, and a second supply capability greater than that of the first supply capability for supplying an internal power supply potential lower than an external power supply potential on the basis of the external power supply potential to the internal power supply line. The activation circuit responds to an activation signal for activating the internal power supply potential supply circuit at the second supply capability in a normal operation mode, and responds to an activation signal for activating the internal power supply potential supply circuit at the first supply capability in a special operation mode.

Since the internal power supply potential supply circuit is activated in a special operation mode at a supply capability smaller than that of the normal operation mode, power consumption in the special operation mode is lower than that of a normal operation mode.

According to still another aspect of the present invention, a semiconductor circuit device with a normal operation mode and a special operation mode of an operation rate slower than that of the normal operation mode, and having an internal circuit operated on the basis of a boosted power supply potential higher than a power supply potential includes a first transistor, a second transistor and a control circuit. The first transistor is connected between a boosted power supply node to which a boosted power supply potential is supplied and the internal circuit. The second transistor is connected between a power supply to which the power supply potential is supplied and the internal circuit. The control circuit causes the second transistor to maintain an OFF state and the first transistor to be turned on in a normal operation mode. The control circuit further causes the second transistor to attain an ON state for a predetermined time period and the first transistor to be turned at an elapse of the predetermined time period in a special operation mode.

In a normal operation mode, the potential supplied to the internal circuit is raised at one time from the level of ground potential to the boosted power supply potential. In contrast, the potential applied to the internal circuit is first raised from the level of ground potential to the power supply potential, and then from the level of the power supply potential to the boosted power supply potential in a normal operation mode.

Since the potential is pulled up to the level of the power supply potential by the power supply in a special operation mode, power consumption is reduced than in a normal operation mode in which the potential is pulled up at one time to the boosted power supply potential.

According to a still further aspect of the present invention, a semiconductor memory device with a normal operation mode and a self refresh mode includes a plurality of memory block, and a select refresh circuit. Each of the plurality of memory blocks includes a plurality of word lines, a plurality of bit line pairs crossing the word lines, and a plurality of memory cells provided at a respective crossings of a word line and a bit line pair. The select refresh circuit selectively refreshes a memory block including a memory cell storing data out of the plurality of memory blocks.

In a self refresh mode, a memory block in which no data is stored is not refreshed. Only a memory block storing data is refreshed. Therefore, power consumption is reduced in comparison to the case where all memory blocks are refreshed.

According to yet a further aspect of the present invention, a semiconductor memory device with a normal operation and a self refresh mode includes a plurality of word line groups, a word line drive signal generation circuit, a predecoder, a plurality of decoder units, and first and second shift registers. Each of the plurality of word line groups includes a plurality of word lines. The word line drive signal generation circuit responds to a portion of an internal address signal in a normal operation mode for generating a plurality of word line drive signals corresponding to the plurality of word lines. The predecoder responds to the other portion of the row address signal in a normal operation mode for generating a predecode signal. The plurality of decoder units are provided corresponding to the plurality of word line groups, and are selectively activated in response to a predecode signal in a normal operation mode. Each decoder unit responds to a word line drive signal for selectively activating a word line of a representative word line group. The first shift register selectively activates the plurality of decoder units sequentially in a self refresh mode. The second shift register selectively activates the plurality of word line drive signals sequentially in a self refresh mode.

In a self refresh mode, the first shift register selectively activates the plurality of decoder units sequentially, and then selectively activates the plurality of word line drive signals sequentially. It is therefore not necessary to generate a predecode signal for activating a word line. This means that the charge/discharge current for generating a predecode signal is not required. As a result, power consumption in a self refresh mode is reduced.

According to yet another aspect of the present invention, a semiconductor memory device with a normal operation mode and a self refresh mode includes first and second memory blocks, a series of sense amplifiers, a plurality of first and second switch elements, and a control circuit. Each of the first and second memory blocks includes a plurality of bit line pairs. The series of sense amplifiers include a plurality of sense amplifiers between the first and second memory blocks, and corresponds to the plurality of bit line pairs. The plurality of first switch elements are provided corresponding to the plurality of bit line pairs in the first memory block. Each first switch element is connected between a corresponding bit line pair and a sense amplifier. The plurality of second switch elements are provided corresponding to the plurality of bit line pairs in the second memory block. Each second switch element is connected between a corresponding bit line pair and a sense amplifier. The control circuit controls the first and second switch elements so that a bit line pair in one of the memory blocks to be selected is continuously connected to the sense amplifier and a bit line pair in the other memory block not selected is disconnected from the sense amplifier in response to every row address signal applied thereto in a normal operation mode. In a self refresh mode, the control circuit controls the first and second switch elements so that, when a memory block to be selected in response to a currently applied row address signal is identical to the memory block that is already selected in response to the prior applied row address signal, a bit line pair in the memory block to be selected is continuously connected to the sense amplifier, and the bit line pair of the other memory block that is not selected is disconnected from the sense amplifier, and otherwise, the bit line pair in the one memory block that is to be selected is connected to the sense amplifier, and the bit line pair in the other memory block that is already selected is disconnected from the sense amplifier.

When the same memory block is continuously selected in a self refresh mode, the bit line pair in that memory block remains connected to the sense amplifier. Therefore, power consumption is reduced in comparison with the case where a bit line pair is disconnected from the sense amplifier at every selection of a memory block.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
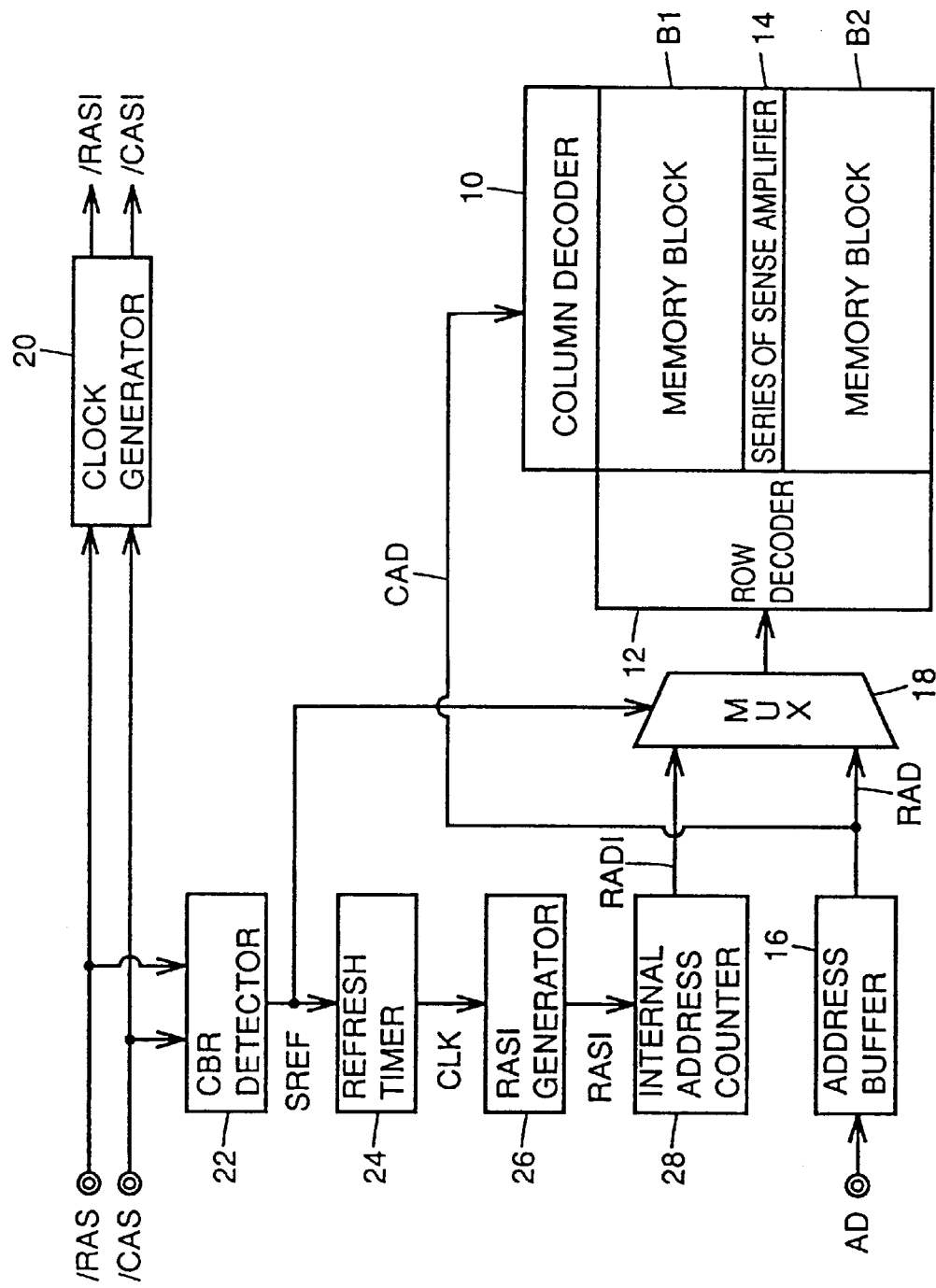
FIG. 1 is a block diagram showing an entire structure of a DRAM according to a first embodiment of the present invention.

Embodiments of the present invention will be described hereinafter with reference to the drawings. In the drawings, the same reference characters indicate the same or corresponding components.

First Embodiment

FIG. 1 is a block diagram showing an entire structure of a DRAM according to a first embodiment of the present invention. Referring to FIG. 1, a DRAM includes a memory cell array divided into a plurality of memory blocks B1 and B2, a column decoder 10 for selecting a bit line pair in memory blocks B1 and B2, a row decoder 12 for selecting a word line in memory blocks B1 and B2, and a series of sense amplifiers 14 disposed between memory blocks B1 and B2. Series of sense amplifiers 14 are provided corresponding to the bit line pairs in memory blocks B1 and B2.

The DRAM further includes a clock generator 20 responsive to external control signals such as a row address strobe signal /RAS, a column address strobe signal /CAS for generating internal control signals such as an internal row address strobe signal /RASI, an internal column address strobe signal /CASI, and the like, a CBR detector 22 for detecting a timing of a CAS-before-RAS, and generating a self refresh enable signal SREF at an elapse of a predetermined time period, a refresh timer 24 responsive to a self refresh enable signal SREF for generating a clock signal CLK having a predetermined period, an internal row address strobe signal generator 26 responsive to clock signal CLK for generating an internal row address strobe signal RASI, and an internal address counter 28 responsive to an internal row address strobe signal RASI for sequentially generating an internal row address signal RADI for a refresh operation.

The DRAM further includes an address buffer 16 responsive to an external address signal for supplying a row address signal RAD and a column address signal CAD, and a multiplexer 18 responsive to a self refresh enable signal SREF for selecting one of external row address signal RAD and internal row address signal RADI and supplying the selected row address signal to row decoder 12. Row decoder 12 responds to an internal row address strobe signal /RASI for receiving a row address signal from multiplexer 18. Column decoder 10 responds to a column address strobe signal /CASI for receiving a row address signal CAD from address buffer 16.

Figure 2:
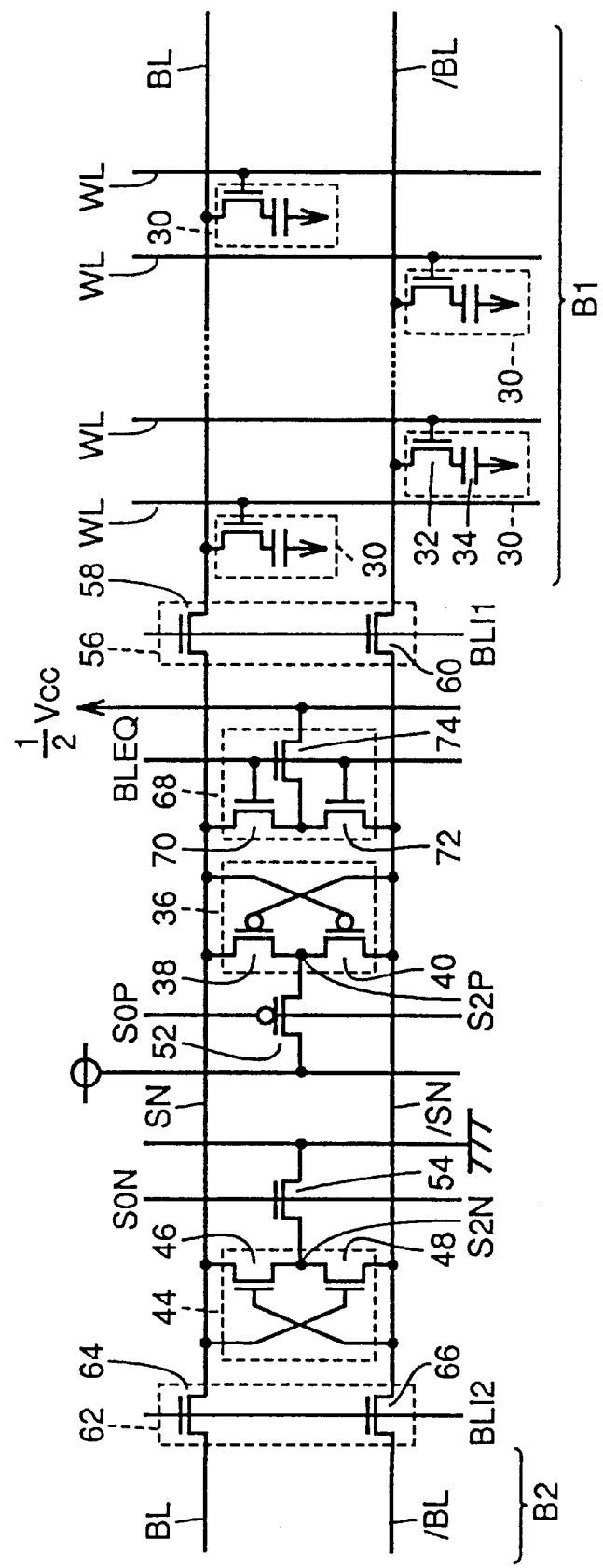
FIG. 2 is a circuit diagram showing a specific structure of a memory block and a series of sense amplifiers in FIG. 1.

FIG. 2 is a circuit diagram showing a structure of memory blocks B1 and B2 and one row of series of sense amplifiers 14 in FIG. 1. Referring to FIG. 2, this DRAM employs a shared sense amplifier method. The sense amplifier includes a P channel sense amplifier 36 for restore, and an N channel sense amplifier 44 for sensing and amplifying. P channel sense amplifier 36 includes cross-coupled P channel MOS transistors 38 and 40. P channel MOS transistor 38 includes a source connected to a common source node S2P, a drain connected to a sense node SN, and the gate connected to a sense node /SN. P channel MOS transistor 40 includes a source connected to common source node S2P, a drain connected to sense node /SN, and a gate connected to sense node SN. N channel sense amplifier 44 includes cross-coupled N channel MOS transistors 46 and 48. N channel MOS transistor 46 includes a source connected to common source node S2N, a drain connected to sense node SN, and a gate connected to sense node /SN. N channel MOS transistor 48 includes a source connected to common source node S2N, a drain connected to sense node /SN, and a gate connected to sense node SN.

Two bit line pairs BL and /BL are arranged at opposite sides of sense amplifiers 36 and 44. Bit line pair BL and /BL in memory block B1 is connected to sense nodes SN and /SN via a switch circuit 56. Bit line pair BL and /BL in memory block B2 is connected to sense nodes SN and /SN via a switch circuit 62. Switch circuit 56 includes N channel MOS transistors 58 and 60 turned on in response to one block select signal BLI1. N channel MOS transistor 58 is connected between a bit line BL in memory block B1 and sense node SN. N channel MOS transistor 60 is connected between bit line /BL in memory block B1 and sense node ISN. Switch circuit 62 includes N channel MOS transistors 64 and 66 turned on in response to a bit line select signal BLI2. N channel MOS transistor 64 is connected between bit line BL in memory block B2 and sense node SN. N channel MOS transistor 66 is connected between bit line /BL and sense node /SN in memory block B2.

A plurality of word lines WL are arranged crossing bit line pair BL and /BL. A plurality of memory cells 30 are provided corresponding to crossings of bit line pair BL, /BL and word line WL. Each memory cell 30 includes an N channel MOS transistor 32 and a capacitor 34. Each N channel MOS transistor 32 includes a source/drain connected to a corresponding bit line BL or /BL, and a gate connected to a corresponding word line WL.

P channel sense amplifier 36 has common source node S2P connected to a power supply node via a drive transistor 52. Drive transistor 52 is turned on in response to a sense amplifier drive signal SOP. Furthermore, N channel sense amplifier 44 has its common source node S2N connected to a ground node via a drive transistor 54. Drive transistor 54 is turned on in response to a sense amplifier drive signal SON.

An equalize/precharge circuit 68 is connected between sense nodes SN and /SN for equalizing sense nodes SN and /SN and precharging the level to an intermediate potential of (½) Vcc. Equalize/precharge circuit 68 includes N channel MOS transistors 70, 72 and 74. Transistors 70, 72 and 74 are turned on in response to one bit line equalize signal BLEQ.

Figure 3:
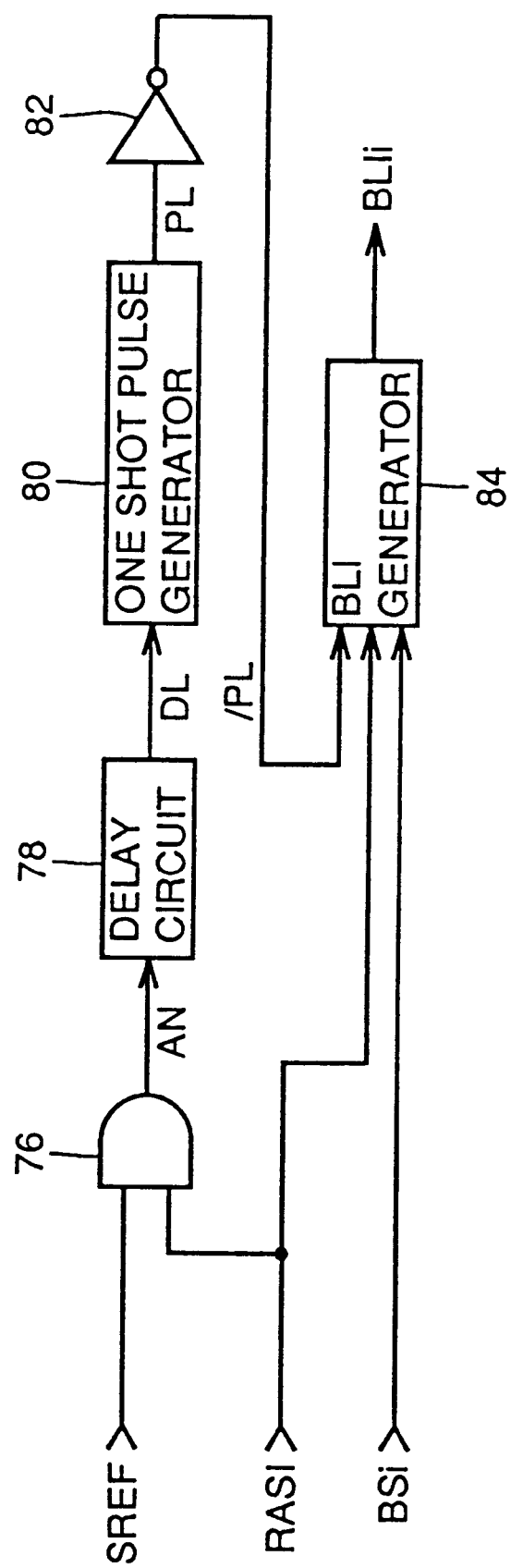
FIG. 3 is a block diagram showing a structure of a circuit for controlling a bit line select signal in the DRAM of FIG. 1.

FIG. 3 is a block diagram showing a structure of a control circuit controlling switching circuits 56 and 62 in FIG. 2. Referring to FIG. 3, the control circuit includes an AND gate 76 receiving a self refresh enable signal SREF, and an internal row address strobe signal RASI, a delay circuit 78 for receiving an output signal AN of AND gate 76 and generating a delay signal DL, a one shot pulse generator 80 responsive to a rise of delay signal DL for generating a pulse signal PL attaining an H level (logical high) for a predetermined time period, an inverter 82 receiving pulse signal PL, and a bit line select signal generator 84 receiving an output signal /PL of inverter 82, an internal row address strobe signal RASI and a block select signal BSi for generating a bit line select signal BLIi. Block select signal generator 84 is provided in a one-to-one correspondence with a memory block. When memory block B1 is selected, block select signal BSi (i=1) is activated. When memory block B2 is selected, a block select signal BSi (i=2) is activated. Block select signals BS1 and BS2 are selectively activated in response to the most significant bit of a row address signal in row decoder 12. Since bit line select signal generator 84 has a boosting function, a bit line select signal BLIi of a boosted power supply potential Vpp level higher than power supply potential Vcc can be generated.

An operation of the DRAM according to the first embodiment of the present invention will be described hereinafter.

Figure 4:
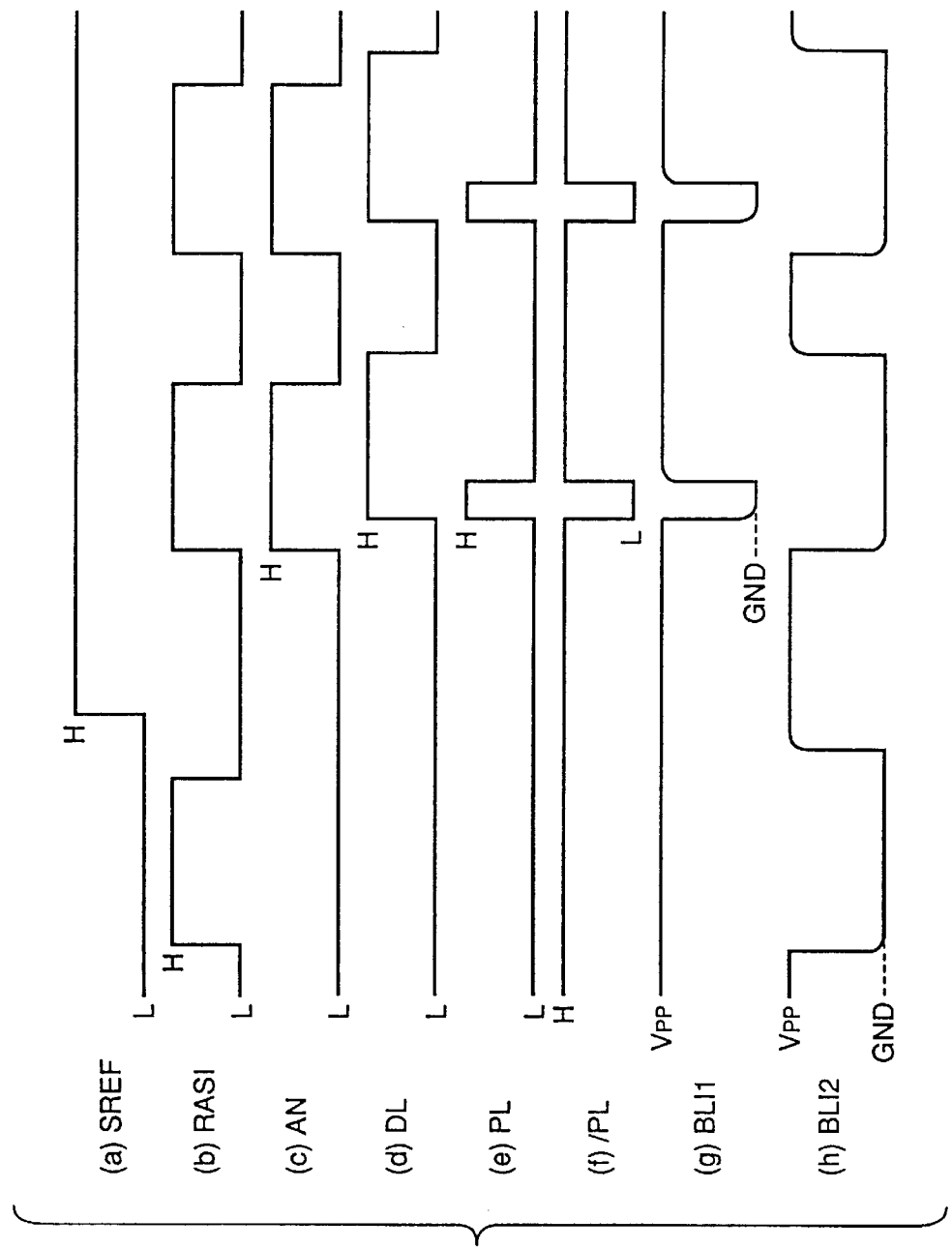
FIG. 4 is a timing chart indicating an operation of the DRAM of FIGS. 1–3.

In a normal operation mode, CBR detector 22 shown in FIG. 1 generates a self refresh enable signal SREF of an L level (logical low). As shown in the timing chart of FIG. 4, provision of a self refresh enable signal SREF of an L level to AND gate 76 of FIG. 3 causes output signal AN of AND gate 76 to be constantly maintained at an L level irrespective of internal row address strobe signal RASI. Therefore, bit line select signal BLI1 is always maintained at the level of boosted power supply potential Vpp as shown in FIG. 4(g) when memory block B1, for example, is selected. In contrast, block select signal BLI2 changes in response to internal row address strobe signal RASI as shown in FIG. 4(h). Specifically, the provision of internal row address strobe signal RASI of an L level causes bit line select signal BLI2 of boosted power supply potential Vpp to be generated. Provision of internal row address strobe signal RASI of an H level causes bit line select signal BLI2 of a ground potential GND level to be generated.

Therefore, in a normal operation mode, bit line select signals BLI1 and BLI2 both attaining the level of boosted power supply potential Vpp are applied to switch circuits 56 and 62, respectively. Here, bit line equalize signal BLEQ of an H level is applied, whereby all the potentials of bit lines BL and /BL and sense nodes SN and /SN attain the level of intermediate potential (½) Vcc. When memory block B1, for example, is selected, only the potential of bit line select signal BLI2 is pulled down from boosted power supply potential Vpp to ground potential GND. Therefore, bit lines BL and /BL in memory block B1 are continued to be connected to sense nodes SN and /SN, respectively, while bit lines BL and /BL in memory block B2 are disconnected from sense nodes SN and ISN, respectively.

Row decoder 12 responds to a row address signal for activating one word line WL in memory block B1. When the potential of the activated word line WL is pulled up from the level of ground potential GND to boosted power supply potential Vpp, data is read out from a corresponding memory cell 30 to bit line pair BL and /BL. As a result, potential difference between bit lines BL and /BL is generated. This potential difference is transmitted to sense nodes SN and ISN via switch circuit 56.

Sense amplifier drive signal SON attains an H level, and sense amplifier drive signal SOP attains an L level with bit lines BL and /BL connected to sense nodes SN and ISN, respectively. Therefore, sense amplifiers 36 and 44 amplify the potential difference between sense nodes SN and /SN and also the potential difference between bit lines BL and /BL. Here, bit lines BL and /BL each have a great parasitic capacitance. Therefore, the potentials of bit lines BL and/BL are gradually driven towards the level of power supply potential Vcc and ground potential GND, respectively. However, a great amount of through current flows through sense amplifiers 36 and 44 since common source node S2P is rapidly pulled up towards power supply potential Vcc and common source node S2N is rapidly pulled down towards ground potential GND.

In a self refresh mode, CBR detector 22 of FIG. 1 generates a self refresh enable signal SREF of an H level. Internal address counter 28 responds to internal row address strobe signal RASI to generate internal row address signal RADI. Multiplexer 18 responds to self refresh enable signal SREF of an H level to supply internal row address signal RADI to row decoder 12 from internal address counter 28 instead of an externally applied row address signal RAD.

When self refresh enable signal SREF of an H level is applied to AND gate 76 of FIG. 3, output signal AN of AND gate 76 shows a transition in response to internal row address strobe signal RASI as shown in (b) and (c) in FIG. 4. Delay circuit 78 delays output signal AN of AND gate 76 for a predetermined time period to generate a delay signal BL as shown in FIG. 4(d). One shot pulse generator 80 responds to a rise of delay signal DL for generating a pulse signal PL that attains an H level for a predetermined time period as shown in FIG. 4(e). Inverter 82 inverts pulse signal PL to generate a pulse signal /PL as shown in FIG. 4(f).

When memory block B1, for example, is selected, bit line select signal BLI1 generally attains the level of boosted power supply potential Vpp as shown in FIG. 4(g). In contrast, bit line select signal BLI2 shows a transition in response to internal row address strobe signal RASI as shown in FIG. 4(h). More specifically, provision of internal row address strobe signal RASI of an H level and an L level causes bit line select signal BLI2 to be driven to the level of ground potential GND and boosted power supply potential Vpp, respectively.

It is to be noted that bit line select signal BLI1 is not always maintained at the level of boosted power supply potential Vpp, and is temporarily driven to ground potential GND in response to pulse signal /PL in a self refresh mode.

Figure 5:
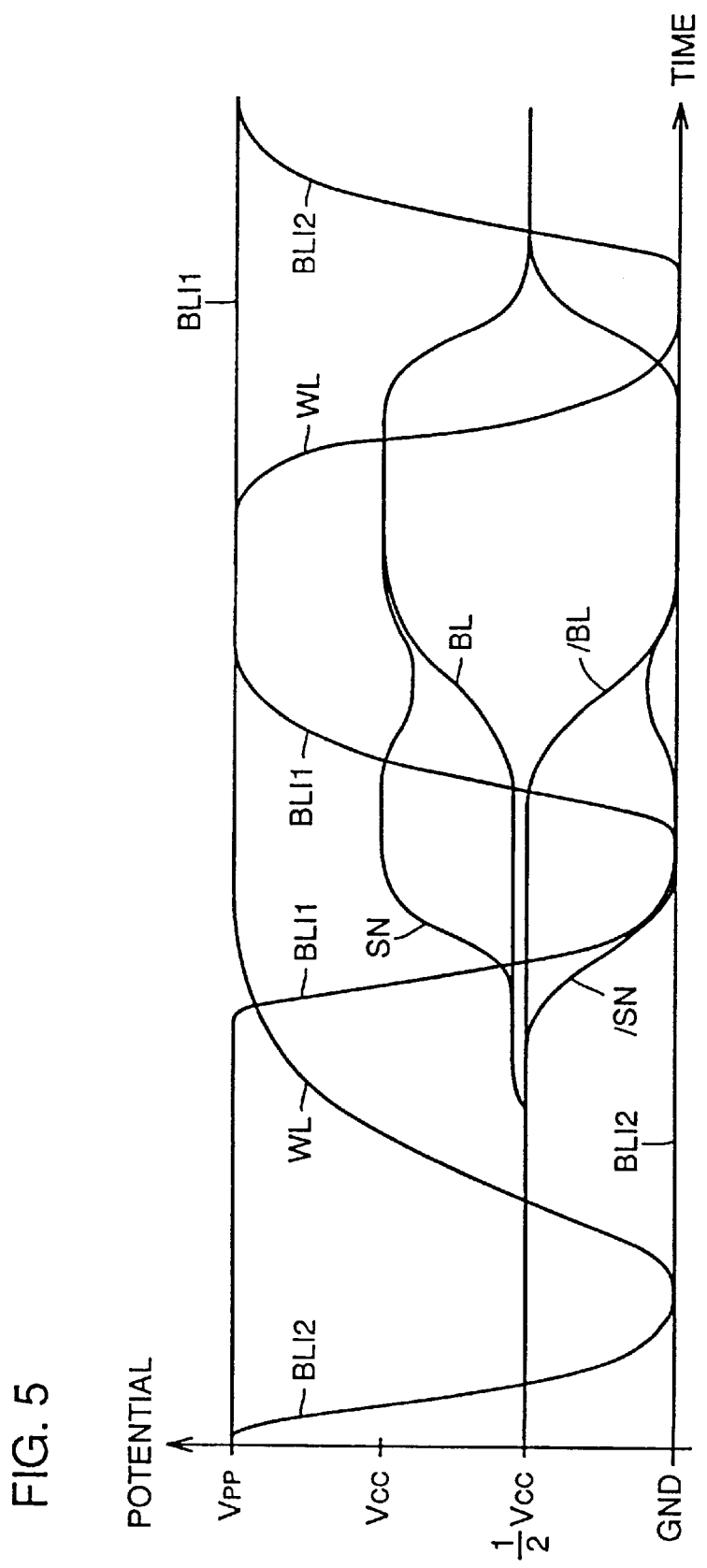
FIG. 5 is a graph showing change in potential of a bit line select signal, a word line, a bit line, and a sense node in FIG. 2.

FIG. 5 is a graph showing potential transition of bit line select signals BLI1 and BLI2, and bit lines BL and /BL, and the like in a self refresh mode. Potential is plotted along the ordinates, and time is plotted along the abscissa.

As shown in FIG. 5, bit line select signals BLI1 and BLI2 both attain the level of boosted power supply potential Vpp at the initial state, so that bit line pair BL and /BL in both memory blocks B1 and B2 are connected to sense nodes SN and /SN. Here, memory block B1 is selected, whereby bit line select signal BLI1 maintains the level of boosted power supply potential Vpp. Bit line select signal BLI2 falls towards ground potential GND. Therefore, bit lines BL and /BL in memory block B1 are connected to sense amplifiers 36 and 44, whereas bit lines BL and /BL in memory block 2 are disconnected from sense amplifiers 36 and 44.

Row decoder 12 responds to internal row address signal RADI provided from internal address counter 28 via multiplexer 18 to activate one word line WL in memory block B1. The potential of the activated word line is pulled up to the level of boosted power supply potential Vpp. Upon activation of word line WL, data is read out from memory cell 30 connected to that word line WL to bit line pair BL and /BL. Here, the potential of bit line BL is slightly increased from the level of intermediate potential (½) Vcc, and the potential of bit line /BL is maintained at the level of intermediate potential (½) Vcc. The potential of bit line BL is transmitted to sense node SN via N channel MOS transistor 58, and the potential of bit line /BL is transmitted to sense node ISN via N channel MOS transistor 60. Therefore, the potential difference between bit lines BL and /BL also occurs between sense nodes SN and /SN.

Prior to activation of sense amplifiers 36 and 44, the potential of bit line select signal BLI1 is also pulled down towards ground potential GND. Therefore, not only bit line pair BL and /BL in memory block B2, but also bit line pair BL and /BL in memory block B1 are disconnected from sense nodes SN and /SN.

N channel sense amplifier 44 is activated in response to sense amplifier drive signal SON attaining an H level, and P channel sense amplifier 36 is also activated in response to sense amplifier drive signal SOP attaining an L level. Upon activation of N channel sense amplifier 44, the potential of sense node /SN is pulled down from the level of intermediate potential (½) Vcc towards ground potential GND. Upon activation of P channel sense amplifier 36, the potential of sense node SN is pulled up to the level of power supply potential Vcc. Here, the potential of sense nodes SN and /SN shows a transition more rapid than in a normal operation mode since bit line pair BL and /BL are not connected to sense nodes SN and /SN. This is because bit line pair BL and /BL have an extremely great parasitic capacitance, whereas sense nodes SN and /SN have an extremely small parasitic capacitance. Since the potential of sense nodes SN and /SN show a rapid transition following the rapid transition of common source nodes S2P and S2N, almost no through current flows through sense amplifiers 36 and 44.

Then, at the rise of the potential of bit line select signal BLI1 from ground potential GND to boosted power supply potential Vpp, bit line pair BL and /BL in memory block B1 are connected again to sense nodes SN and /SN. As a result, charge flows from sense node SN to bit line BL via N channel MOS transistor 58, whereby the potential of sense node SN slightly falls from the level of power supply potential Vcc. However, the potential of sense node SN and bit line BL both rise to the level of power supply potential Vcc since P channel sense amplifier 36 is activated. The charge of bit line /BL flows towards sense node /SN via N channel MOS transistor 60, whereby the potential of sense node ISN is slightly increased from the level of ground potential GND.

However, the potential of sense node ISN and bit line /BL are both pulled down to ground potential GND since N channel sense amplifier 44 is activated. The connection of bit lines BL and /BL to sense nodes SN and /SN again causes a slight change in the potentials of sense nodes SN and /SN, whereby a slight through current flow through sense amplifiers 36 and 44.

When the potential of word line WL is pulled down to the level of ground potential GND, transistor 32 in memory cell 30 is turned off to complete a refresh operation of memory cell 30.

In the first embodiment, sense amplifiers 36 and 44 are activated while one pair of bit lines BL and /BL is connected thereto in a normal operation mode. In a self refresh mode, sense amplifiers 36 and 44 are activated while the one pair of bit lines BL and /BL is disconnected from sense amplifiers 36 and 44. More specifically, a general sense operation is carried out in a normal operation mode, whereas a latch sense operation is carried out in a self refresh mode. A latch sense operation is disclosed in Japanese Patent Laying-open No. 63-146293.

Although the above-described latch sense operation contributes to reduce significantly the through current flowing through sense amplifiers 36 and 44, it is not desirable to employ such a latch sense operation in a normal operation mode. This is because a latch sense operation is time consuming for the purpose of amplifying potential difference in a pair of bit lines. It is to be noted that high speed in a self refresh mode is not so critical as in a normal operation mode. Therefore, the above-described latch sense operation is employed only in a self refresh mode.

According to the above-described first embodiment, a read/write operation is carried out at high speed in a normal operation mode since a general sense operation is carried out, and a latch sense operation is carried out in a self refresh mode. Therefore, the through current flowing through sense amplifiers 36 and 44 is reduced.

There is a slight flow of a through current in sense amplifiers 36 and 44 at the rise of bit line select signal BLI1 in the first embodiment. By pulling up block select signal BLI1 in a more gentle manner, the slight increase in potential of sense node /SN can be suppressed since bit line /BL of an L level is connected to sense node ISN at a high impedance state. Upon sufficient increase of the potential of bit line select signal BLI1, bit line BL of an H level is also connected to sense node SN at a high impedance state. Therefore, a potential fall of sense node SN is also suppressed. By reducing the increasing rate of bit line select signal BLI1 slower than that shown in FIG. 5, the through current in sense amplifiers 36 and 44 is further reduced.

Figure 6:
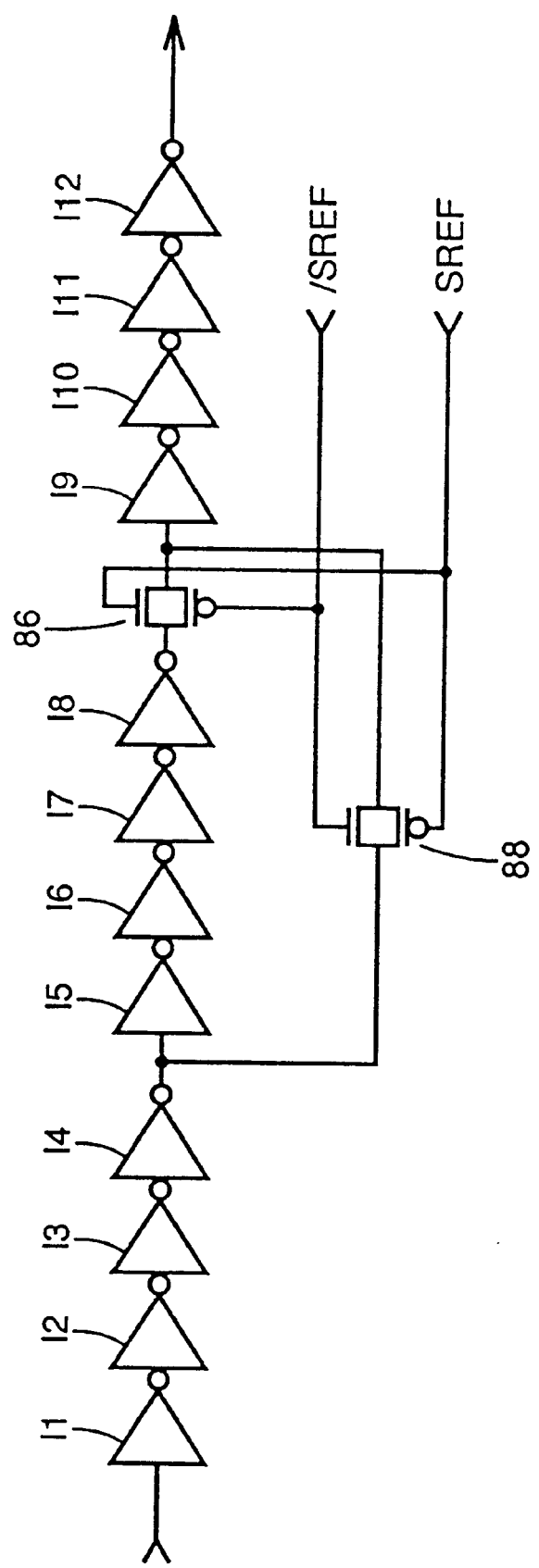
FIG. 6 is a circuit diagram showing an example of the delay circuit employed in the DRAM of FIG. 1.

Since a latch sense operation is carried out in a self refresh mode in the first embodiment, completion of a sense operation is more time consuming than in a normal operation mode. There are cases where various timings such as deactivating word line WL must be delayed. FIG. 6 is a circuit diagram showing a structure of a delay circuit for delaying such various timings. Referring to FIG. 6, a delay circuit includes inverters I1–I12, and transfer gates 86 and 88. Since self refresh enable signal SREF attains an L level in a normal operation mode, transfer gate 86 is turned off and transfer gate 88 is turned on. Therefore, an input signal applied to this delay circuit is delayed by eight inverters I1–I4, I9–I12. In a self refresh mode, self refresh enable signal SREF attains the H level, whereby transfer gate 86 is turned on and transfer gate 88 is turned off. Therefore, an applied input signal is delayed by twelve inverters I1–I12. This means that the delay circuit has two types of delay times. The delay time in a self refresh mode is greater than the delay in a normal operation mode.

Second Embodiment

Figure 7:
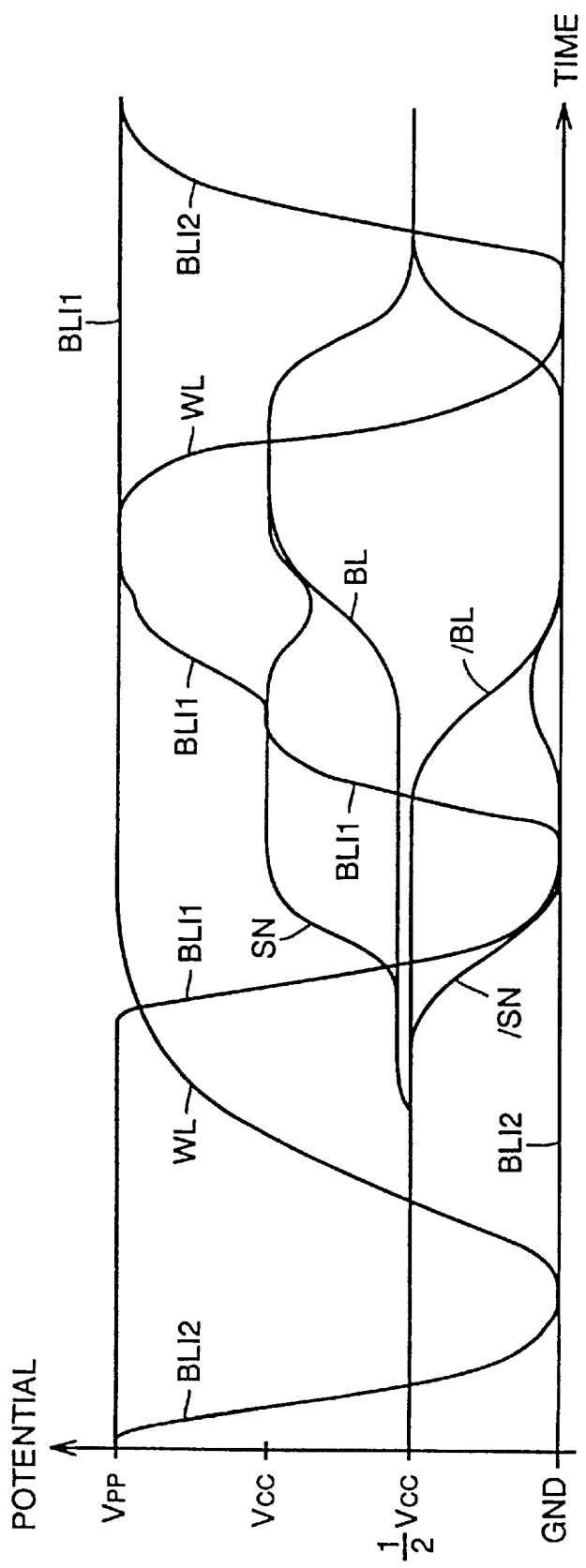
FIG. 7 is a graph showing change in potential of a bit line select signal, a word line, a bit line and a sense node in a DRAM according to a second embodiment of the present invention.

FIG. 7 is a graph showing change in potential of a bit line select signal, a word line, a bit line and the like in a DRAM according to a second embodiment of the present invention. In contrast to the first embodiment in which the potential of bit line select signal BLI1 is pulled up at one time from ground potential GND to boosted power supply potential Vpp, the potential of bit line select signal BLI1 in the second embodiment is first pulled up from ground potential GND to power supply potential Vcc, and then to boosted power supply potential Vpp. The bit select signal of the present embodiment does not have to be raised at one time, and can be pulled up in discrete stages.

Third Embodiment

Figure 8:
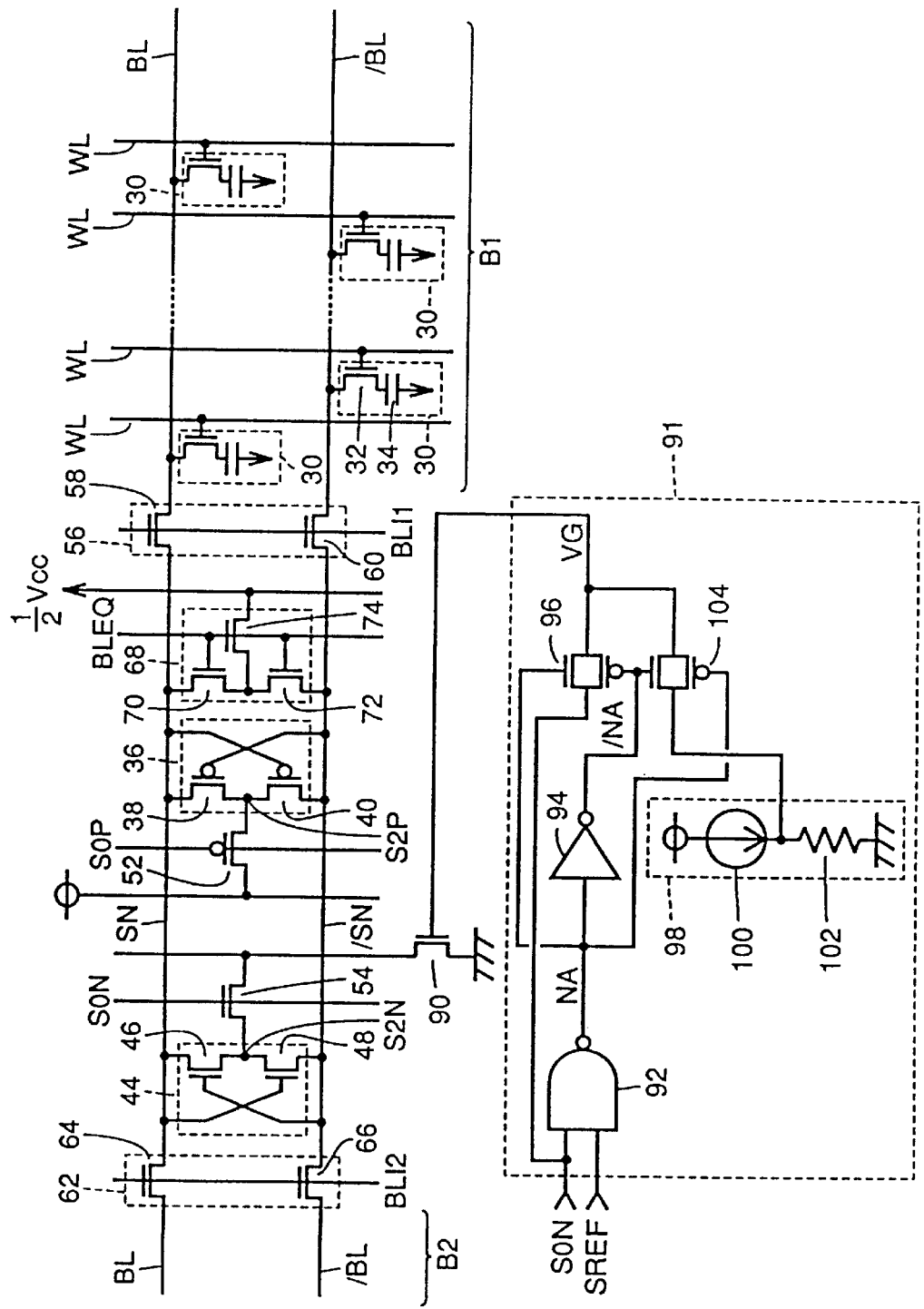
FIG. 8 is a circuit diagram showing a partial structure of a DRAM according to a third embodiment of the present invention.

FIG. 8 is a circuit diagram showing a partial structure of a DRAM according to a third embodiment of the present invention.

Referring to FIG. 8, the DRAM includes, in addition to the structure of FIG. 2, an N channel MOS transistor 90 connected between drive transistor 54 and the ground node, and a voltage control circuit 91 for supplying a controllable gate potential VG to the gate of transistor 90. Voltage control circuit 91 includes an NAND gate 92, an inverter 94, transfer gates 96 and 104, and a reference potential generator 98. Reference potential generator 98 includes a constant current source 100 and a resistor 102.

An operation of the DRAM of FIG. 8 will be described hereinafter with reference to the timing chart of FIG. 9.

In a normal operation mode, a self refresh enable signal SREF of an L level is applied to NAND gate 92, whereby transfer gates 96 and 104 are turned on and off, respectively, as shown in FIG. 9(a). Therefore, sense amplifier drive signal SON is applied to the gate of transistor 90 via transfer gate 96. Therefore, gate potential VG applied from voltage control circuit 91 to the gate of transistor 90 shows a transition between ground potential GND and power supply potential Vcc in synchronization with a sense amplifier drive signal SON as shown in FIG. 9(e). Therefore, N channel sense amplifier 44 operates in a manner similar to that shown in FIG. 2.

Figure 9:
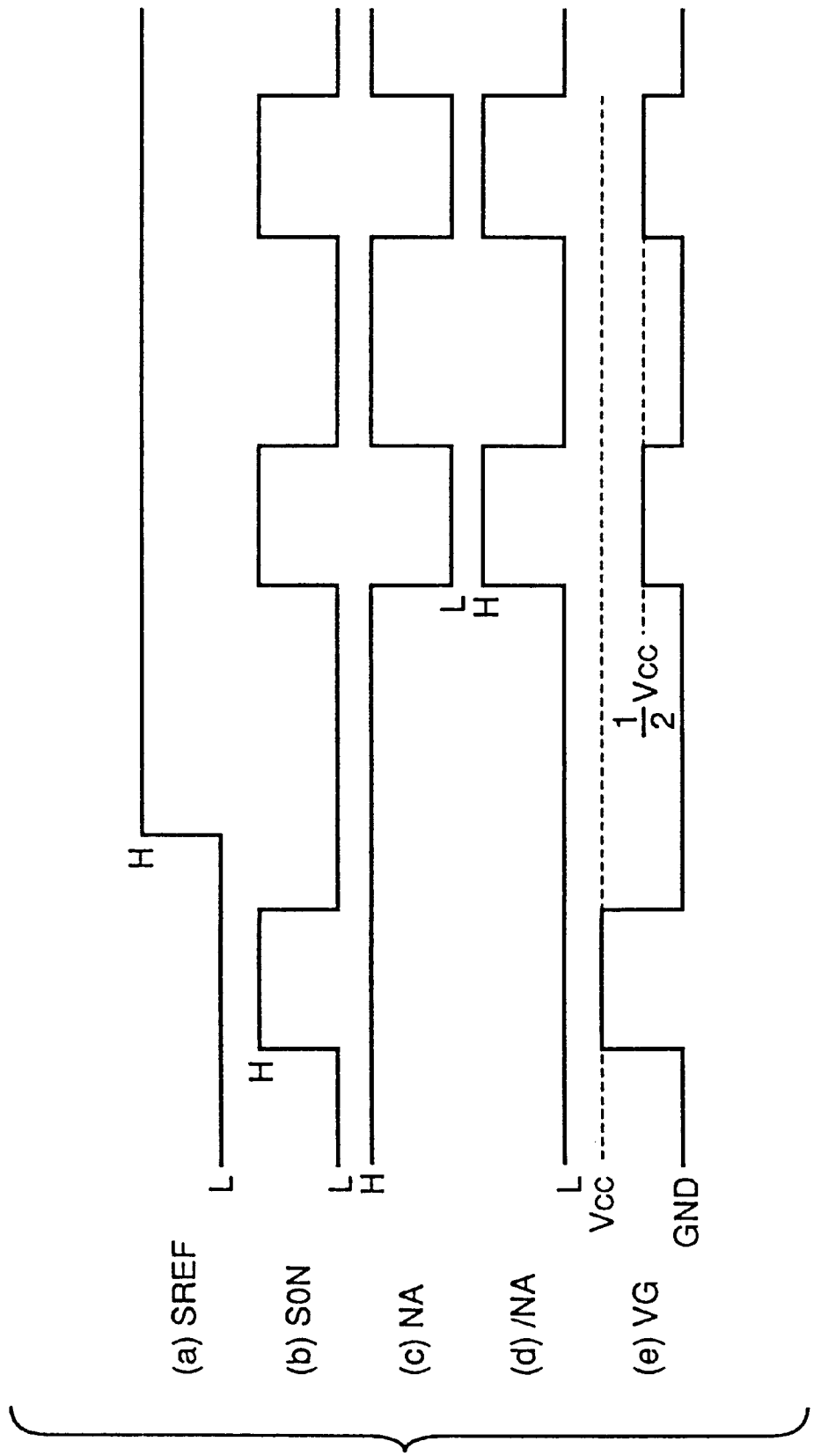
FIG. 9 is a timing chart showing an operation of the DRAM of FIG. 8.

In a self refresh mode, self refresh enable signal SREF of an H level is applied to NAND gate 92 as shown in FIG. 9(a). Output signal NA of NAND gate 92 shows a transition in synchronization with sense amplifier drive signal SON, and output signal /NA of inverter 94 shows a transition in synchronization with sense amplifier drive signal SON, as shown in (b)–(d) in FIG. 9. Since inverter 94 provides an output signal /NA of an L level when sense amplifier drive signal SON attains an L level, transfer gate 96 is turned on and transfer gate 104 is turned off. Therefore, sense amplifier drive signal SON of an L level is applied to the gate of transistor 90 via transfer gate 96. Therefore, voltage control circuit 91 supplies gate potential VG of ground potential GND level to the gate of transistor 90. When sense amplifier drive signal SON attains an H level, inverter 94 supplies output signal /NA of an H level, whereby transfer gates 96 and 104 are turned off and on, respectively. Therefore, intermediate potential (½) Vcc generated by reference potential generator 98 is supplied to the gate of transistor 90 via transfer gate 104. More specifically, voltage control circuit 91 supplies gate potential VG of an intermediate potential (½) Vcc level to the gate of transistor 90. Since transistor 90 receiving this intermediate potential (½) Vcc functions as a constant current source, common source node S2N of N channel sense amplifier 44 falls gently towards ground potential GND from intermediate potential (½) Vcc.

Figure 10:
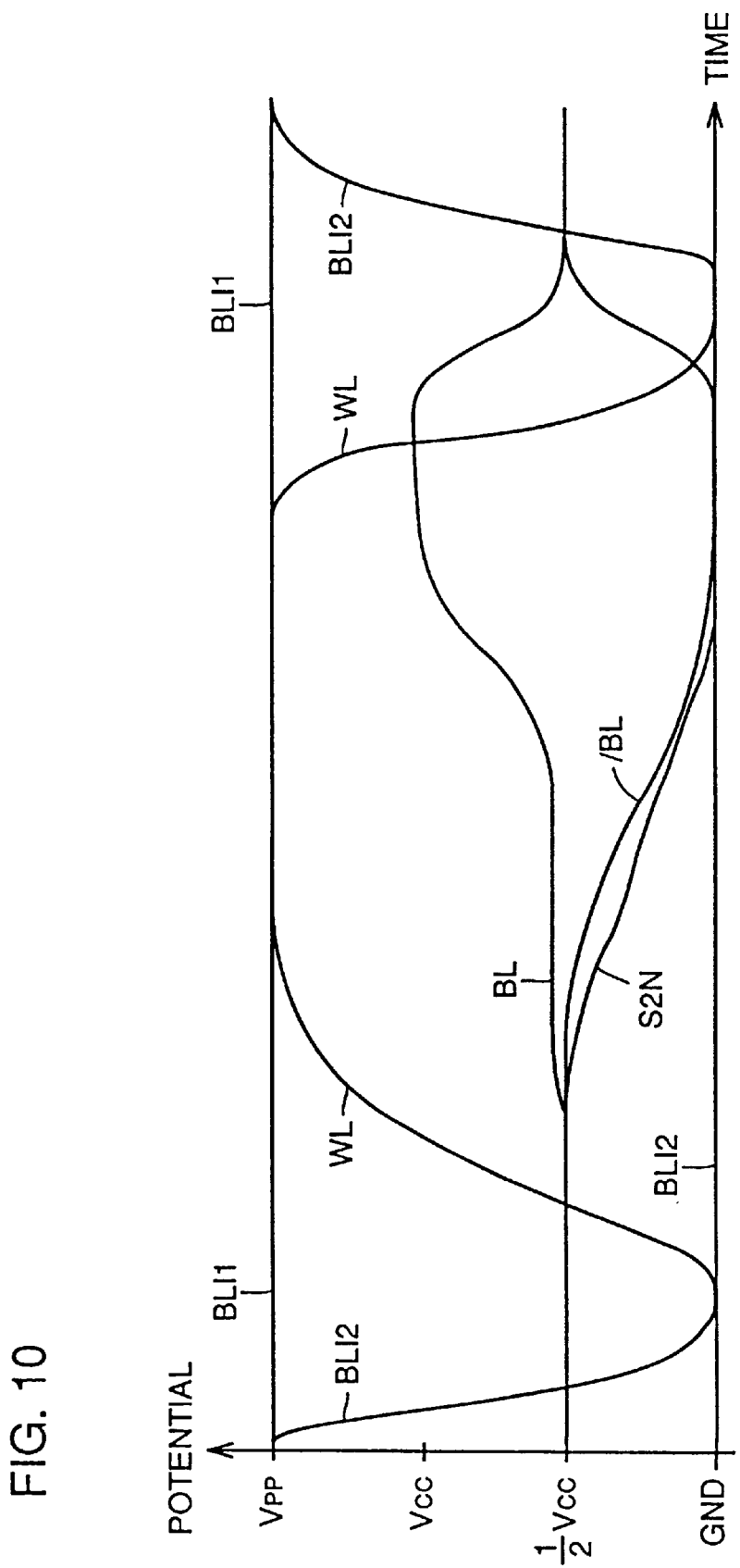
FIG. 10 is a graph showing change in potential of a bit line select signal, a word line, a bit line, and a common source node in the DRAM of FIG. 8.

FIG. 10 is a graph showing potential transition of bit line select signals BL1 and BL2, word line WL, bit lines BL and /BL, and common source node S2N of the DRAM shown in FIG. 8. The potential is plotted along the ordinate, and time is plotted along the abscissa.

Upon a rise of word line WL as shown in FIG. 10, difference in potential between bit lines BL and /BL is generated. Since intermediate potential (½) Vcc is applied to the gate of N channel MOS transistor 90, the potential of common source node S2N falls gently, not suddenly, towards the level of ground potential GND from intermediate potential (½) Vcc even when drive transistor 54 is turned on. Therefore, the potential of common source node S2N falls at a rate substantially equal to the falling rate of the potential of bit line /BL. Although the operation rate of sense amplifier 44 becomes slower, there will be no flow of a great amount of through current in sense amplifier 44 since the potential difference between bit line /BL and common source node S2N is not great.

According to the third embodiment, the potential of common source node S2N of N channel sense amplifier 44 is pulled down gently in a self refresh mode in which high speed is not required. Therefore, through current flowing in sense amplifier 44 is reduced, which results in reduction of power consumption of this DRAM.

In general, power consumed due to through current is approximately 40% of the power consumed by a sense amplifier. This means that reduction in through current across the sense amplifier is extremely advantageous in reducing power consumption of a DRAM. A little delay in the operation of the sense amplifier is of no problem since high speed is not required in a self refresh mode.

Fourth Embodiment

Figure 11:
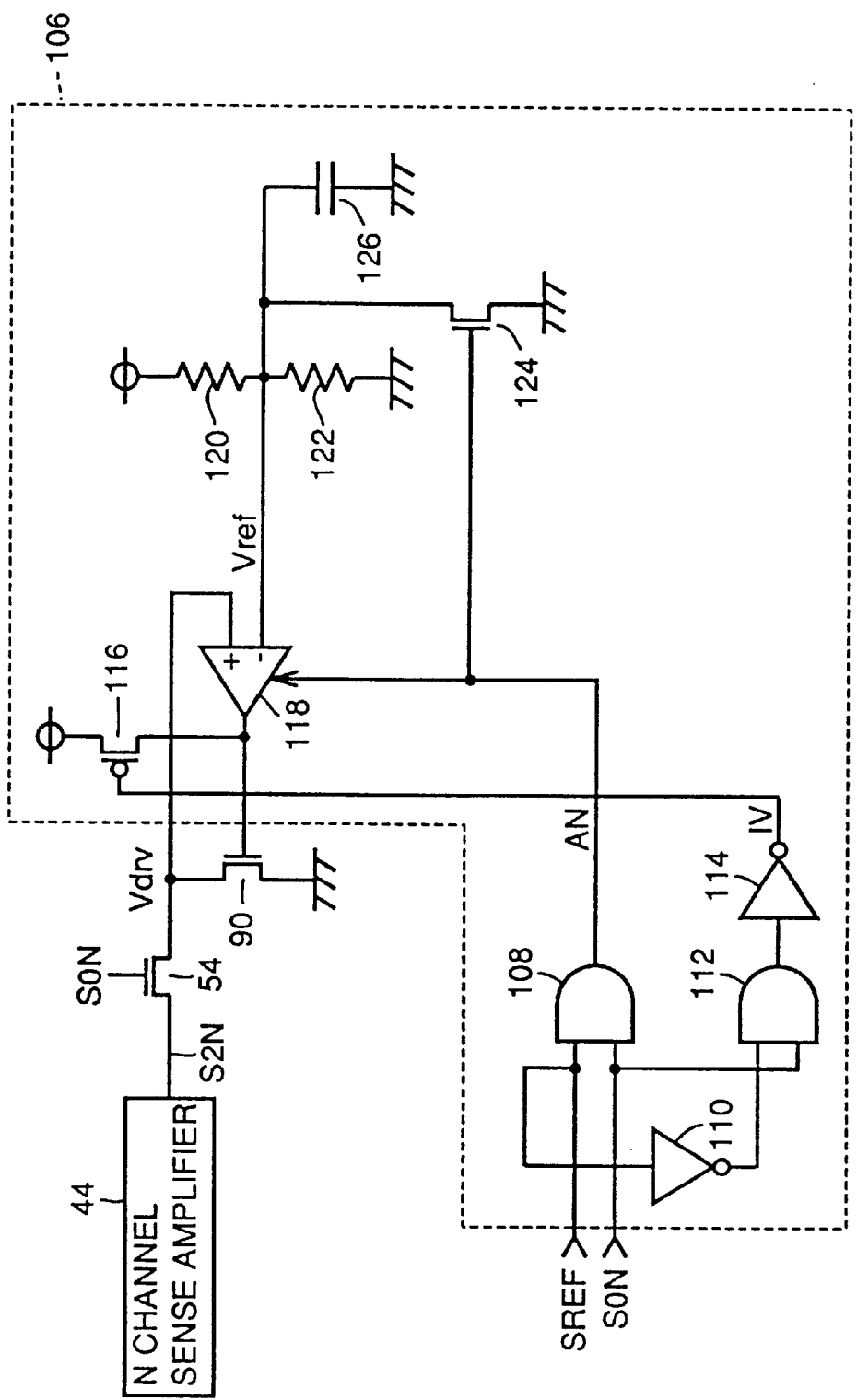
FIG. 11 is a circuit diagram showing a partial structure of a DRAM according to a fourth embodiment of the present invention.

FIG. 11 is a circuit diagram showing a partial structure of a DRAM according to a fourth embodiment of the present invention. Referring to FIG. 11, a voltage control circuit 106 is provided instead of voltage control circuit 91 of FIG. 8 in the present fourth embodiment. Voltage control circuit 106 includes AND gates 108 and 112, inverters 110 and 114, a P channel MOS transistor 116, a differential amplifier 118, resistors 120 and 122, a capacitor 126, and an N channel MOS transistor 124. Voltage control circuit 106 supplies to the gate of transistor 90 ground potential GND in a normal operation mode and a potential that is gradually pulled down from the level of intermediate potential (½) Vcc to ground potential GND in synchronization with sense amplifier drive signal SON in a self refresh mode.

Figure 12:
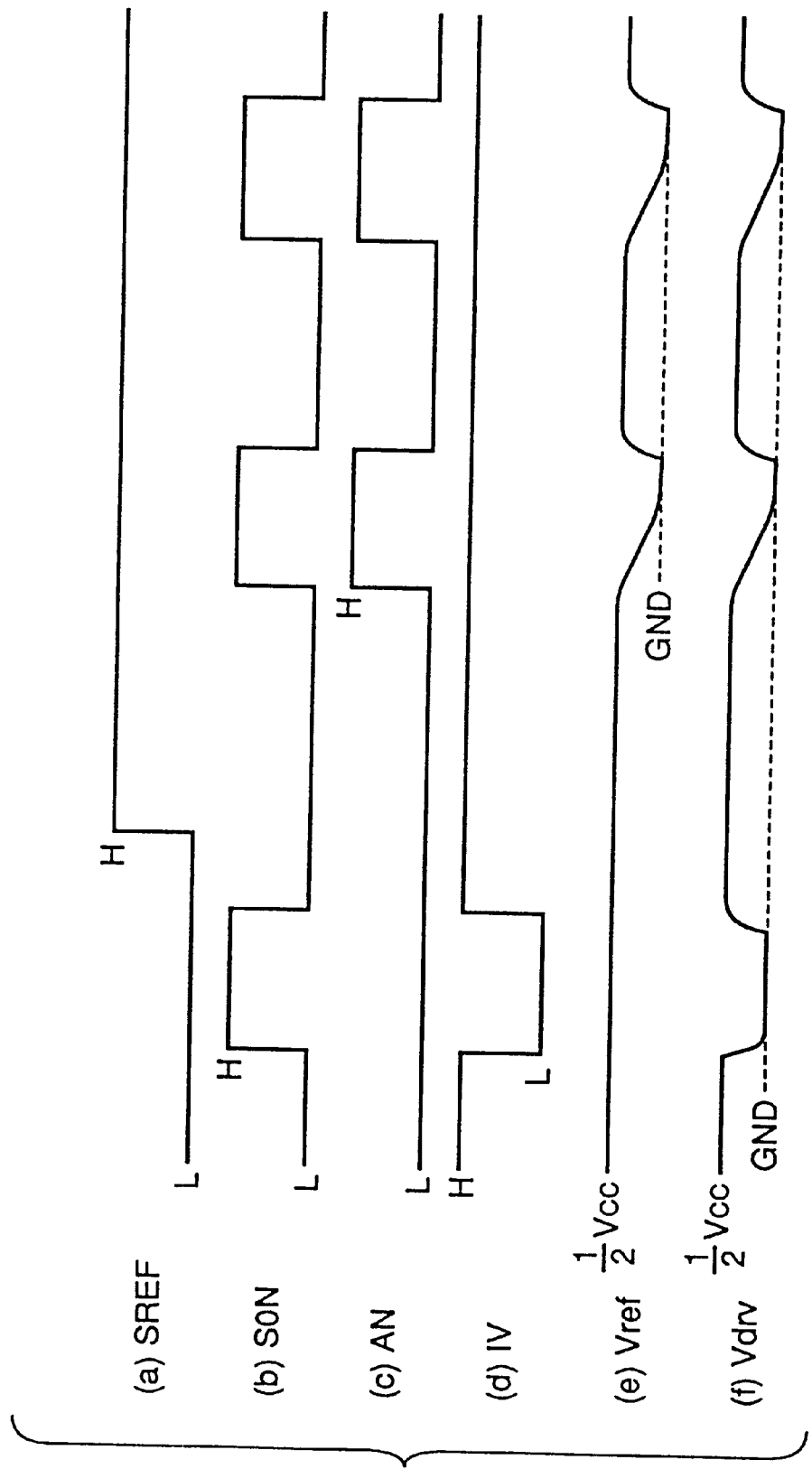
FIG. 12 is a timing chart showing an operation of the DRAM of FIG. 11.

An operation of the DRAM of FIG. 11 will be described hereinafter with reference to the timing chart of FIG. 12.

In a normal operation mode, self refresh enable signal SREF of an L level is applied to AND gate 108. AND gate 108 constantly supplies an output signal AN of an L level to differential amplifier 118 and to the gate of N channel MOS transistor 124 as shown in FIG. 12(c). As a result, differential amplifier 118 is deactivated, and transistor 124 is turned off. Self refresh enable signal SREF of an L level is also applied to inverter 110. Inverter 114 supplies an output signal IV that is altered in synchronization with sense amplifier drive signal SON to the gate of transistor 116. Since P channel MOS transistor 116 is turned on when sense amplifier drive signal SON of an H level is applied, power supply potential Vcc is applied to the gate of transistor 90. In response, transistor 90 is turned on, whereby drive potential Vdrv attains the level of ground potential GND as shown in FIG. (f). In a normal operation mode, N channel sense amplifier 44 responds to sense amplifier drive signal SON to operate in a general manner.

In a self refresh mode, self refresh enable signal SREF attains an H level, whereby output signal AN of AND gate 108 shows a transition in synchronization with sense amplifier drive signal SON. Furthermore, transistor 116 is turned off since inverter 114 constantly applies output signal IV of an H level to the gate of transistor 116. Transistor 124 is turned off when output signal AN of AND gate 108 attains an L level. Therefore, reference potential Vref is maintained at the level of intermediate potential (½) Vcc by resistors 120 and 122. Differential amplifier 118 compares drive potential Vdrv with reference potential Vref of intermediate potential (½) Vcc level to control transistor 90 so that drive potential Vdrv equals reference potential Vref. Therefore, drive potential Vdrv is maintained at the level of intermediate potential (½) Vcc as shown in FIG. 12(f).

When output signal AN from AND gate 108 attains an H level as shown in FIG. 12(c), differential amplifier 118 is activated, and transistor 124 is turned on. Therefore, reference potential Vref is gradually pulled down from the level of intermediate potential (½) Vcc towards ground potential GND as shown in FIG. 12(e). The falling rate is determined by capacitance of capacitor 126 and drain resistance of transistor 124. A greater capacitance of capacitor 126 causes reference potential Vref to be pulled down more gently. Since differential amplifier 118 controls transistor 90 so that drive potential Vdrv equals reference potential Vref, drive potential Vdrv is gradually pulled down from the level of intermediate potential (½) Vcc towards ground potential GND similar to reference potential Vref, as shown in FIG. 12(f).

Even when drive transistor 54 is turned on in response to sense amplifier drive signal SON of an H level in a self refresh mode, drive potential Vdrv is gradually pulled down from intermediate potential (½) Vcc towards ground potential GND in a self refresh mode. Therefore, common source node S2N of N channel sense amplifier 44 also is pulled down gradually from intermediate potential (½) Vcc towards ground potential GND.

Although, the operation rate of N channel sense amplifier 44 in the present fourth embodiment becomes slower as in the previous third embodiment due to the above-described gradual pull down, through current in N channel sense amplifier is reduced. Therefore, the entire power consumption of the DRAM is reduced.

Fifth Embodiment

Figure 13:
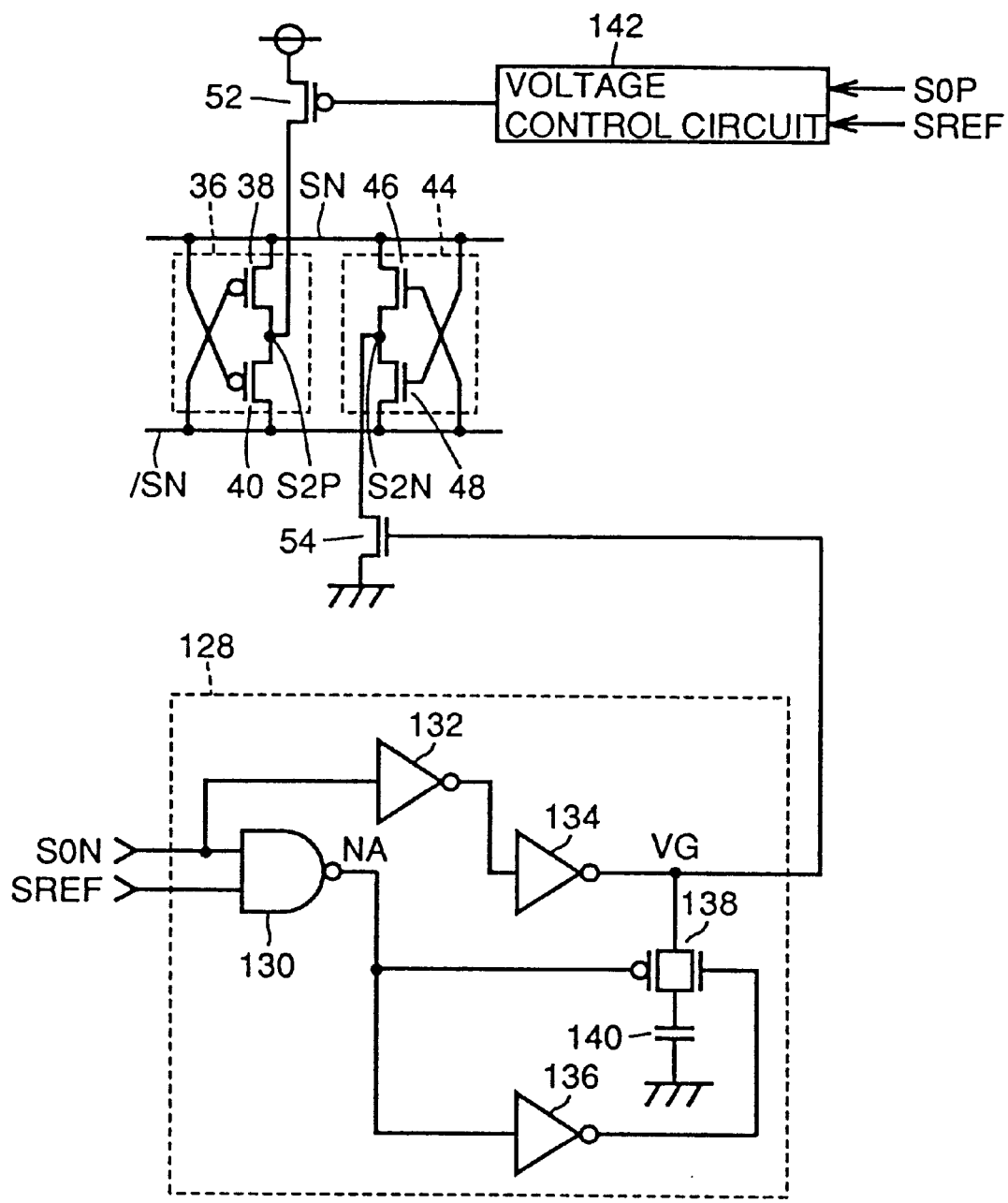
FIG. 13 is a circuit diagram showing a partial structure of a DRAM according to a fifth embodiment of the present invention.

FIG. 13 is a circuit diagram showing a partial structure of a DRAM according to a fifth embodiment of the present invention. In the previous third and fourth embodiments, another transistor 90 is connected in series to drive transistor 54, which is controlled by voltage control circuits 91 and 106. In the fifth embodiment, drive transistor 52 for P channel sense amplifier 36 is controlled by voltage control circuit 142, and drive transistor 54 for N channel sense amplifier 44 is controlled by a voltage control circuit 128 as shown in FIG. 13.

Referring to FIG. 13, voltage control circuit 128 includes a NAND gate 130, inverters 132, 134, 136, a transfer gate 138, and a capacitor 140. Voltage control circuit 128 directly supplies sense amplifier drive signal SON to drive transistor 54 in a normal operation mode, and supplies gate potential VG that is gradually pulled up from the level of ground potential GND to power supply potential Vcc in synchronization with sense amplifier drive signal SON in a self refresh mode to drive transistor 54.

An operation of the DRAM of FIG. 13 will be described hereinafter with reference to the timing chart of FIG. 14.

Figure 14:
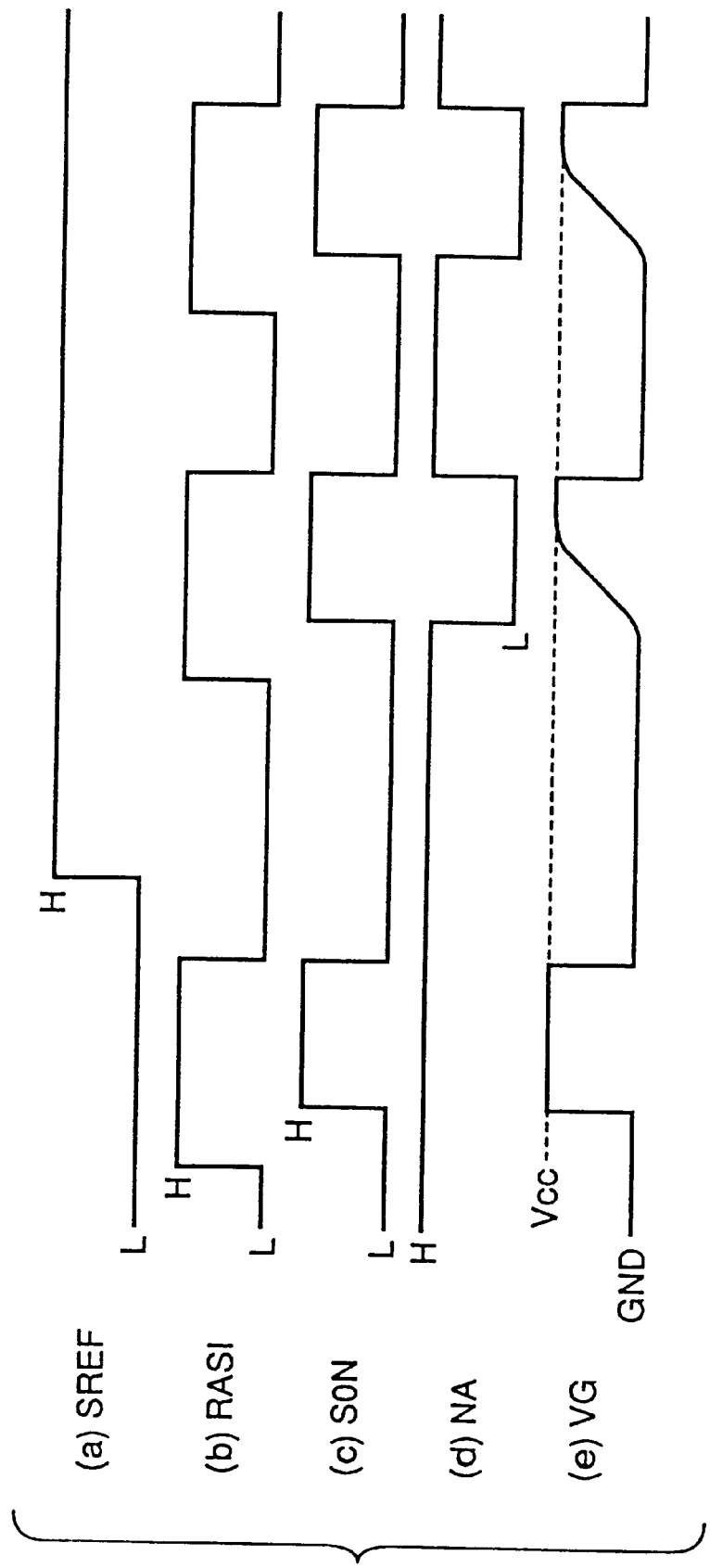
FIG. 14 is a timing chart showing an operation of the DRAM of FIG. 13.

In a normal operation mode, self refresh enable signal SREF attains an L level as shown in FIG. 14(a). Therefore, an output signal NA of NAND gate 130 attains an H level as shown in FIG. 14(d). As a result, transfer gate 138 is turned off, and sense amplifier drive signal SON as shown in FIG. 14 is applied to the gate of drive transistor 54 as gate potential VG. More specifically, gate potential VG attains the level of ground potential GND and power supply potential Vcc when sense amplifier drive signal SON attains an L level and an H level, respectively, as shown in FIG. 14(e). Therefore, sense amplifier 44 operates normally in a normal operation mode.

In a self refresh mode, self refresh enable signal SREF attains an H level as shown in FIG. 14(a). A signal NA of NAND gate 130 shows a transition in synchronization with sense amplifier drive signal SON as shown in FIG. 14(d). Since transfer gate 138 is turned off when sense amplifier signal SON attains an L level, gate potential VG maintains the level of ground potential GND. When sense amplifier drive signal SON attains an H level, transfer gate 138 is turned on, whereby gate potential VG is gradually pulled up as shown in FIG. 14(e), and not suddenly, in response to sense amplifier drive signal SON. The rising rate of gate potential VG is retarded as a function of the capacitance of capacitor 140.

Although the operation rate of sense amplifier 44 is retarded since gate potential VG of drive transistor 54 is gradually up from ground potential GND to power supply potential Vcc in a self refresh mode, the through current flowing in sense amplifier 44 is reduced.

Voltage control circuit 142 has a structure substantially similar to that of voltage control circuit 128. In voltage control circuit 142, sense amplifier drive signal SOP is directly supplied to drive transistor 52 in a normal operation mode, and a potential that is gradually pulled down from power supply potential Vcc towards ground potential GND in response to sense amplifier drive signal SOP is supplied to the gate of drive transistor 52 in a self refresh mode. Although the operation rate of sense amplifier 36 is retarded in a self refresh mode, through current flowing in sense amplifier 36 is reduced.

According to the fifth embodiment, potential of common source node S2P is gradually pulled up towards power supply potential Vcc and potential of common source node S2N is gradually pulled down towards ground potential GND in a self refresh mode. Therefore, through current flowing in sense amplifiers 36 and 44 is reduced to result in reduction in the entire power consumption of the DRAM.

Sixth Embodiment

Figure 15:
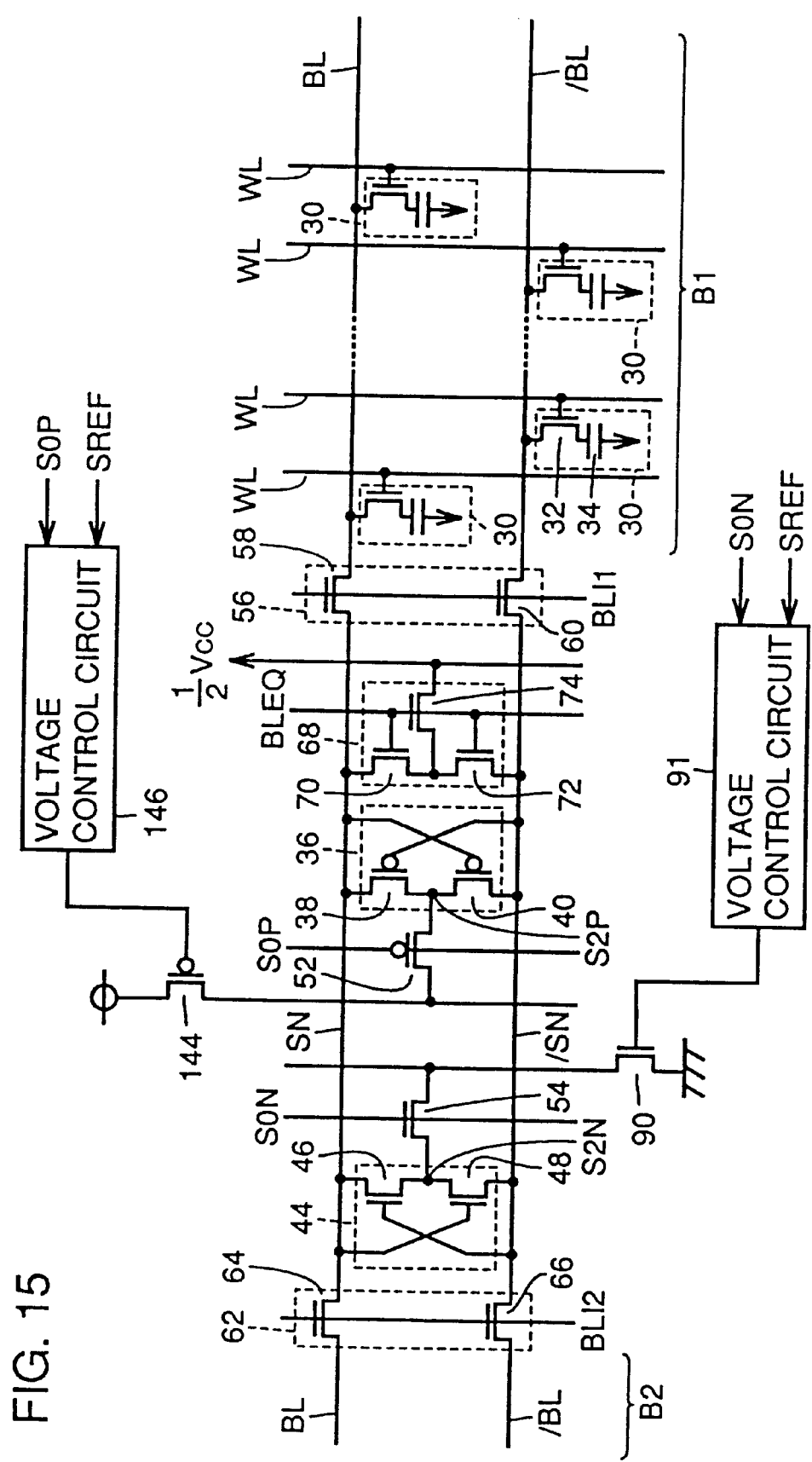
FIG. 15 is a circuit diagram showing a partial structure of a DRAM according to a sixth embodiment of the present invention.

FIG. 15 is a circuit diagram showing a partial structure of a DRAM according to a sixth embodiment of the present invention. In contrast to the third embodiment shown in FIG. 8 in which a controllable transistor 90 is provided only at the side of N channel sense amplifier 44, a P channel MOS transistor 144 is provided, not only at the side of N channel sense amplifier 44, but also at the side of P channel sense amplifier 36 in the sixth embodiment shown in FIG. 15. Transistor 144 is connected in series to drive transistor 52 for P channel sense amplifier 36, and has a source connected to ground node. Transistor 144 is controlled by voltage control circuit 146. Voltage control circuit 146 directly supplies sense amplifier drive signal SOP to the gate of transistor 144 in a normal operation mode. In a self refresh mode, voltage control circuit 146 gradually pulls up the gate potential of transistor 144 from the level of intermediate potential (½) Vcc to power supply potential Vcc in response to sense amplifier drive signal SOP.

Figure 16:
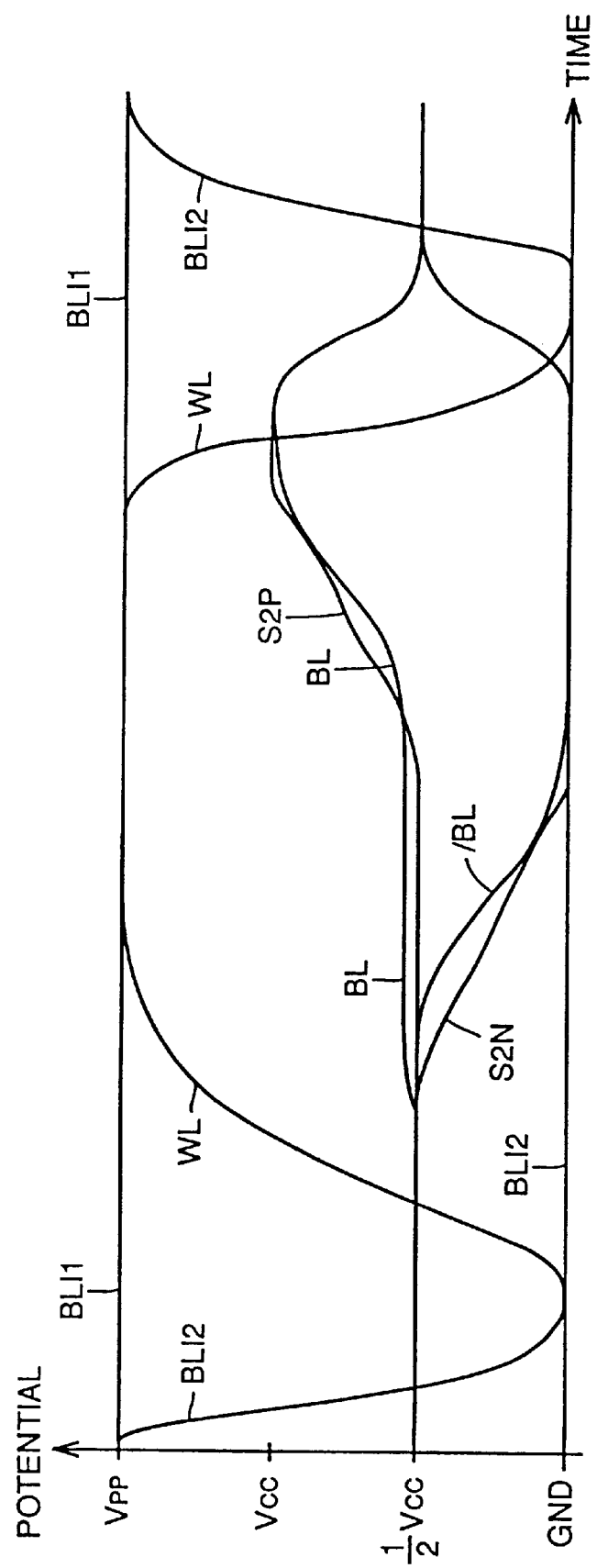
FIG. 16 is a graph showing change in potential of a bit line select signal, a word line, a bit line, and a common source node of the DRAM of FIG. 15.

FIG. 16 is a graph showing potential transition of bit line select signals BLI1, BLI2, word line WL, bit lines BL and /BL, and common source nodes S2N and S1P of the DRAM shown in FIG. 15. Potential is plotted along the ordinate, and time is plotted along the abscissa.

As shown in FIG. 16, common source node S2N of N channel sense amplifier 44 is gradually pulled down from the level of intermediate potential (½) Vcc towards ground potential GND, and the potential of common source node S2P of P channel sense amplifier 36 is gradually pulled up from the level of intermediate potential (½) Vcc towards power supply potential Vcc in a self refresh mode. Although the operation rate of sense amplifiers 36 and 44 is retarded, the through current flowing in sense amplifiers 36 and 44 is reduced.

By driving not only the potential of common source node S2N of N channel sense amplifier 44, but also the potential of common source node S2P of P channel sense amplifier 36, the through current flowing through sense amplifiers 36 and 44 can further be reduced.

Seventh Embodiment

Figure 17:
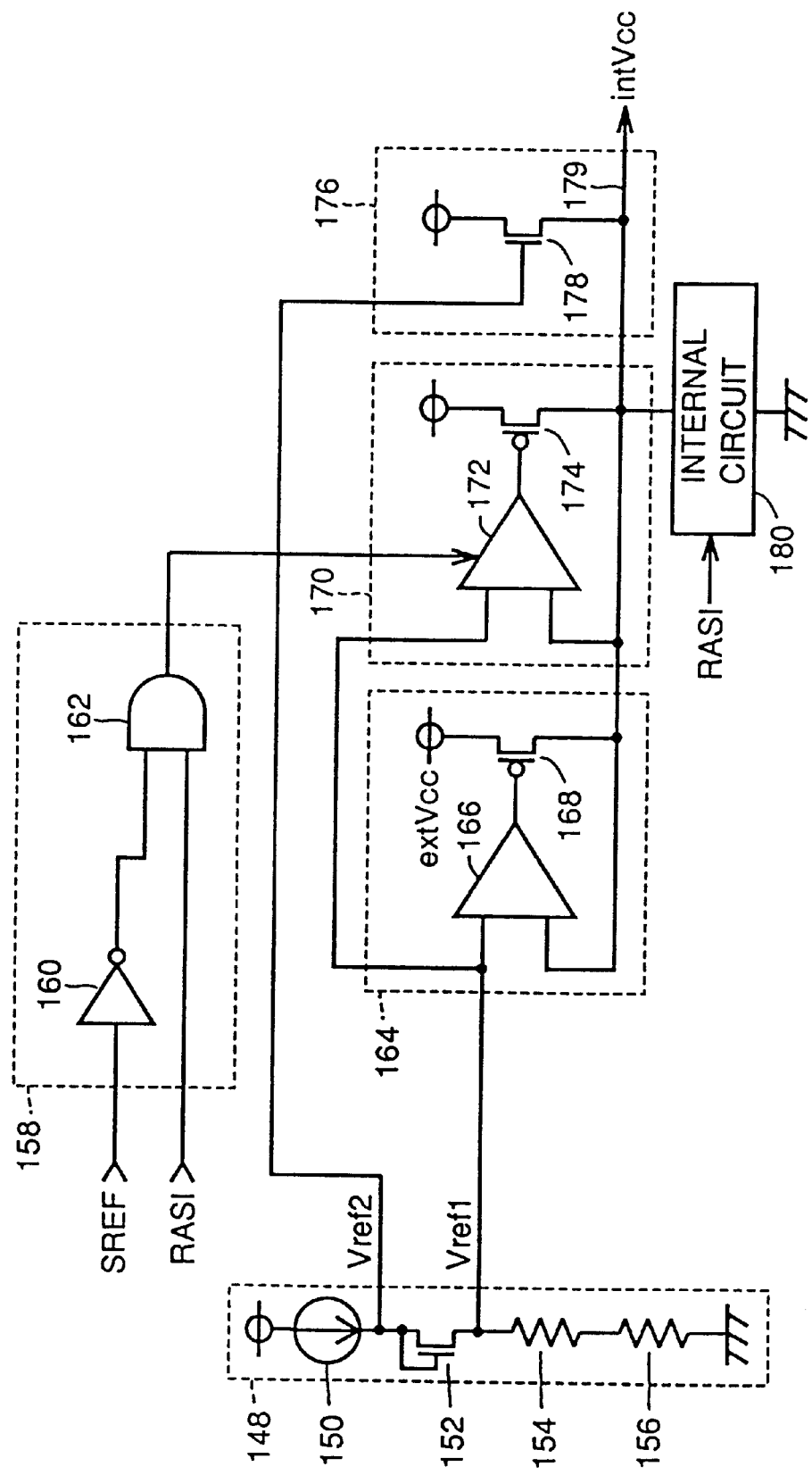
FIGS. 17–23 are circuit diagrams showing a structure of an internal voltage-down circuit employed in the DRAM according to seventh–thirteenth embodiments, respectively, of the present invention.

FIG. 17 is a circuit diagram showing a structure of an internal voltage-down circuit employed in a DRAM according to a seventh embodiment of the present invention. Referring to FIG. 17, the DRAM includes an internal voltage-down circuit for supplying an internal power supply potential intVcc on the basis of an external power supply potential Vcc, and an internal circuit 180 responsive to an internal row address strobe signal RASI for activation. This internal voltage-down circuit includes a reference potential generation circuit 148 for generating two reference potentials Vref1 and Vref2, a voltage-down converter 164 having a small current supply capability and that is always activated, a voltage-down converter 170 of a gate current supply capability and that is activated only at activation of the chip, a down converter control circuit 158 for controlling down converter 170, and a voltage-down converter 176 formed only of an N channel MOS transistor 178.

Reference potential generation circuit 148 includes a constant current source 150, a diode-connected N channel MOS transistor 152, and resistors 154 and 156. Voltage-down converter 164 includes a comparator circuit 166 for comparing internal power supply potential intVcc with reference potential Vref1, and a drive transistor 168 connected between an external power supply node and an internal power supply line 179, and controlled by an output of comparator circuit 66. Similar to voltage-down converter 164, voltage-down converter 170 includes a comparator circuit 172 and a drive transistor 174. It is to be noted that comparator circuit 172 is activated in response to an output of control circuit 158. The size of drive transistor 174 of voltage-down converter 174 is greater than that of drive transistor 168 of voltage-down converter 164. Therefore, voltage-down converter 170 has a current supply capability greater than that of voltage-down converter 164. Down converter control circuit 158 includes an inverter 160 and an AND gate 162. N channel MOS transistor 178 of voltage-down converter 176 is connected between an external power supply node and internal power supply line 179, and has a gate receiving reference potential Vref2.

An operation of the internal voltage-down circuit of FIG. 17 will be described hereinafter.

In a standby state, voltage-down converters 164 and 176 operate. In voltage-down converter 164, comparator circuit 166 compares internal power supply potential intVcc with reference potential Vref1, and turns on drive transistor 168 when internal power supply potential intVcc is lower than reference potential Vref1. Comparator circuit 166 turns off drive transistor 168 if internal power supply potential intVcc is higher than reference potential Vref1. Accordingly, voltage-down converter 164 supplies to internal power supply line 179 an internal power supply potential intVcc equal to reference potential Vref1. Although voltage-down converter 164 supplies a current of only several μA, internal power supply potential intVcc can be compensated for sufficiently by voltage-down converter 164 of such a small current supply capability since internal circuit 180 consumes almost no current in a standby state.

Transistor 152 of reference potential generation circuit 148 has a threshold voltage identical to that of transistor 178 of voltage-down converter 176. Since reference potential Vref2 becomes higher than reference potential Vref1 by the threshold voltage of transistor 152, a voltage equal to the threshold voltage of transistor 178 is applied across the source and gate of transistor 178. Therefore, voltage-down converter 176 including transistor 178 supplies to internal power supply line 179 an internal power supply potential intVcc on the basis of external power supply potential extVcc. Since voltage-down converter 176 is formed only of transistor 178, unnecessary current that will not be supplied to internal power supply line 179 will not be consumed as in voltage-down converter 164.

Since self refresh enable signal SREF attains an L level in a normal operation mode, AND gate 162 of control circuit 158 supplies an output signal in synchronization with internal row address strobe signal RASI to comparator circuit 172. Therefore, comparator circuit 172 is activated in response to internal row address strobe signal RASI in a normal operation mode. As a result, voltage-down converter 170 supplies an internal power supply potential intVcc on the basis of external power supply potential extVcc to internal power supply line 179. Here, a great amount of current is consumed in internal circuit 180 since it is activated in response to internal row address strobe signal RASI. Although internal power supply potential intVcc is lowered significantly in some cases, the lowered level of internal power supply potential intVcc is rapidly restored to a predetermined potential since voltage-down converter 170 of a great current supply capability operates. Since internal circuit 180 operates at a high speed, reduction in internal power supply potential intVcc must be rapidly restored to a predetermined level.

In a self refresh mode, self refresh enable signal SREF attains an H level. AND gate 162 of control circuit 158 constantly supplies an output signal of an L level to comparator circuit 172 irrespective of internal row address strobe signal RASI. Therefore, comparator circuit 172 is not activated, and maintains the deactivation state. Only voltage-down converters 164 and 176 operate in a self refresh mode. Even if internal power supply potential intVcc is lowered significantly than reference potential Vref1, the lowered level of internal power supply potential intVcc cannot be rapidly restored to the level of reference potential Vref1. Therefore, the operation rate of internal circuit 180 is retarded. However, power consumed within the internal voltage-down circuit in a self refresh mode is reduced.

According to the seventh embodiment, voltage-down converter 170 of a great current supply capability is activated only in a normal operation mode, and not in a self refresh mode. Therefore, power consumption in the internal voltage-down circuit in a self refresh mode can be reduced.

A differential amplifier using a current mirror circuit, for example, is preferably employed as the above-described comparator circuits 166 and 172.

Eighth Embodiment

Figure 18:
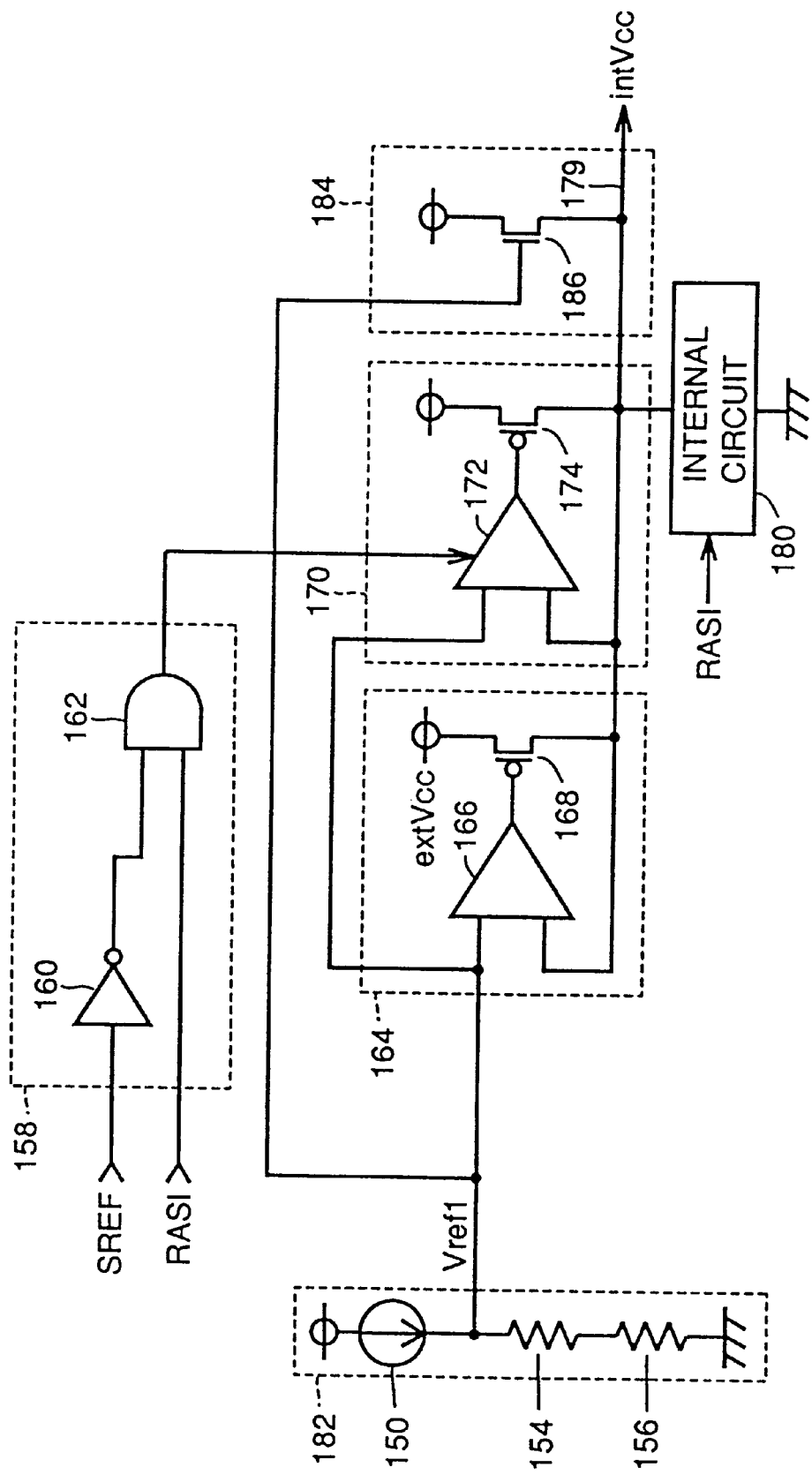

FIG. 18 is a circuit diagram showing a structure of an internal voltage-down circuit used in a DRAM according to an eighth embodiment of the present invention. In contrast to the internal voltage-down circuit of FIG. 17 in which reference potential generation circuit 148 generating a reference potential Vref2 to be supplied to transistor 178 includes a transistor 152, a voltage-down converter 184 of the present eighth embodiment of FIG. 18 is formed of an N channel MOS transistor 186 having a threshold voltage of zero volt. Therefore, reference potential generation circuit 182 does not include transistor 152. Reference potential Vref1 generated by reference potential generation circuit 182 is applied not only to voltage-down converters 164 and 170, but also to transistor 186 of voltage-down converter 184. A depletion type transistor, for example, is employed as transistor 186 having a threshold voltage of zero volt.

According to the eighth embodiment, voltage-down converter 184 is formed only of transistor 186 having a threshold voltage of zero volt. Therefore, reference potential generation circuit 182 does not require a transistor 152 as in reference potential generation circuit 148 of FIG. 17.

Ninth Embodiment

Figure 19:
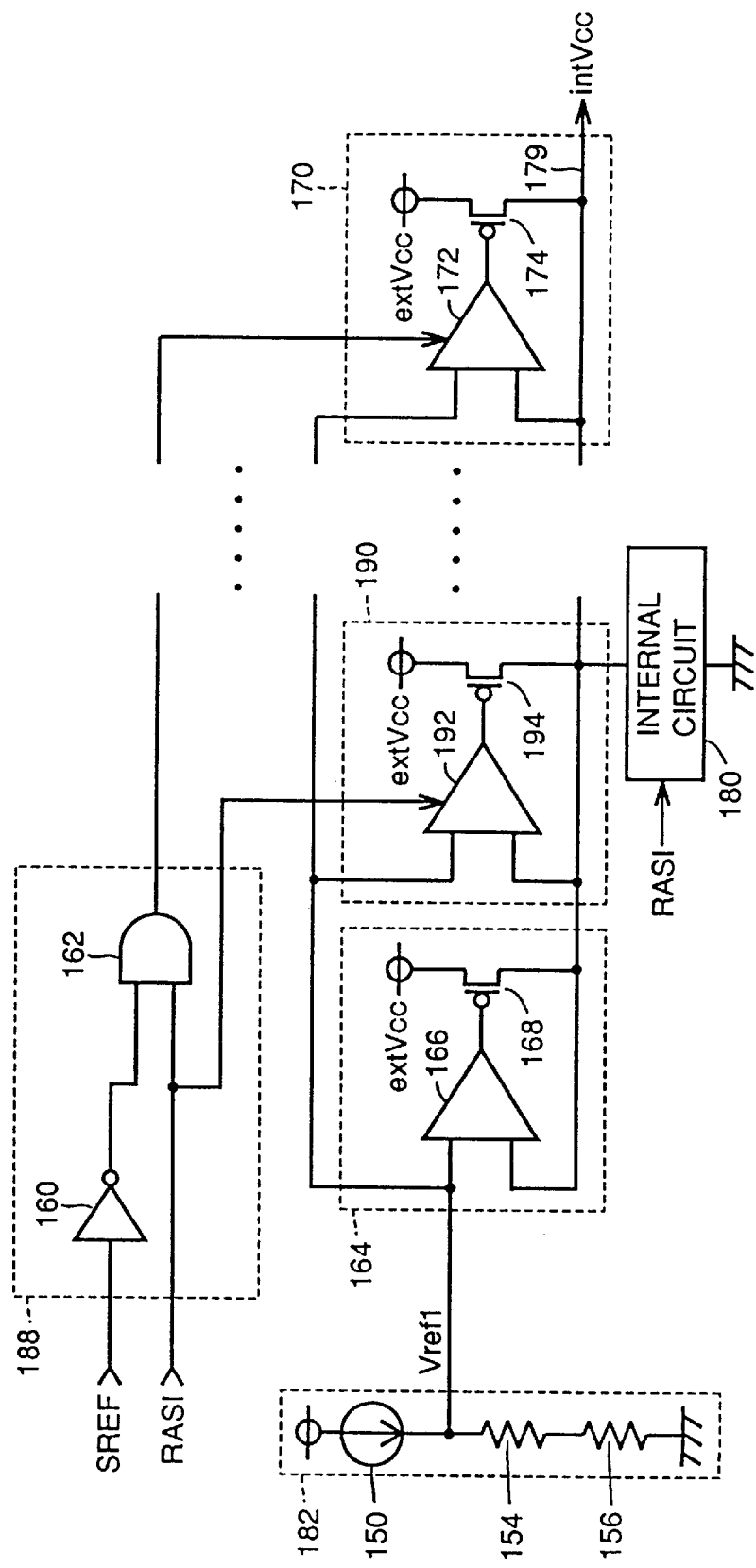

FIG. 19 is a circuit diagram showing a structure of an internal voltage-down circuit employed in a DRAM according to a ninth embodiment of the present invention. Referring to FIG. 19, the internal voltage-down circuit includes a reference potential generation circuit 182, a plurality of voltage-down converters 164, 190, 170, and a down converter control circuit 188 for controlling voltage-down converters 190 and 170.

When internal circuit 180 attains a standby state, only voltage-down converter 164 is activated. Here, self refresh enable signal SREF of an L level is applied to inverter 160, and internal row address strobe signal RASI of an L level is applied to AND gate 162 and comparator circuit 192 of voltage-down converter 190. Therefore, all the voltage-down converters 190 and 170 besides voltage-down converter 164 are not activated.

When internal circuit 180 is activated in response to an internal row address strobe signal RASI of an H level in a normal operation mode, internal row address strobe signal RASI of an H level is applied also to control circuit 180. Therefore, voltage-down converter 190 is also activated. Here, self refresh enable signal SREF of an L level is applied to control circuit 188. Control circuit 188 activates all the plurality of voltage-down converters 170. Therefore, all voltage-down converters 164, 190 and 170 are activated when internal circuit 180 is activated in a normal operation mode.

When internal circuit 180 is activated in response to an internal row address strobe signal RASI of an H level in a self refresh mode, voltage-down converter 190 is activated. However, the plurality of voltage-down converters 170 other than voltage-down converters 164 and 190 are not activated since self refresh enable signal SREF of an H level is applied to control circuit 188. Therefore, two voltage-down converters 164 and 194 supply internal power supply potential intVcc to internal power supply line 179 on the basis of external power supply potential extVcc in a self refresh mode. Since the number of voltage-down converters operating in a self refresh mode is fewer than the number of voltage-down converters operating in a normal operation mode, a great reduction in internal power supply potential intVcc in a self refresh mode cannot be rapidly restored to the level equal to reference potential Vref1. However, delay in the recovery of internal power supply potential intVcc does not affect the self refresh operation since high speed is not required therein.

According to the above-described ninth embodiment, the number of voltage-down converters in a self refresh mode is fewer than that in a normal operation mode. Therefore, power consumption of the internal voltage-down circuit in a self refresh mode is reduced.

Tenth Embodiment

Figure 20:
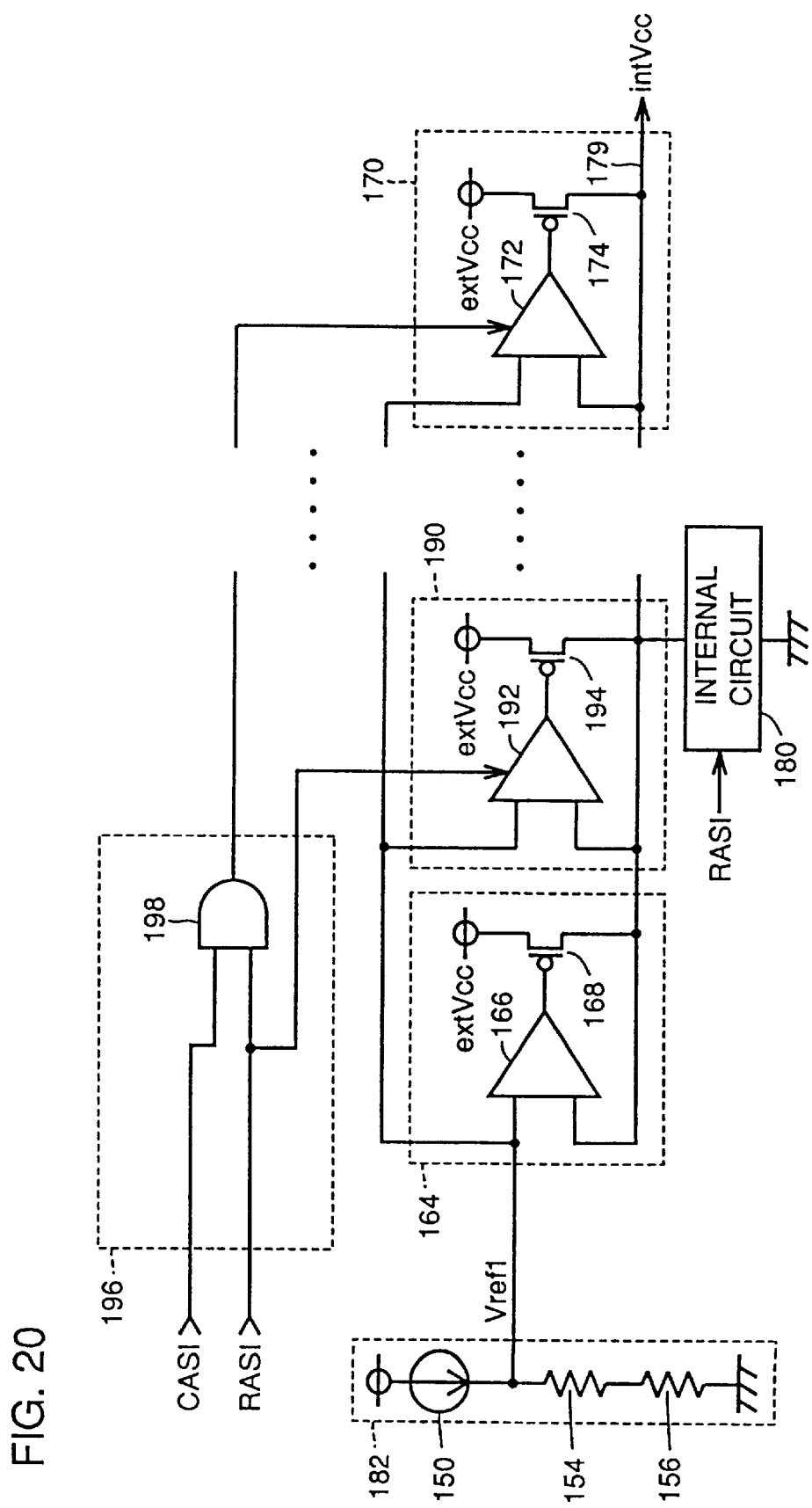

FIG. 20 is a circuit diagram showing a structure of an internal voltage-down circuit used in a DRAM according to a tenth embodiment of the present invention. Referring to FIG. 20, this internal voltage-down circuit includes a down converter control circuit 196 instead of down converter control circuit 180 shown in FIG. 19. Down converter control circuit 196 includes an AND gate 198 receiving an internal column address strobe signal CASI and an internal row address strobe signal RASI.

In the present internal voltage-down circuit, all voltage-down converters 164, 190 and 170 are activated in an operation mode that requires a high speed, and only down converters 164 and 190 are activated in an operation mode that does not require high speed. Therefore, power consumption of this internal voltage-down circuit is reduced in an operation mode that does not require high speed.

Eleventh Embodiment

Figure 21:
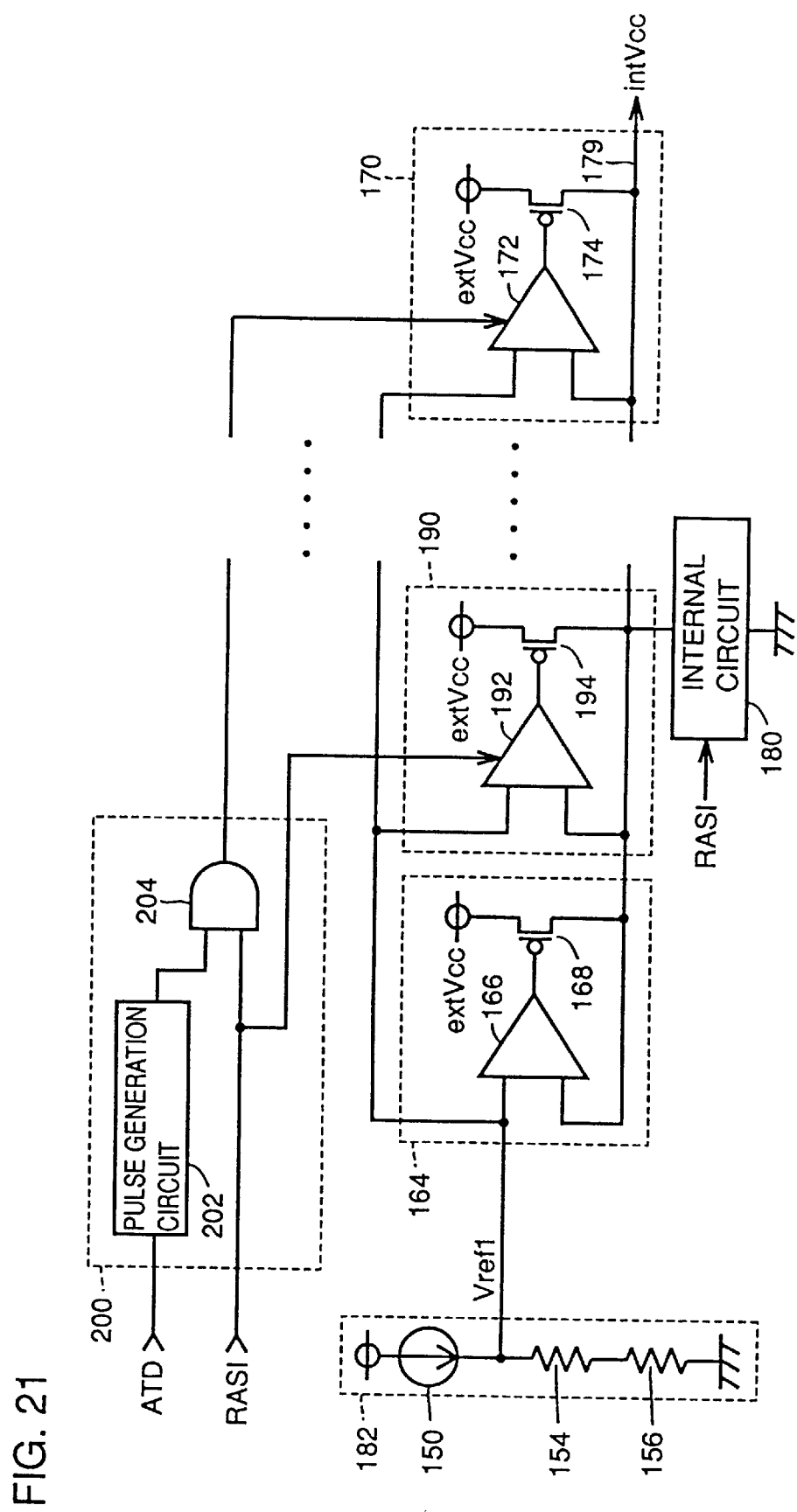

FIG. 21 is a circuit diagram showing a structure of an internal voltage-down circuit used in a DRAM according to an eleventh embodiment of the present invention. This DRAM includes an address transition detector (not shown) that has an extremely high operation rate for detecting transition of an address signal. An address transition detection signal ATD is generated by the address transition detector at a transition of an address signal. A sense amplifier (not shown) and the like in internal circuit 180 are activated in response to this address transition detection signal ATD.

Referring to FIG. 21, an internal voltage-down circuit of the present eleventh embodiment includes a down converter control circuit 200 instead of down converter control circuit 188 shown in FIG. 19. Down converter control circuit 200 includes a pulse generation circuit 202 responsive to address transition detection signal ATD for generating a pulse signal that attains an H level for a predetermined time period, and an AND gate 204 receiving that pulse signal and an internal row address strobe signal RASI.

When internal row address strobe signal RASI of an H level is applied, internal circuit 180 and also voltage-down converter 190 are activated. Pulse generation circuit 200 will not generate a pulse signal of an H level if there is no transition in the address signal even when internal row address strobe signal RASI of an H level is applied. Therefore, AND gate 204 supplies an output signal of an L level to a plurality of comparator circuits 172. Therefore, all voltage-down converters 170 including comparator circuit 172 will not be activated.

When an address signal shows a transition during provision of an internal row address strobe signal RASI of an H level, pulse generation circuit 200 generates a pulse signal of an H level. In response, AND gate 204 supplies an output signal of an H level to the plurality of comparator circuits 172. Therefore, all voltage-down converters 170 including comparator circuits 172 are activated.

Since a sense amplifier is not activated even when internal row address strobe signal RASI attains an H level if the address signal shows no transition, two voltage-down converters 164 and 190 supply internal power supply potential intVcc to internal power supply line 179 on the basis of external power supply potential extVcc. When a sense amplifier is activated upon transition of an address signal, all voltage-down converters 164, 190 and 170 supply internal power supply potential intVcc on a basis of external power supply potential extVcc to internal power supply node 179.

According to the present eleventh embodiment, all voltage-down converters are not activated even when internal row address strobe signal RASI is pulled up if there is no transition of the address signal. Therefore, power consumption in the internal voltage-down circuit is reduced.

Twelfth Embodiment

Figure 22:
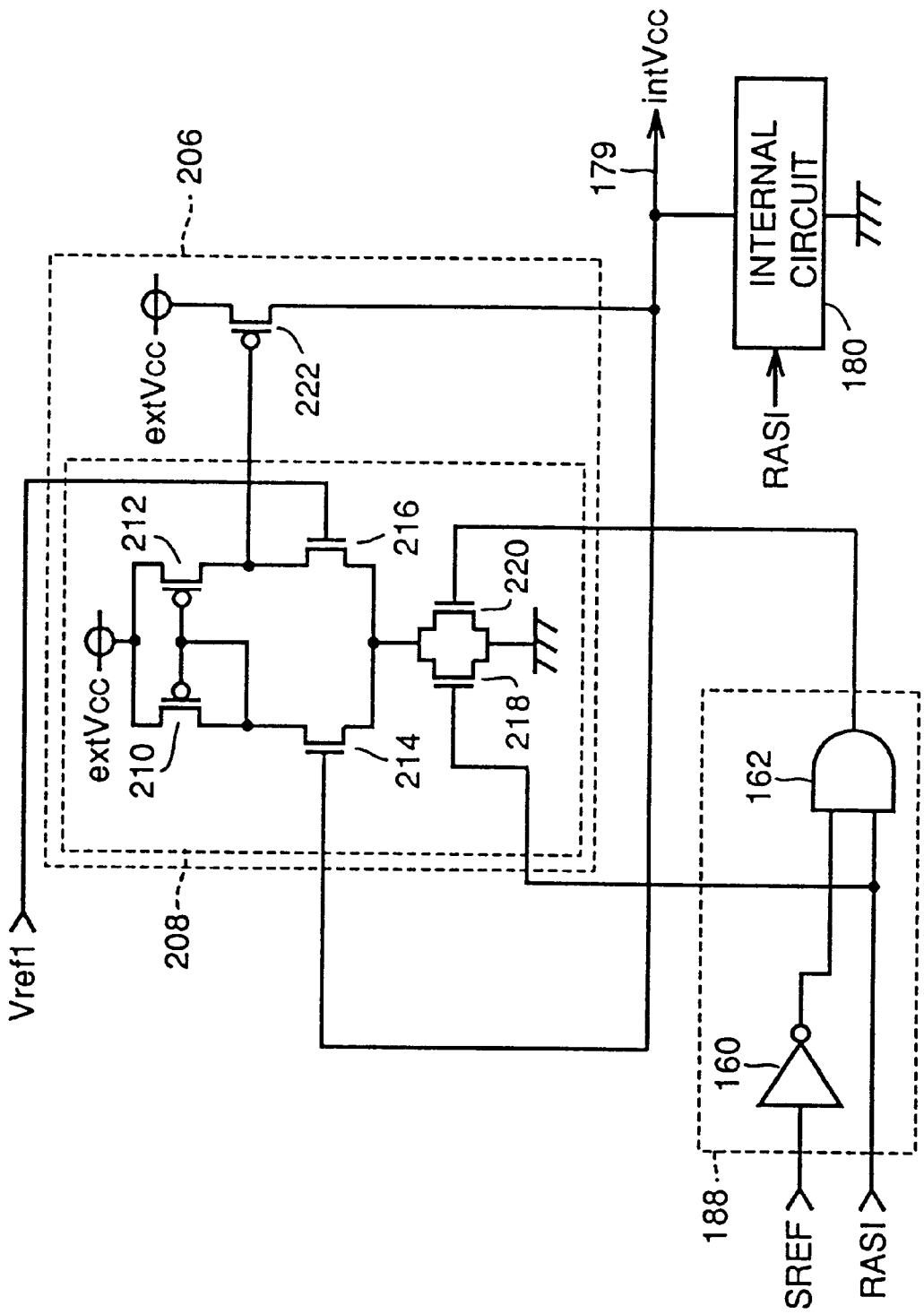

FIG. 22 is a circuit diagram showing a structure of an internal voltage-down circuit employed in a DRAM according to a twelfth embodiment of the present invention. Referring to FIG. 22, an internal voltage-down circuit includes a voltage-down converter 206 for supplying internal power supply potential intVcc according to external power supply potential extVcc, and a down converter control circuit 188 for controlling voltage-down converter 206. Voltage-down converter 206 includes a differential amplifier 208 employing a current mirror circuit, and a drive transistor 222 controlled by differential amplifier 208. Differential amplifier 208 includes P channel MOS transistors 210 and 212, and N channel MOS transistors 214, 216, 218 and 220. P channel MOS transistors 210 and 212 form a current mirror circuit. Internal power supply potential intVcc is fed back to the gate of transistor 214. Reference potential Vref1 is applied to the gate of transistor 216. Transistors 218 and 220 connected in parallel are controlled in response to an output signal from control circuit 188. Drive transistor 222 is connected between an external power supply node and internal power supply line 179, and has a gate receiving an output signal of differential amplifier 208. Control circuit 188 includes an inverter 160 and an AND gate 162.

In a normal operation mode, self refresh enable signal SREF of an L level is applied to control circuit 188. Internal circuit 180 is activated upon provision of internal row address strobe signal RASI of an H level. Since this signal is also applied to control circuit 188, internal row address strobe signal RASI of an H level is applied to transistor 218, and also to transistor 220 via AND gate 162. As a result, transistors 218 and 220 are both turned on, whereby the driving capability of differential amplifier 208 is increased. Therefore, the gate of drive transistor 222 is charged/discharged sufficiently. Even if internal circuit 180 consumes a great amount of current to result in a great reductance in internal power supply potential intVcc, the level of internal power supply potential intVcc is rapidly restored to the level of reference potential Vref1.

In a self refresh mode, self refresh enable signal SREF of an H level is applied to control circuit 188, whereby AND gate 162 supplies an output signal of an L level to transistor 220. In response to internal row address strobe signal RASI of an H level, transistor 218 is turned on, and transistor 220 is kept at an off state in a self refresh mode. Therefore, the driving capability of differential amplifier 208 is reduced.

Since the current supply capability of voltage-down converter 206 is low in a self refresh mode, a great reduction in internal power supply potential intVcc will require a long time period for the level to be restored to reference potential Vref1. However, a refresh operation can be carried out sufficiently since high speed operation is not required in a self refresh mode. Furthermore, power consumption of differential amplifier 208 is reduced since transistor 220 therein is not turned on in a self refresh mode.

According to the twelfth embodiment of the present invention, power consumption of the internal voltage-down circuit is reduced since the current supply capability of voltage-down converter 206 in a self refresh mode becomes lower than in a normal operation mode.

Thirteenth Embodiment

Figure 23:
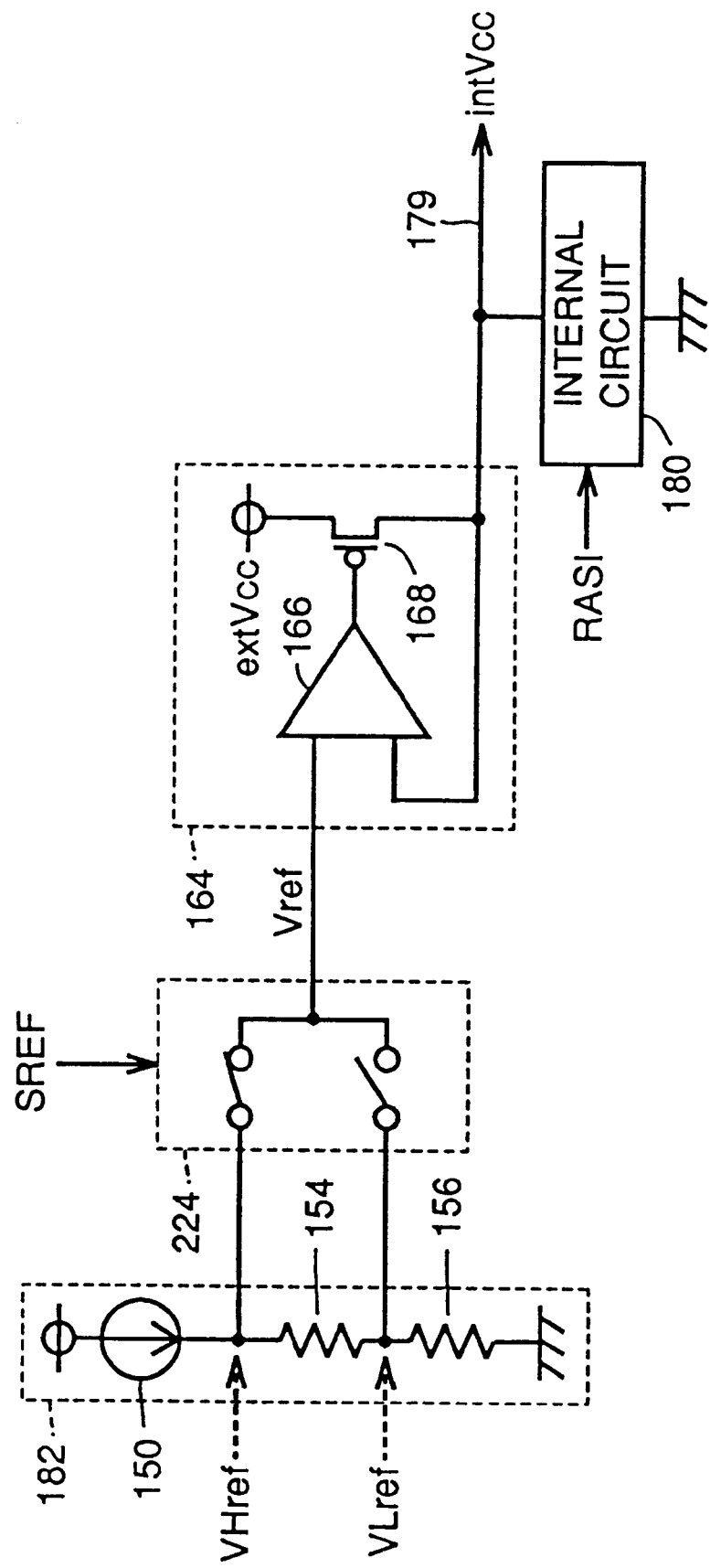

FIG. 23 is a circuit diagram showing a structure of an internal voltage-down circuit used in a DRAM according to a thirteenth embodiment of the present invention. Referring to FIG. 23, an internal voltage-down circuit includes a reference potential generation circuit 182 for generating reference potentials VHref and VLref, a selector 224 for selecting reference potentials VHref and VLref in response to self refresh enable signal SREF, and a voltage-down converter 164 for supplying an internal power supply potential intVcc equal to the level of the selected reference potential VHref according to external power supply potential extVcc.

In a normal operation mode, selector 224 selects reference potential VHref in response to self refresh enable signal SREF of an L level. Therefore, voltage-down converter 164 supplies internal power supply potential intVcc of a level equal to reference potential VHref to internal power supply line 179.

In a self-refresh mode, selector 224 selects reference potential VLref lower than reference potential VHref in response to self refresh enable signal SREF of an H level.

Therefore, voltage-down converter 164 supplies to internal power supply line 179 an internal power supply potential intVcc equal to the selected reference potential VLref.

In a self refresh mode, internal power supply potential intVcc becomes lower than in a normal operation mode. Therefore, an internal power supply potential intVcc of a level lower than that of a normal operation mode is supplied to internal circuit 180 in a self refresh mode. Therefore, power consumption of internal circuit 180 is reduced.

Fourteenth Embodiment

Figure 24:
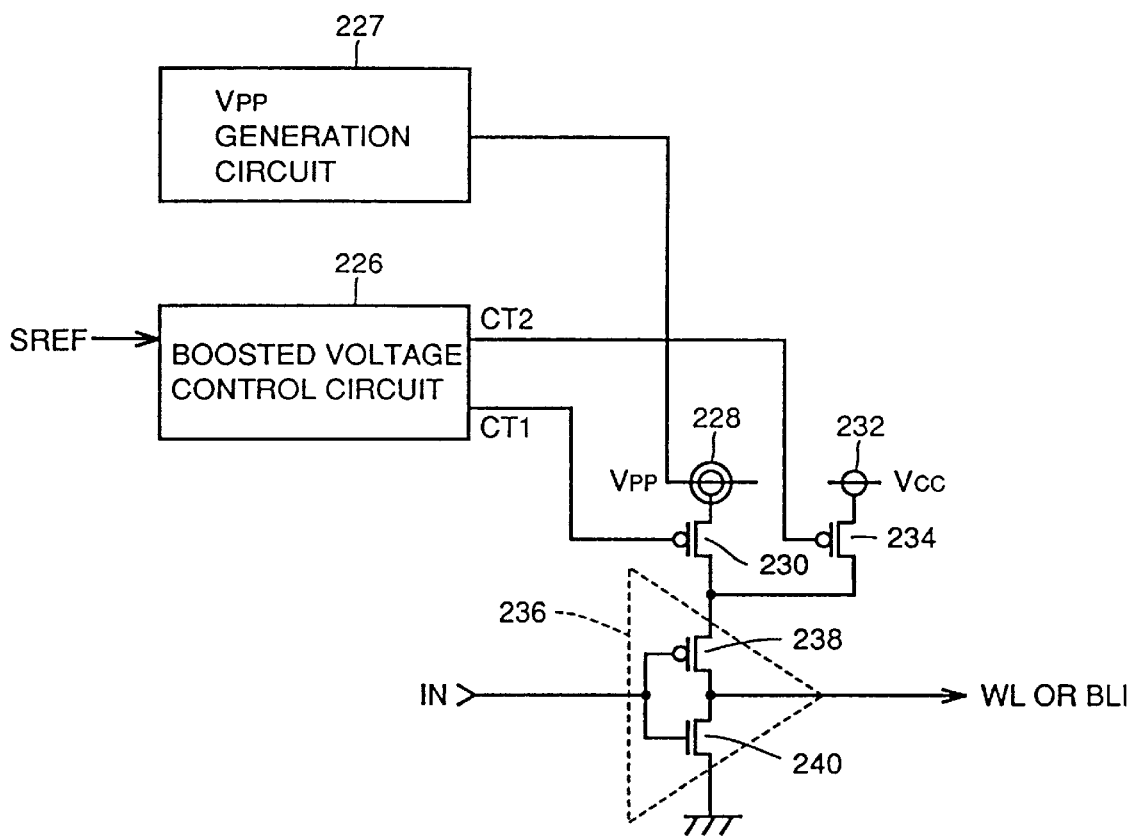
FIG. 24 is a circuit diagram showing a partial structure of a DRAM according to a fourteenth embodiment of the present invention.

FIG. 24 is a circuit diagram of a boosted potential system used in a DRAM according to a fourteenth embodiment of the present invention. As described above, a boosted power supply potential Vpp higher than power supply potential Vcc is supplied to a word line WL and switch circuits 56 and 62 in FIG. 2 in the DRAM.

Referring to FIG. 24, this DRAM includes a boosted power supply potential generation circuit 227 for generating a boosted power supply potential Vpp higher than power supply potential Vcc, a driver 236 for supplying a potential of word line WL or a bit line select signal BLI, a P channel MOS transistor 230 for supplying boosted power supply potential Vpp to driver 236, a P channel MOS transistor 234 for supplying power supply potential Vcc to driver 236, and a boosted control circuit 226 for controlling transistors 230 and 234. Driver 236 includes a P channel MOS transistor 238 and an N channel MOS transistor 240.

Figure 25:
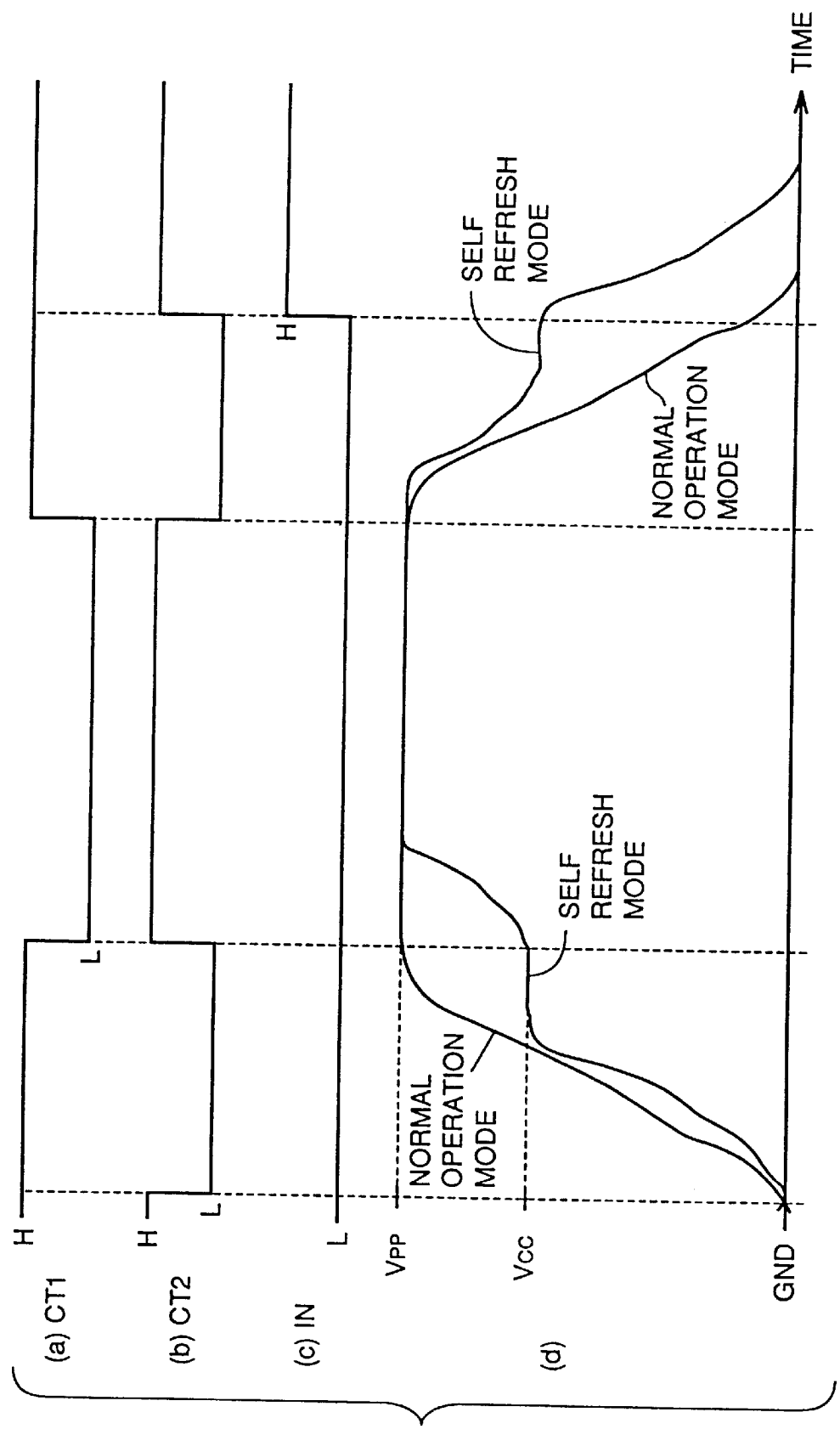
FIG. 25 is a timing chart showing an operation of the DRAM of FIG. 24.

FIG. 25 is a timing chart showing an operation of a circuit of a boosted potential system shown in FIG. 24.

In a normal operation mode, self refresh enable signal SREF of an L level is applied to boosted voltage control circuit 226. Boosted voltage control circuit 226 supplies a control signal CT2 of an H level to a transistor 234. Boosted voltage control circuit 226 supplies a control signal CT1 of an L level for a predetermined time period to transistor 230. In a general operation mode, the output potential of driver 236 is pulled up from the level of ground potential GND towards boosted power supply potential Vpp at one time as shown in FIG. 25(d). Since boosted power supply potential Vpp is supplied from boosted power supply potential generation circuit 227, a great amount of power is consumed in boosted power supply potential generation circuit 227.

Then, control signal CT2 attains an L level during the period of control signal CT1 attaining an H level as shown in (a) and (b) of FIG. 25 since self refresh enable signal SREF of an H level is applied to boosted control circuit 226 in a self refresh mode. Transistor 234 is turned on in response to control signal CT2 of an L level, whereby power supply potential Vcc is supplied to driver 236 via transistor 234. Here, upon provision of input signal IN of an L level shown in FIG. 25(c) to driver 236, the output potential of driver 236 is pulled up from the level of ground potential GND to power supply potential Vcc as shown in FIG. 25(d). Since power supply potential Vcc is supplied from a power supply node, 23, and not internally generated, no current is consumed other than that required for driving the output signal of driver 236 to the level of power supply potential Vcc.

When control signal CT1 attains an L level simultaneous to control signal CT2 attaining an H level as shown in (a) and (b) in FIG. 25, transistor 234 is turned off and transistor 230 is turned on. Therefore, boosted power supply potential Vpp is supplied to driver 236 via transistor 230. As a result, the output potential of driver 236 is boosted from the level of power supply potential Vcc to boosted power supply potential Vpp as shown in FIG. 25(e). Since boosted power supply potential Vpp is supplied from boosted power supply potential generation circuit 237, a great amount of current is consumed in boosted power supply potential generation circuit 227.

In contrast to a normal operation mode in which boosted power supply potential Vpp is supplied at one time to driver 236, power supply potential Vcc is first supplied, and then boosted power supply potential Vpp is supplied in a self refresh mode. Therefore, power is not consumed in boosted power supply potential generation circuit 227 during the rise of the output potential of driver 236 from the level of ground potential GND to the level of power supply potential Vcc in a self refresh mode. Therefore, power is consumed in boosted power supply potential generation circuit 277 only during the period where the output potential of driver 236 is boosted from the level of power supply potential Vcc to the level of boosted power supply potential Vpp. As a result, power consumption of boosted power supply potential generation circuit 227 is smaller in a self refresh mode than in a normal operation mode. Since power supply potential Vcc and boosted power supply potential Vpp are supplied in discrete steps in a self refresh mode, the rise of the output potential of driver 236 from the level of ground potential GND to the level of boosted power supply potential Vpp is time consuming. However, that is of no problem in a self refresh operation since high speed is not required therein.

Fifteenth Embodiment

Figure 26:
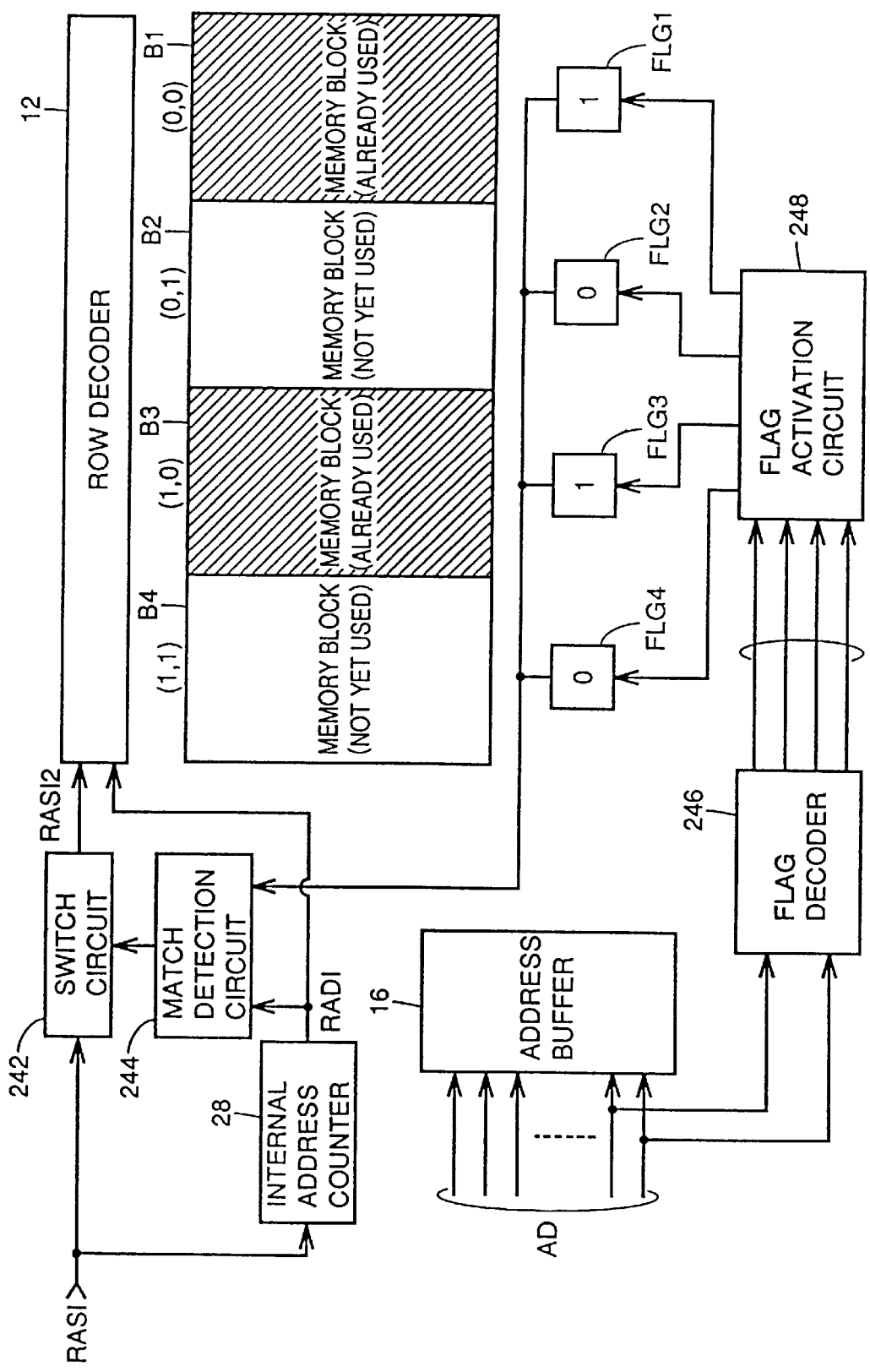
FIG. 26 is a block diagram showing an entire structure of a DRAM according to a fifteenth embodiment of the present invention.

FIG. 26 is a block diagram showing an entire structure of a DRAM according to a fifteenth embodiment of the present invention. Referring to FIG. 26, this DRAM includes, in addition to the structure of FIG. 1, a flag decoder 246 for decoding the more significant 2 bits of an externally applied address signal AD, flag registers FLG1–FLG4 for storing a flag, a flag activation circuit 248 responsive to a decode signal from flag decoder 246 for activating s electively flag registers FLG1–FLG4, a match detection circuit 244 for comparing the more significant 2 bits of internal row address signal RADI from internal address counter 28 with the flags of flag registers FLG1–FLG4, and a switch circuit 242 for cutting off internal row address strobe signal RASI when the more significant 2 bits of internal row address signal RADI match the flag. Here, this memory cell array is divided into four memory blocks B1–B4. Flag registers FLG1–FLG4 are provided corresponding to memory blocks B1–B4.

Figure 27:
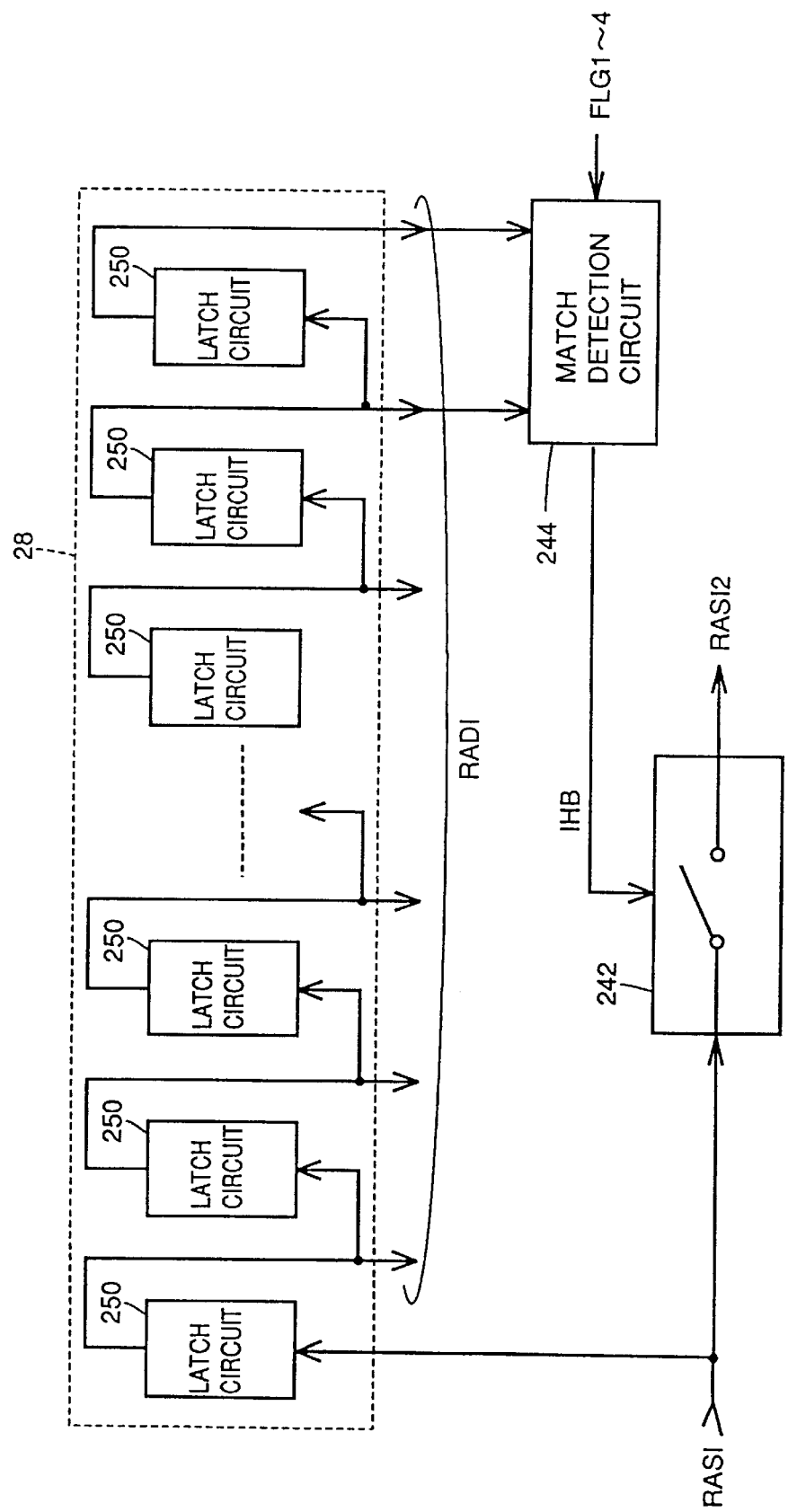
FIG. 27 is a block diagram showing a structure of an internal address counter, a match detection circuit and a switch circuit shown in FIG. 26.

FIG. 27 is a block diagram showing a structure of an internal address counter 28, a match detection circuit 244, and a switch circuit 242. Referring to FIG. 27, internal address counter 28 includes a plurality of latch circuits 250. Internal address counter 28 is incremented in response to internal row address strobe signal RASI. The signal stored in the plurality of latch circuits 250 is supplied to row decoder 12 as internal row address signal RADI. The more significant 2 bits of internal row address signal RADI are also supplied to match detection circuit 244.

Figure 28:
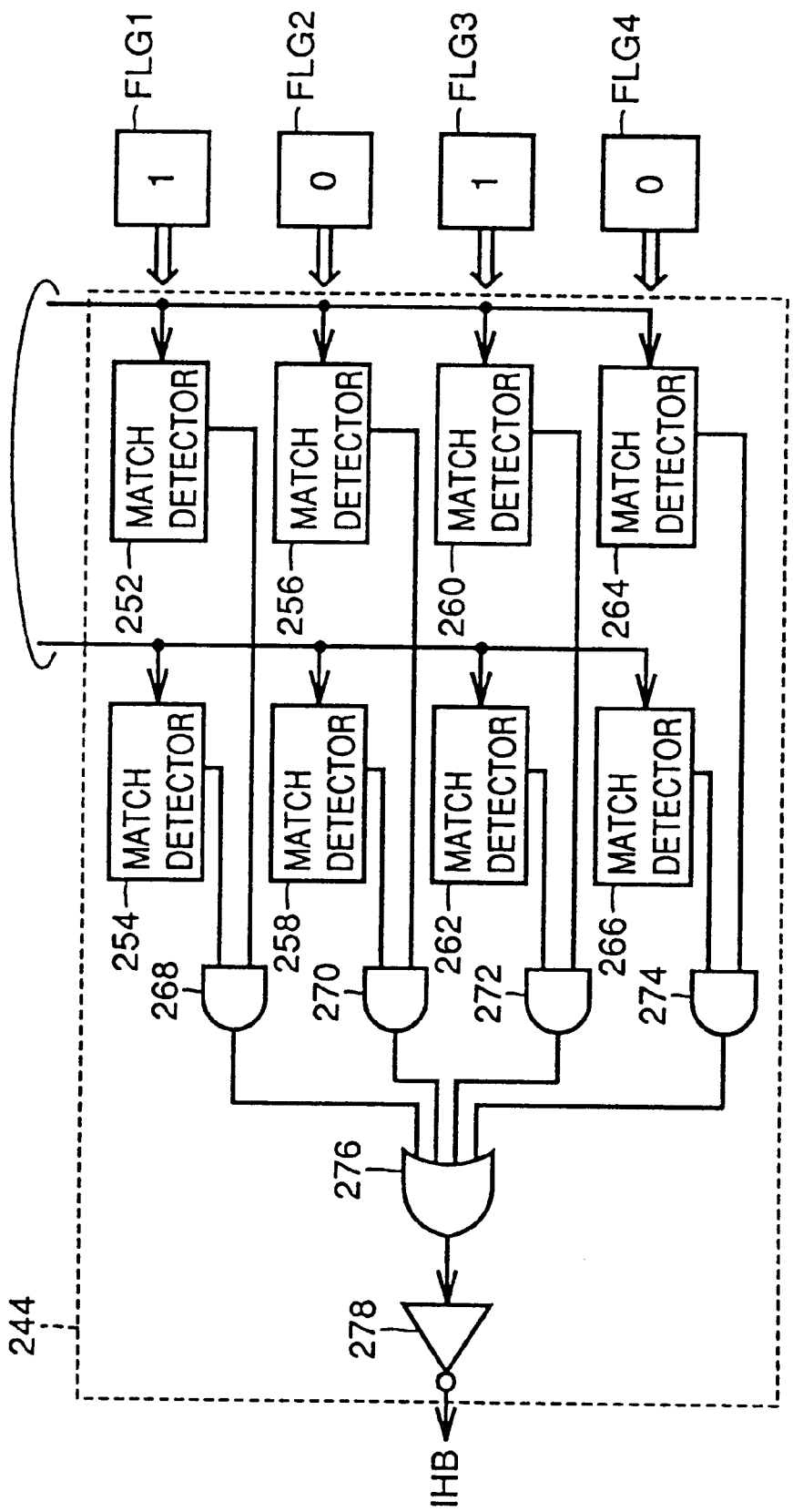
FIG. 28 is a block diagram showing a specific structure of the match detection circuit of FIGS. 26 and 27.

FIG. 28 is a block diagram showing a structure of match detection circuit 244 and flag registers FLG1–FLG4 of FIG. 26. Referring to FIG. 28, match detection circuit 244 includes match detectors 252 and 254 for comparing the more significant 2 bits of internal row address signal RADI with the flag of flag register FLG1, match detectors 256 and 258 for comparing the more significant 2 bits with the flag of flag register FLG2, match detectors 260 and 262 for comparing the more significant 2 bits with the flag of flag register FLG3, match detectors 264 and 266 for comparing the more significant 2 bits with the flag of flag register FLG4, AND gates 268, 270, 272, 274, an OR gate 276, and an inverter 278.

The operation of the DRAM shown in FIGS. 26–28 will be described hereinafter.

When the more significant 2 bits of an externally applied address signal AD are (0, 0), data is stored in memory block B1. Flag decoder 246 decodes the more significant 2 bits (0, 0) of the externally applied address signal AD. In response to this decoded signal, flag activation circuit 248 activates the flag of flag register FLG1 corresponding to memory block B1. Similarly, the flag of flag register FLG3 corresponding to memory block B3 is activated when data is stored in memory block B3. Therefore, a flag "1" is stored in respective flag registers FLG1 and FLG3 corresponding to memory blocks B1 and B3 that are already used as shown in FIG. 26. A flag "0" is stored in respective flag registers FLG2 and FLG4 corresponding to memory blocks B2 and B4 not yet used.

In a self refresh mode, internal address counter 28 responds to internal row address strobe signal RASI for generating internal row address signal RADI sequentially for a refresh operation. When internal row address signal RADI generated by internal address counter 28 indicates an address in memory block B1, match detection circuit 244 does not supply an inhibit signal IHB to switch circuit 242. Therefore, internal row address strobe signal RASI is applied to row decoder 12 as internal row address strobe signal RASI2, which is entered into row decoder 12. Row decoder 12 responds to the received internal row address signal RADI for selectively activating a word line in memory block B1. Thus, a memory cell in memory block B1 is refreshed.

When internal row address signal RADI generated by internal address counter 28 indicates an address in memory block B2, match detection circuit 244 supplies inhibit signal IHB to switch circuit 242. Therefore, internal row address strobe signal RASI is cut off by switch circuit 242, and is not applied to row decoder 12. As a result, internal row address signal RADI is not entered into row decoder 12. Therefore, row decoder 12 does not activate a word line in memory block B2.

According to the fifteenth embodiment, only a memory block that is already used will not be refreshed, and a memory block that is not yet used will be refreshed. Thus, power consumption is reduced in contrast to the case where all memory blocks are refreshed.

Figure 29:
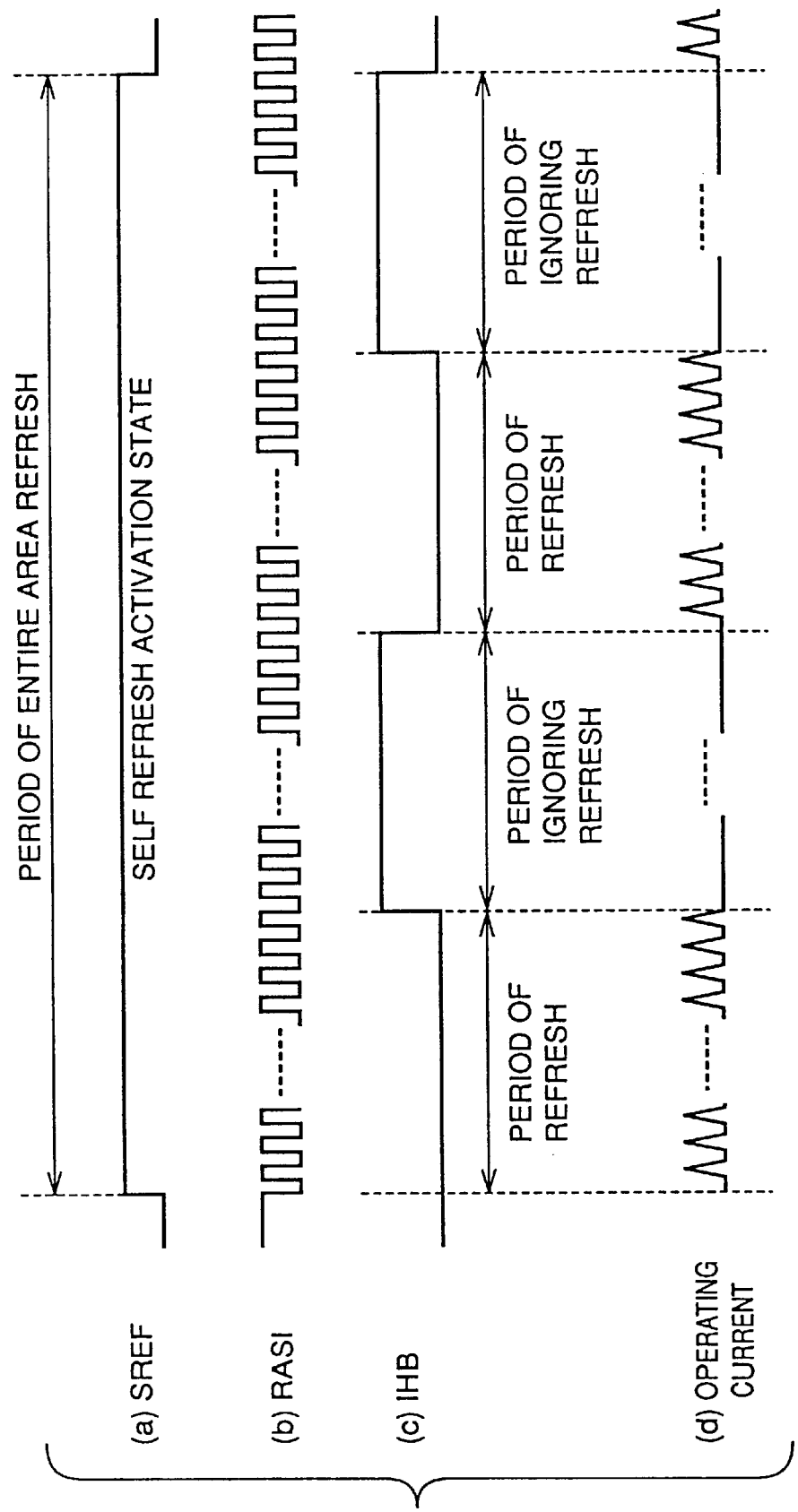
FIG. 29 is a timing chart showing an operation of the DRAM of FIGS. 26–28.

FIG. 29 is a timing chart showing an operation of the DRAM shown in FIGS. 26–28. As shown in FIG. 29(a), self refresh enable signal SREF attains an H level in a self refresh mode. As shown in FIG. 29(c), inhibit signal IHB attains an L level and an H level during a period of a refresh operation and during a period where refresh is to be ignored, respectively. Thus, operating current flows during a period where refresh operation is carried out, but not during a period where refresh is to be ignored, as shown in FIG. 29(d). Thus, power consumption of the DRAM is reduced.

Sixteenth Embodiment

Figure 30:
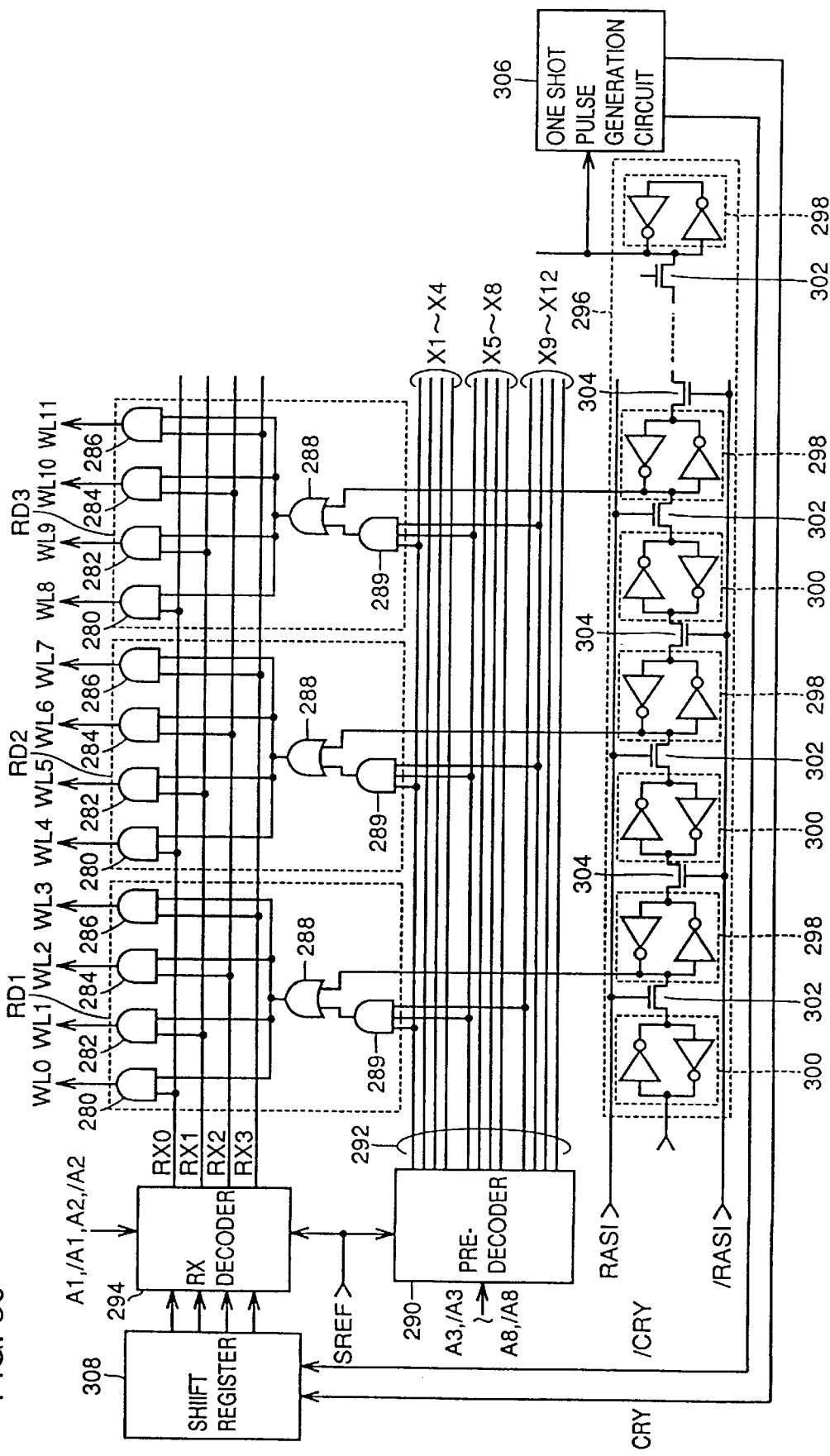
FIG. 30 is a circuit diagram showing a structure of a row decoder in a DRAM according to a sixteenth embodiment of the present invention.

FIG. 30 is a circuit diagram showing a specific structure of a row decoder used in a DRAM according to a sixteenth embodiment of the present invention. Referring to FIG. 30, a row decoder includes a predecoder 290 for predecoding row address signals A3–A8 and complementary row address signals /A3–/A8 for supplying predecode signals X1–X12 to a predecode signal line 292, a plurality of decoder units RD1, RD2, RD3, . . . selectively activated in response to predecode signals X1–X12, and an RX decoder 294 for decoding row address signals A1, A2 and complementary row address signals /A1, /A2 for generating word line drive signals RX0–RX3. Each of decoder units RD1, RD2, RD3, . . . is provided corresponding to the four word lines. Each decoder unit includes four AND gates 280, 282, 284 and 286 driving the four word lines, an OR gate 288, and an AND gate 289 receiving a predecode signal.

Figure 31:
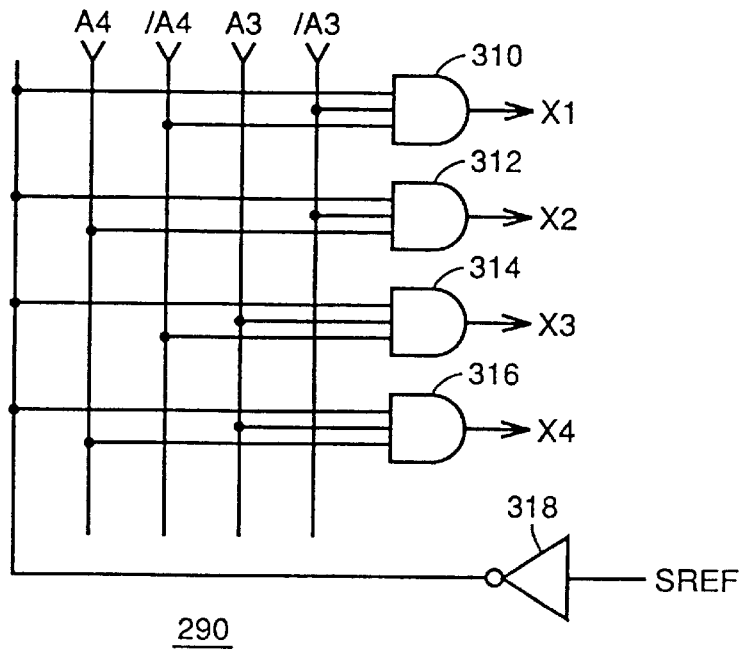
FIG. 31 is a circuit diagram showing a partial structure of a predecoder of FIG. 30.

FIG. 31 is a circuit diagram showing a partial structure of predecoder 290 of FIG. 30. Referring to FIG. 31, predecoder 290 includes AND gates 310, 312, 314 and 316 responsive to address signals A3, /A3, A4 and /A4 for generating predecode signals X1–X4. Predecoder 290 further includes an inverter 318 responsive to self refresh enable signal SREF of an H level for forcing predecode signals X1–X4 to an L level.

Figure 32:
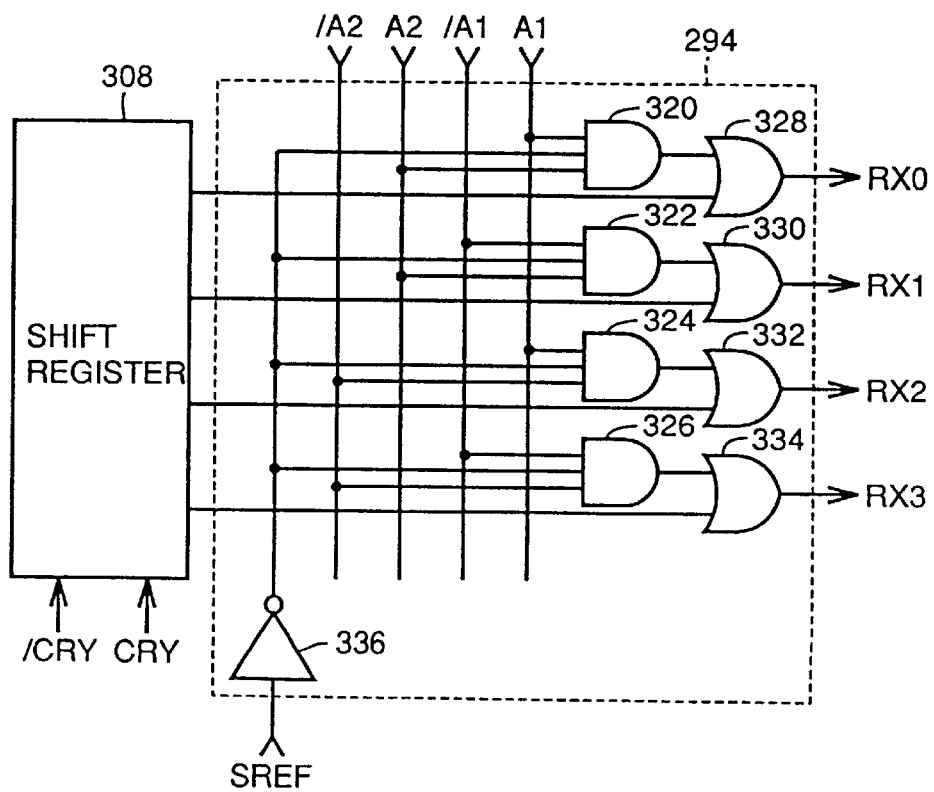
FIG. 32 is a circuit diagram showing a specific structure of an RX decoder of FIG. 30.

FIG. 32 is a circuit diagram showing a specific structure of RX decoder 294 of FIG. 30. Referring to FIG. 32, RX decoder 294 includes AND gates 320, 322, 324, and 326 responsive to address signals A1, /A1, A2, and /A2, and OR gates 328, 330, 332, and 334 for generating word line drive signals RX0–RX3. RX decoder 294 further includes an inverter 336 responsive to self refresh enable signal SREF of an H level for forcing word line drive signals RX0–RX3 to an H level.

Referring to FIG. 30 again, this row decoder includes a shift register 296 for selectively activating decoder units RD1, RD2, RD3, . . . , sequentially in a self refresh mode. Shift register 296 includes a plurality of latch circuits 298 and 300, a plurality of transfer gates 302 turned on in response to internal row address strobe signal RASI, and a plurality of transfer gates 304 turned on in response to complementary internal row address strobe signal /RASI. Shift register 296 has a data signal latched in latch circuits 298 and 300 shifted rightwards in the drawing in response to internal row address signals RASI and /RASI. The row decoder further includes a one shot pulse generation circuit 306 for generating pulse signals CRY and /CRY for a predetermined time period when a data signal of an H level is latched in latch circuit 298 which is the last stage in shift register 296.

The row decoder further includes a shift register 308 that operates in response to pulse signals CRY and /CRY. Shift register 308 forcefully activates word line drive signals RX0–RX3 sequentially.

Figure 33:
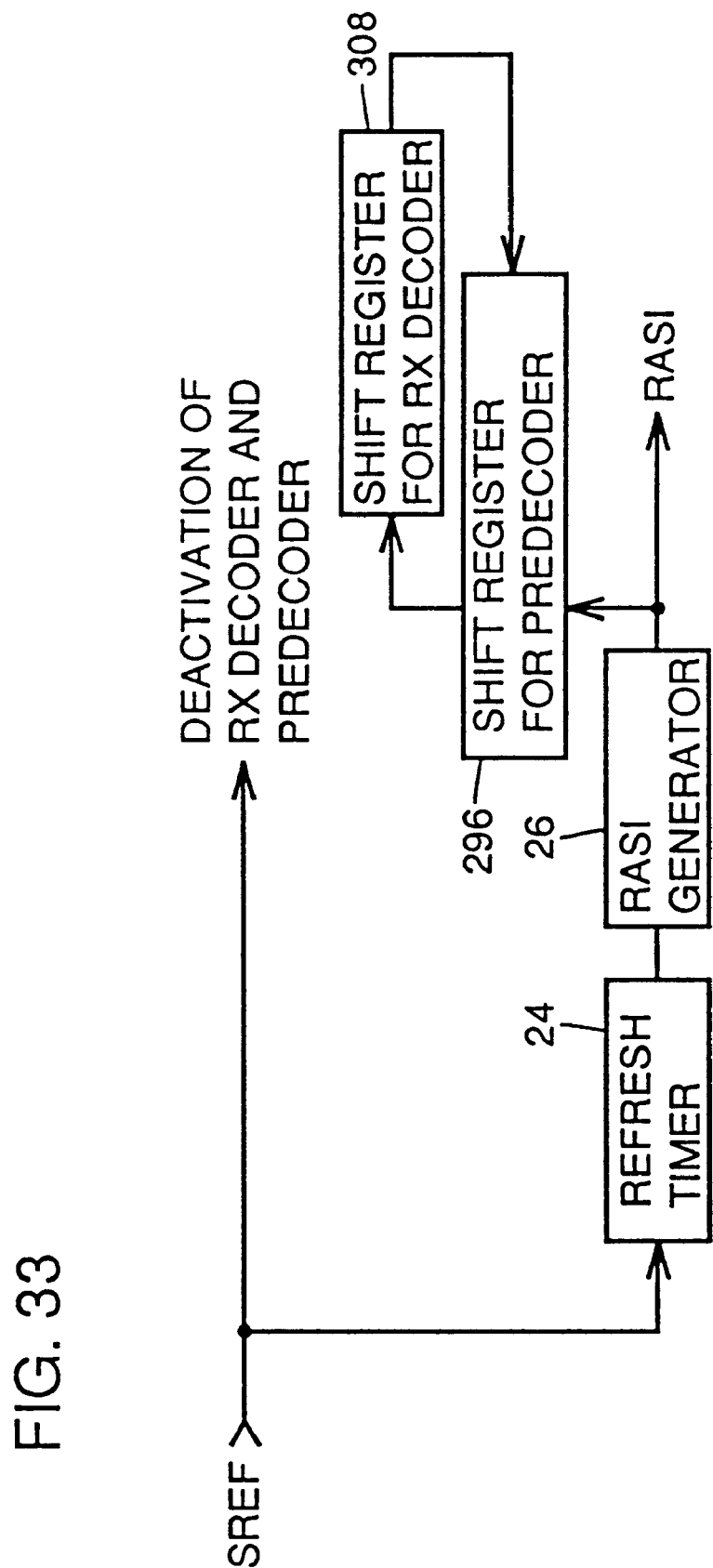
FIG. 33 is a block diagram showing a simplified structure of the row decoder of FIG. 30.

FIG. 33 is a block diagram showing only the characteristic structure of row decoder of FIG. 30. It is appreciated from FIG. 33 that provision of self refresh enable signal SREF of an H level causes refresh timer 24 to generate a clock signal, whereby internal row address strobe signal generator 26 responds to that clock signal for generating internal row address strobe signal RASI. Shift register 296 for a predecoder is incremented in response to internal row address strobe signal RASI. Shift register 308 for a RX decoder is incremented in response to an output signal of shift register 296.

An operation of the row decoder of FIG. 30 will be described hereinafter.

In a normal operation mode, decoder units RD1 RD2, RD3, . . . are selectively activated in response to predecode signals X1–X12. When decoder units RD1, for example, is activated, any one of the four word lines WL0–WL3 attains a state that allows activation. The four word lines WL0–WL3 are selectively activated in response to word line drive signals RX0–RX3.

In a self refresh mode, a conventional row decoder responds to an internal row address signal for generating a predecode signal, and then a word line drive signal, whereby a word line is selectively activated, as in a normal operation mode. Therefore, charge/discharge current for a predecode signal line is consumed in the conventional row decoder during a self refresh mode, as in a general operation mode.

In the sixteenth embodiment shown in FIG. 30, predecoder 290 and RX decoder 294 are deactivated in response to a self refresh enable signal SREF of an H level in a self refresh mode. Shift register 296 selectively activates decoder units RD1, RD2, RD3, . . . , sequentially. Also, shift register 308 selectively activates word line drive signals RX0–RX3 sequentially instead of RX decoder 294. Shift register 308 first activates word line drive signal RX0. Therefore, word lines WL0, WL4, WL8, . . . are sequentially activated upon sequential activation of decoder units RD1, RD2, RD3, . . . , by shift register 296. When shift register 296 completes the activation of a decoder unit of the last stage (not shown), shift register 308 is incremented in response to pulse signals CRY, /CRY from one shot pulse generation circuit 306. Therefore, shift register 308 activates word line drive signal RX1 in substitution for word line drive signal RX0. When shift register 296 activates decoder units RD1, RD2, RD3, . . . again, word lines WL1, WL5, WL9, . . . are sequentially activated. Thus, all the word lines are activated sequentially and selectively.

In the present sixteenth embodiment, shift registers 296 and 308 sequentially and selectively activate a word line in a self refresh mode, so that predecode signal line 292 is not charged/discharged for every internal generation of an internal row address signal for a refresh operation. Therefore, power consumption in a self refresh mode is reduced.

Seventeenth Embodiment

Figure 34:
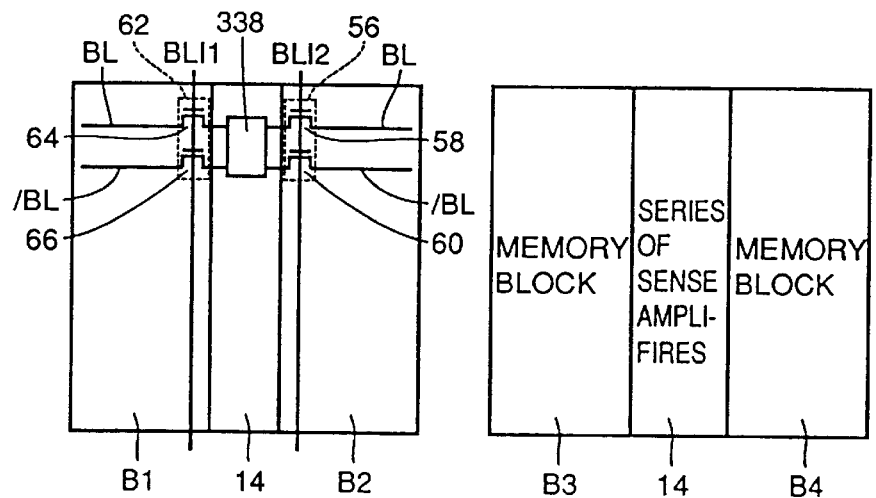
FIG. 34 is block diagram showing a partial structure of a DRAM according to a seventeenth embodiment of the present invention.

FIG. 34 is a block diagram showing a partial structure of a DRAM according to a seventeenth embodiment of the present invention. As shown in FIG. 34, the memory cell array of this DRAM is divided into memory blocks B1–B4. A series of sense amplifiers 14 is arranged between memory blocks B1 and B2. A series of sense amplifiers 14 is arranged between memory blocks B3 and B4. Each of memory blocks B1–B4 includes a plurality of bit line pairs BL and /BL. Each series of sense amplifiers 14 includes a plurality of sense amplifiers 338 corresponding to the plurality of bit line pairs BL and /BL in each memory block. Each sense amplifier 338 is connected to a bit line pair BL and /BL in memory block B1 via switch circuit 56, and to a bit line pair BL and /BL in memory block B2 via switch circuit 62.

In standby state, the potentials of bit line select signals BLI1 and BLI2 both attain the level of boosted power supply potential. Therefore, bit line pairs BL and /BL at both sides are connected to one sense amplifier 338. If memory block B1, for example, is selected, the potential of bit line select signal BLI2 is lowered. As a result, bit line pair BL and /BL in memory block B2 is disconnected from sense amplifier 338.

As described above, the DRAM operates conventionally in a normal operation mode. In a self refresh mode, a conventional DRAM operates in a manner similar to that of a normal operation mode. More specifically, an internal row address signal for refresh is generated so that the potentials of bit line select signals BLI1 and BLI2 at either sides are pulled up to the level of boosted power supply potential prior to every activation of one word line in response to the generation of an internal row address signal.

Figure 35:
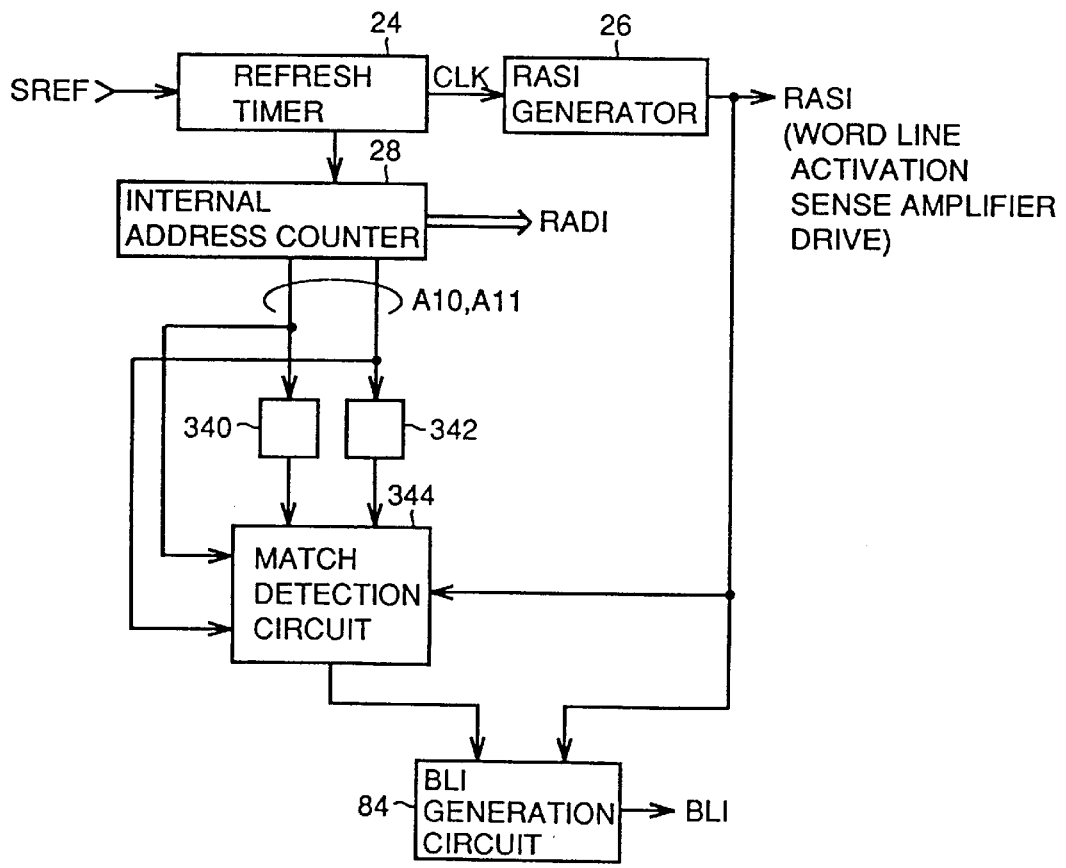
FIG. 35 is a block diagram showing a partial structure of a DRAM of FIG. 34.

FIG. 35 is a block diagram showing a characteristic structure of a DRAM according to a seventeenth embodiment of the present invention.

Referring to FIG. 35, this DRAM includes latch circuits 340 and 342 for latching the more significant 2 bits A10 and A11 of an internal row address signal generated by internal row address counter 28, and a match detection circuit 344 for detecting the match of generated address signals A10 and A11 with the address signals of latch circuit 340 and 342, respectively. Bit line select signal generation circuit 84 in FIG. 35 maintains the potential of bit line select signal BLI when the address signals match each other.

Figure 36:
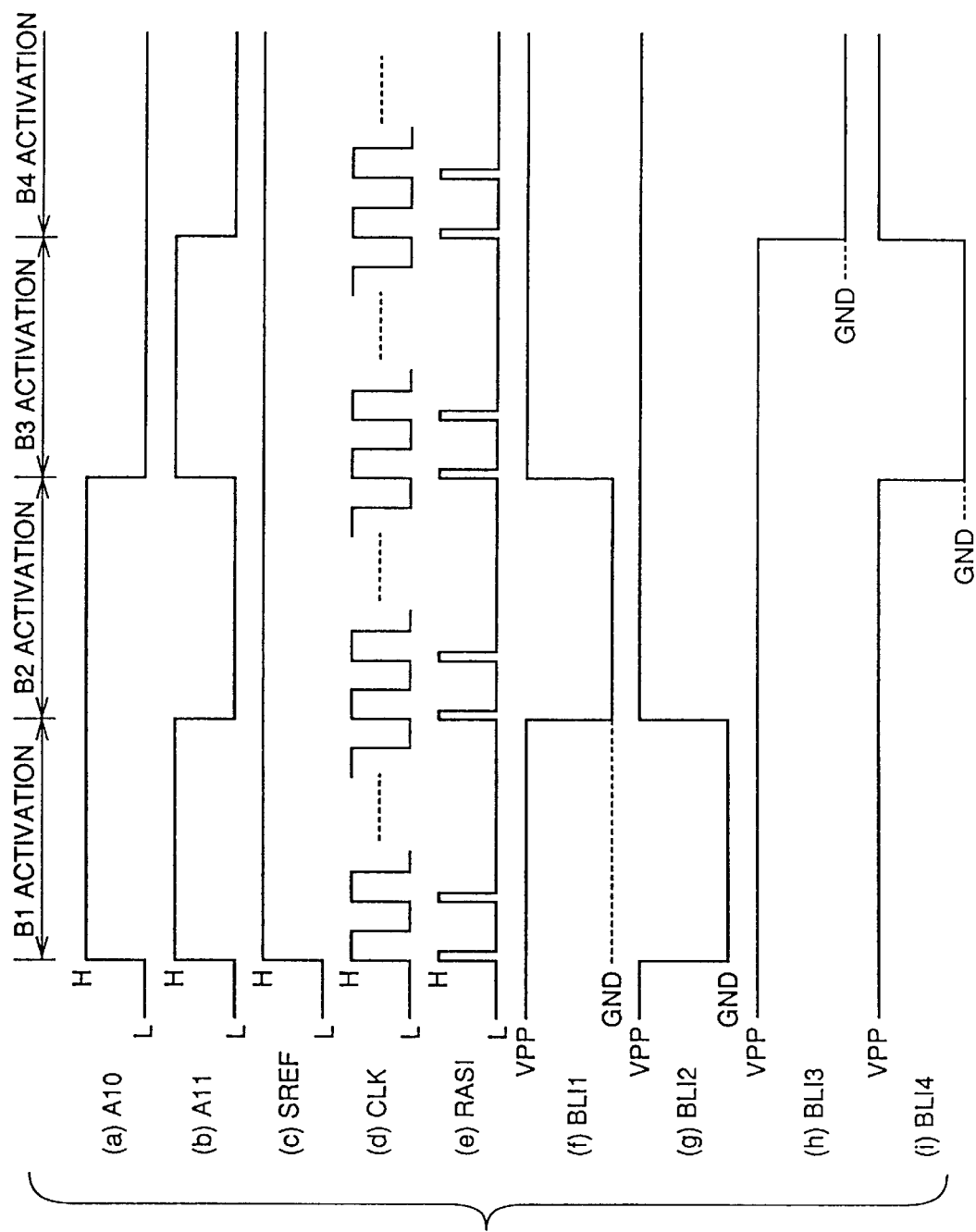
FIG. 36 is a timing chart showing an operation of the DRAM of FIGS. 34 and 35.

FIG. 36 is a timing chart showing an operation of a self refresh mode of the DRAM shown in FIGS. 34 and 35. When self refresh enable signal SREF attains an H level as shown in FIG. 36(c), refresh timer 24 generates a clock signal CLK as shown in FIG. 36(d). Internal row address strobe signal RASI generator 26 responds to clock signal CLK to generate an internal row address strobe signal RASI as shown in FIG. 36(a). Internal address counter 28 responds to clock signal CLK to sequentially generate internal row address signal RADI for refresh. The more significant 2 bits A10 and A11 of internal row address signal RADI exhibit a transition as shown in (a) and (b) of FIG. 36. When address signal A11 and address signal A10 both attain an H level, memory block B1 is activated. When address signal A11 attains an L level and address signal A10 attains an H level, memory block B2 is activated. When address signal A11 attains an H level and address signal A10 attains an L level, memory block B3 is activated. When address signal A11 and address signal A10 both attain an L level, memory block B4 is activated.

Since address signals A10 and A11 first attain an H level, address signals A10 and A11 of the H level are stored in latch circuits 340 and 342, respectively. In this case, memory block B1 is activated, whereby bit line select signal BLI1 corresponding to memory block B1 attains a boosted potential level, and bit line select signal BLI2 corresponding to memory block B2 attains a ground potential as shown in (f)–(i) of FIG. 36. Also, bit line select signal BLI3 corresponding to memory block B3 and bit line select signal BLI4 corresponding to memory block B4 both maintain the level of boosted power supply potential.

Then, internal address counter 28 is incremented in response to clock signal CLK. Here, address signals A10 and A11 show no change. The newly generated address signals A10 and A11 are applied to match detection circuit 344 to be respectively compared with previous latched address signals A10 and A11 in match detection circuit 344. This comparison operation is carried out in response to internal row address strobe signal RAS. Here, the previous-generated address signals A10 and A11 match the newly generated address signals A10 and A11. Therefore, bit line select signal generation circuit 84 maintains the previous potential of bit line select signal BLI. Bit line select signal BLI1 is maintained at the level of boosted power supply potential, and bit line select signal BLI2 is maintained at the level of ground potential. Furthermore, bit line select signals BLI3 and BLI4 are both maintained at the level of boosted power supply potential.

When the newly generated address signals A10 and A11 attain an H level and an L level, respectively, memory block B2 is activated, and one word line in memory block B2 is activated. Since the newly-generated address signals A10 and A11 do not match the previous-latched address signals A10 and A11, bit line select signal generation circuit 84 alters the potential of bit line select signal BLI. More specifically, bit line select signal BLI1 corresponding to memory block B1 is pulled down from boosted power supply potential to ground potential, and bit line select signal BLI2 corresponding to memory block B2 is pulled up from ground potential to boosted power supply potential.

In contrast to a conventional DRAM in which the potential of a bit line select signal is always pulled up to the level of boosted power supply potential prior to activation of a word line even when that word line in the same memory block is continuously activated, the DRAM of the present seventeenth embodiment does not have the potential of the bit line select signal altered when word lines in the same memory block are activated continuously. This means that the number of charging/discharging operations of a bit line select signal is reduced. As a result, power consumption in a self refresh mode can be reduced.

Eighteenth Embodiment

Figure 37:
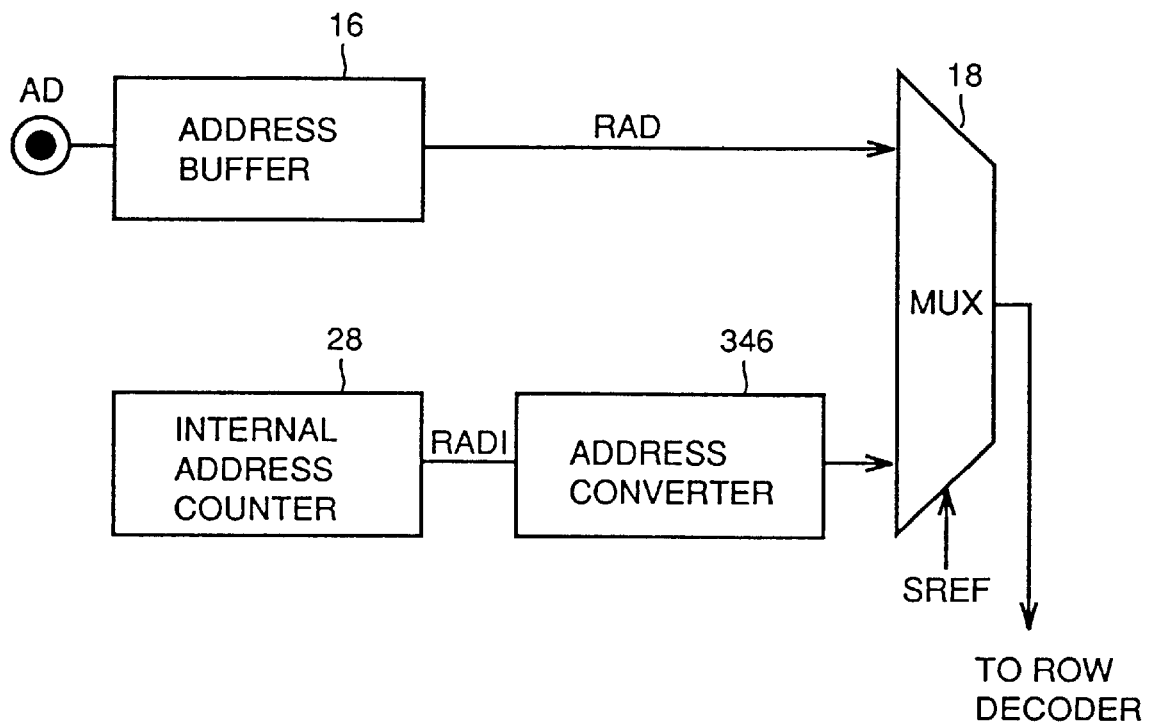
FIG. 37 is a block diagram showing a structure of a DRAM according to an eighteenth embodiment of the present invention.

FIG. 37 is a block diagram showing a partial structure of a DRAM according to an eighteenth embodiment of the present invention. Referring to FIG. 37, the DRAM further includes an address converter 346 between internal address counter 28 and multiplexer 18.

The prior seventeenth embodiment was described in which word lines in the same memory block are continuously activated. However, there are cases according to the address structure in which word lines in the same memory block are not continuously activated. In such a case, the sequentially formed internal row address signal RADI should be modified appropriately so that as many word line as possible can be continuously activated in the same memory block in response to internal row address signal RADI.

Figure 38:
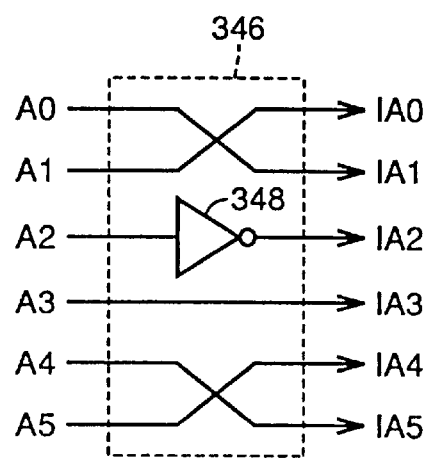
FIG. 38 is a circuit diagram showing a specific structure of an address converter of FIG. 37.
Figure 39:
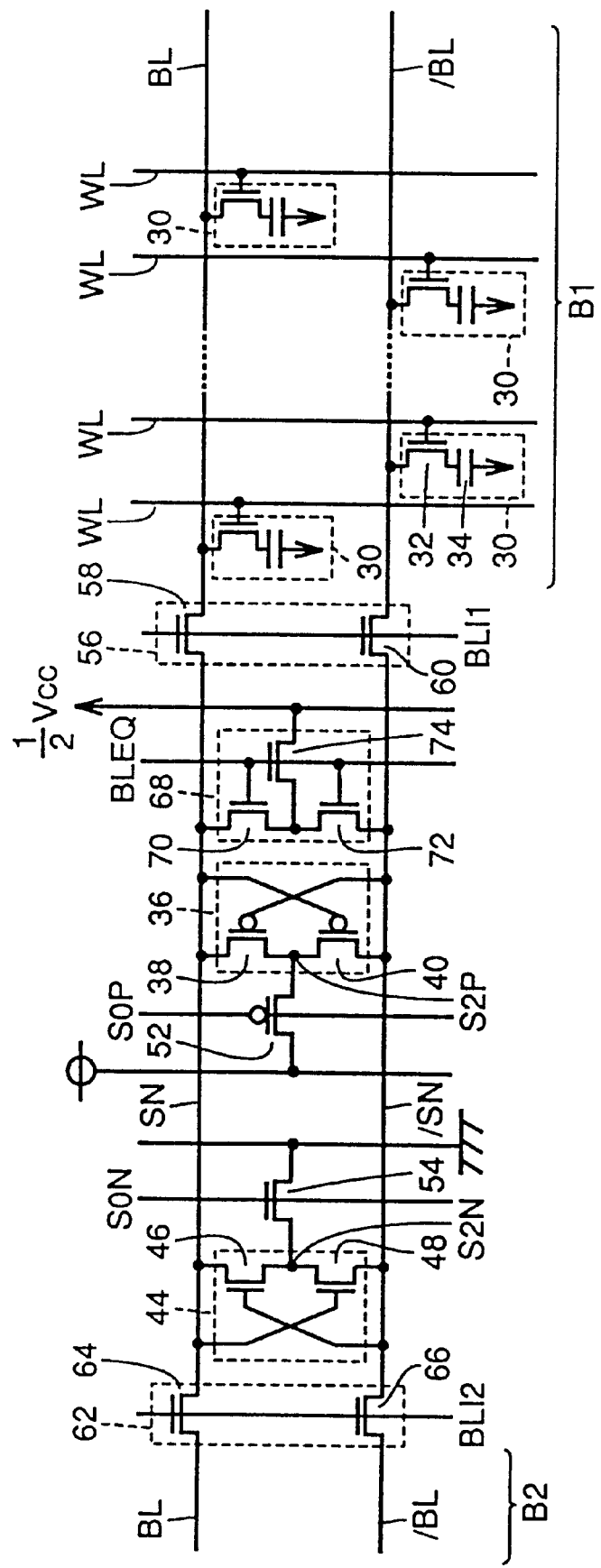
FIG. 39 is a circuit diagram showing a partial structure of a conventional DRAM.
Figure 40:
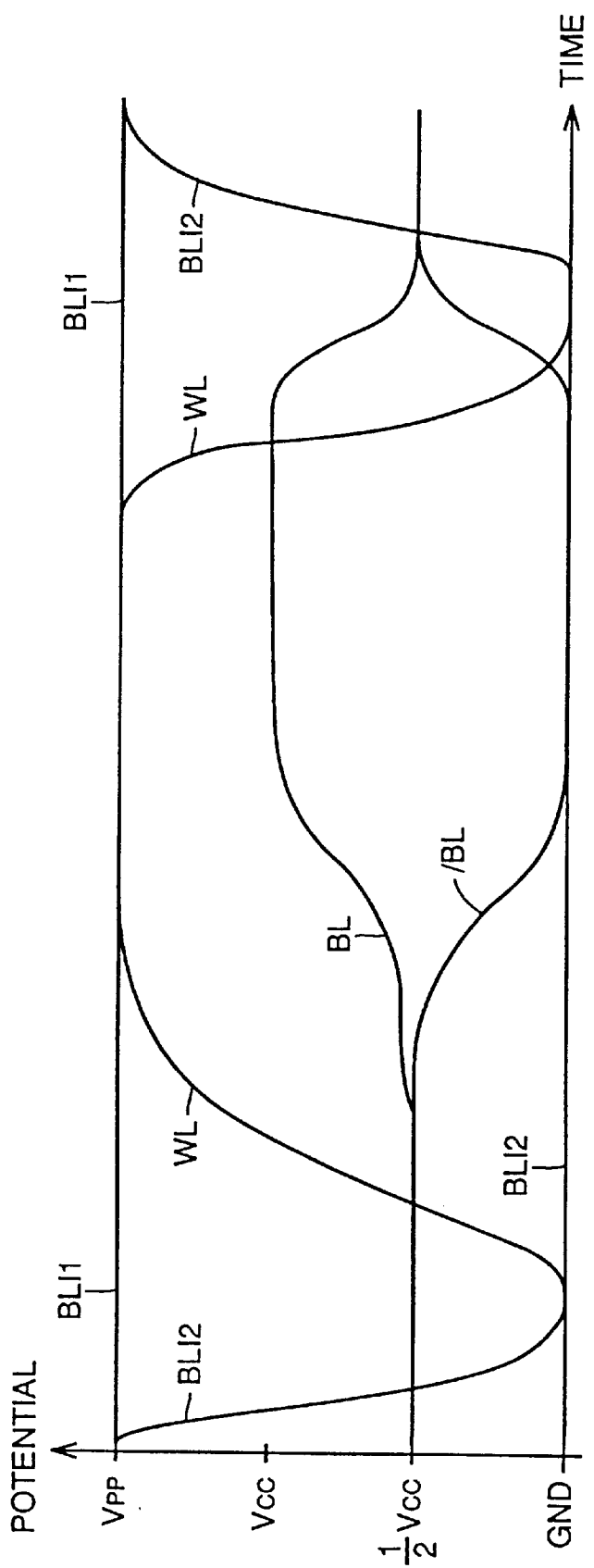
FIG. 40 is a graph showing change in potential of a bit line select signal, a word line, and a bit line of the DRAM of FIG. 39.
Figure 41:
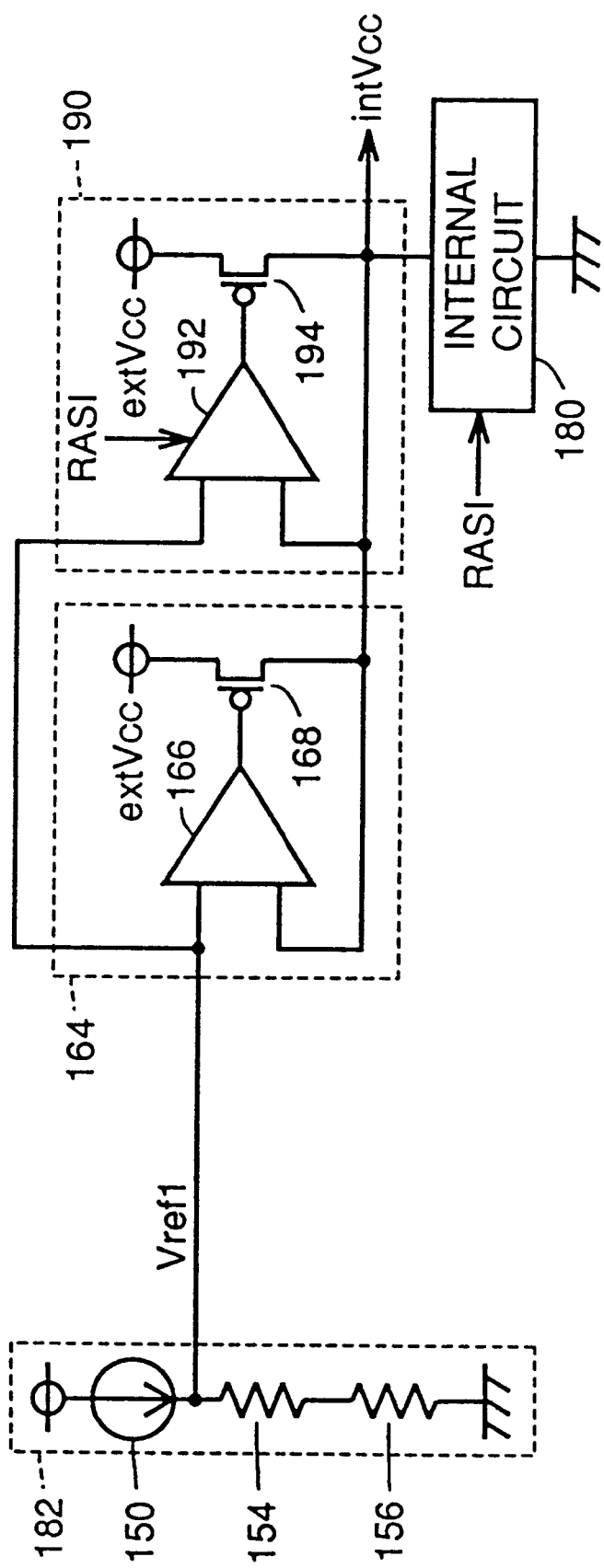
FIG. 41 is a circuit diagram showing a structure of an internal voltage-down circuit employed in a conventional DRAM.

FIG. 38 is a circuit diagram showing an example of a specific structure of an address converter 346 of FIG. 37. Referring to FIG. 38, address converter 346 have address signals A0 and A1 exchanged with each other to generate internal address signals IA0 and IA1. Address signal A2 is inverted by an inverter 348, whereby an internal address signal IA2 is generated. Address signal A3 is directly supplied as internal address signal IA3. Address signals A4 and A5 are exchanged with each other, whereby internal address signals IA4 and IA5 are generated.

According to the present eighteenth embodiment, address converter 346 converts internal row address signals RADI from internal address counter 28 so that a plurality of word lines in the same memory block are activated continuously. Therefore, the number of charging/discharging operations of a bit line select signal is reduced as in the seventeenth embodiment. Thus, power consumption in a self refresh mode is reduced.

Obviously many modifications and variations of the present invention are possible in the light of the above teaching. For example, the present invention is applicable to other operation modes in which speed is not required other than the above-described self refresh mode, such as a low frequency synchronous mode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    an address buffer responsive to an external address signal for providing a first internal address signal;
    an address calculator for generating a second internal address signal;
    an address converter for converting the second internal address signal from said address calculator; and
    a multiplexer for selecting one of the first internal address signal from said address buffer and the converted second internal address signal from said address converter.

2. The semiconductor memory device according to claim 1, wherein
    said multiplexer selects the converted second internal address signal during a self refresh mode.

3. The semiconductor memory device according to claim 2, wherein
    said address converter includes means for exchanging one bit of the second internal address signal for another bit of the second internal address signal.

4. The semiconductor memory device according to claim 2, wherein
    said address converter includes a logic circuit for inverting one bit of the second internal address signal.

5. The semiconductor memory device according to claim 1, wherein
    said address converter includes means for exchanging one bit of the second internal address signal for another bit of the second internal address signal.

6. The semiconductor memory device according to claim 1, wherein
    said address converter includes a logic circuit for inverting one bit of the second internal address signal.

* * * * *